United States Patent
Mori et al.

(10) Patent No.: US 9,239,426 B2
(45) Date of Patent: Jan. 19, 2016

(54) OPTICAL WAVEGUIDE AND ELECTRONIC DEVICE

(75) Inventors: Tetsuya Mori, Shinagawa-ku (JP); Kimio Moriya, Shinagawa-ku (JP); Hiroshi Owari, Shinagawa-ku (JP)

(73) Assignee: SUMITOMO BAKELITE COMPANY LIMITED, Tokyo (JP)

( * ) Notice: Subject to any disclaimer, the term of this patent is extended or adjusted under 35 U.S.C. 154(b) by 252 days.

(21) Appl. No.: 13/824,623

(22) PCT Filed: Sep. 20, 2011

(86) PCT No.: PCT/JP2011/071376
§ 371 (c)(1),
(2), (4) Date: Mar. 18, 2013

(87) PCT Pub. No.: WO2012/039393
PCT Pub. Date: Mar. 29, 2012

(65) Prior Publication Data
US 2013/0183015 A1     Jul. 18, 2013

(30) Foreign Application Priority Data

Sep. 22, 2010   (JP) .................................. 2010-212576

(51) Int. Cl.
*G02B 6/10*  (2006.01)
*G03C 1/00*  (2006.01)
(Continued)

(52) U.S. Cl.
CPC .............. *G02B 6/1221* (2013.01); *G02B 6/122* (2013.01); *G03F 7/004* (2013.01)

(58) Field of Classification Search
CPC .... G02B 6/036; G02B 6/122; G02B 6/12002; G02B 6/132; G02B 6/1221; G02B 6/138; G03F 7/004

USPC ................... 385/126, 129–132, 141–145; 430/270.1, 321, 330; 264/1.24–1.29
See application file for complete search history.

(56) References Cited

U.S. PATENT DOCUMENTS

| | | | |
|---|---|---|---|
| 2003/0002834 A1 | 1/2003 | Brown et al. | |
| 2010/0067861 A1 | 3/2010 | Choki et al. | |

FOREIGN PATENT DOCUMENTS

| | | |
|---|---|---|
| CN | 101535852 A | 9/2009 |
| JP | 9-197148 A | 7/1997 |

(Continued)

OTHER PUBLICATIONS

T. Ishigure and Y. Takeyoshi, "Polymer waveguide with 4-channel graded-index circular cores for parallel optical interconnects," vol. 15, No. 9, Opt. Express, pp. 5843-5850, Apr. 30, 2007.*

(Continued)

*Primary Examiner* — Akm Enayet Ullah
*Assistant Examiner* — Michael Mooney
(74) *Attorney, Agent, or Firm* — Oblon, McClelland, Maier & Neustadt, L.L.P.

(57) ABSTRACT

An optical waveguide has: a core layer which includes at least one core portion for transmitting a light signal and at least two side cladding portions respectively provided at lateral sides of the core portion so as to be opposed to each other; and two cladding layers respectively provided at vertical sides of the core layer. The core layer is configured to have a horizontal refractive index distribution curve W in a width direction of a cross-sectional plane of the core layer. The horizontal refractive index distribution curve W has a region including at least two local minimum values, at least one first local maximum value and at least two second local maximum values smaller than the first local maximum value. A refractive index in whole of the horizontal refractive index distribution curve W continuously varies.

20 Claims, 13 Drawing Sheets

(51) Int. Cl.
*G02B 6/122* (2006.01)
*G03F 7/004* (2006.01)

(56) References Cited

FOREIGN PATENT DOCUMENTS

| JP | 2001-4852 A | | 1/2001 | |
| --- | --- | --- | --- | --- |
| JP | 2006 276735 | | 10/2006 | |
| JP | 2010-140055 A | | 6/2010 | |
| TW | 200823508 A | | 6/2008 | |
| WO | 2008059577 | * | 5/2008 | ............... G02B 6/12 |
| WO | 2008 105404 | | 9/2008 | |

OTHER PUBLICATIONS

Takeyoshi et al., "Multichannel Parallel Polymer Waveguide With Circular W-Shaped Index Profile Cores," vol. 19, No. 22, IEEE Photonics Technology Letters, pp. 1795-1797, Nov. 15, 2007.*

Office Action and Search Report issued on Jan. 13, 2015 in the corresponding Taiwanese Patent Application No. 100134165 (with Translation of Category of Cited Documents).

Takeyoshi, Y., et al., "Multichannel Parallel Polymer Waveguide With Circular W-Shaped Index Profile Cores," IEEE Photonics Technology Letters, vol. 19, No. 22, pp. 1795-1797, (Nov. 15 , 2007).

Hirobe, Y., et al., "Four-Channel Polymer Optical Waveguide with W-shaped Index Profile Cores and Its Low Inter-Channel Crosstalk Property," IEEE Lasers and Electro-Optic Society, WD4, pp. 443-444, (Nov. 25, 2008).

Ishigure, T., et al., "Plastic Optical Fiber and Waveguide with Graded-Index Cores for Optical Interconnection," The Institute of Electronics, Information and Communication Engineers, Total 4 Pages, (Mar. 17-20, 2009).

Ishigure, T., et al., "Soft-Lithographic Fabrication of Polymer Parallel Optical Waveguides with Graded-Index Cores for Board-Level Optical Interconnections," IEEE CPMT Symposium Japan, pp. 1-4, (Aug. 2010).

International Search Report Issued Oct. 18, 2011 in PCT/JP11/71376 Filed Sep. 20, 2011.

Combined Chinese Office Action and Search Report issued Jan. 28, 2015 in Patent Application No. 201180045491.6 (with English Translation of Categories of Cited Documents).

Office Action issued Jul. 7, 2015 in Japanese Patent Application No. 2012-535034.

* cited by examiner

OPTICAL WAVEGUIDE AND ELECTRONIC DEVICE

TECHNICAL FIELD

The present invention is related to an optical waveguide and an electronic device.

BACKGROUND ART

In recent years, broadband lines which can communicate large volume data at high speed become popular along with a tide of informatization. A data transmitting device such as a router or a WDM (Wavelength Division Multiplexing) device is used for transmitting the large volume data through the broadband lines. The transmitting device includes a plurality of signal processing boards on which a circuit constituted of a combination of at least one arithmetic element such as a LSI and at least one storage unit such as a memory are mounted. The transmitting devices including these signal processing boards are interconnected through the broadband lines.

Each of the signal processing boards has the circuit in which the arithmetic element, the storage unit and the like are connected with each other through electrical wirings. Along with increase of data volume to be processed, each of the signal processing boards having the circuit is recently required to transmit data at extremely-high throughput. However, these signal processing boards gradually suffer from some problems including cross-talk, generation of high-frequency noise, electrical signal deterioration and the like along with speed-up of data transmission. The same problems come to the surface in the fields of a super computer, a large-scale server and the like.

On the other hand, an optical communication technology which uses an optical carrier wave for transmitting data is well-known. In recent years, an optical waveguide is gradually coming into use as means for transmitting the optical carrier wave from one place to another place. The optical waveguide includes a liner (elongated) core portion and a cladding portion provided on a peripheral surface of the liner core portion so as to surround the liner core portion. The core portion is constituted of a substantially transparent material with respect to light (wavelength) of the optical carrier wave and the cladding portion is constituted of a material having a refractive index lower than the core portion.

In the optical waveguide, light inputted from one end portion of the core portion is transmitted to another end portion of the core portion with refracting at boundary planes between the core portion and the cladding portion. A light emitting element such as a semiconductor laser is provided at a side of the one end portion (input side) of the core portion. A light receiving element such as a photodiode is provided at a side of another end portion (output side) of the core portion. The light inputted by the light emitting element is transmitted through the optical waveguide, and then received by the light receiving element. According to a blink pattern or an intensity pattern of the received light, data communication is carried out.

By using the optical waveguide for the electrical wirings provided in the signal processing board, it is expected that the aforementioned problems due to the electrical wirings are solved, and thereby allowing the signal processing board to transmit data at higher throughput.

As the optical waveguide, a step-index type optical waveguide has been generally used. The step-index type optical waveguide includes a core portion having a constant refractive index and a cladding portion having a constant refractive index lower than the core portion. However, a graded-index type optical waveguide which has a continuously varying refractive index is recently used (suggested).

For example, the following patent document 1 discloses a graded-index type optical waveguide having a refractive index distribution whose cross-sectional distribution of the refractive index concentrically varies. Such refractive index distribution is provided by dispersing a refractive index adjuster into a polymer base forming the core portion and the cladding portion of the optical waveguide. The graded-index type optical waveguide can reduce transmission loss as compared with the step-index type optical waveguide.

In recent years, there is a growing need for developing an optical waveguide having greater capacity (higher throughput), multi-channel and high density. Along with multiplexing and densification channels of the optical waveguide, a pitch between the channels (a pitch of the core portions) becomes narrower. This causes new problems such as an optical cross-talk (unwanted leakage light interference between neighboring channels) and a rounding of a pulse signal (unwanted broadening of a pulse signal).

These aforementioned problems are especially noticeable in the optical waveguide of the type provided with a core portion and a cladding portion in one layer so that a partial refractive index difference in one layer of the optical waveguide is generated.

PRIOR ART DOCUMENT

Patent Document

Patent document 1: JP 2006-276735A

SUMMARY OF THE INVENTION

It is an object of the present invention to provide a reliable optical waveguide which can reduce transmission loss and a rounding of a pulse signal, and an electronic device comprising the optical waveguide.

The above object is achieved by the present invention which is specified in the following (1) to (12).

(1) An optical waveguide comprising:

a core layer which includes at least one core portion for transmitting a light signal and at least two side cladding portions respectively provided at lateral sides of the core portion so as to be opposed to each other; and two cladding layers respectively provided at vertical sides of the core layer, wherein the core layer is configured to have a horizontal refractive index distribution curve W in a width direction of a cross-sectional plane of the core layer, the horizontal refractive index distribution curve W has a region including at least two local minimum values, at least one first local maximum value and at least two second local maximum values smaller than the first local maximum value, the one second local maximum value, the one local minimum value, the first local maximum value, the other local minimum value and the other second local maximum value are arranged in this order in the region, the region of the horizontal refractive index distribution curve W is composed of:
  a first region defined by an interval between the one local minimum value and the other local minimum value; and
  two second regions respectively positioned on outer sides of the first region, the one second region including the one second local maximum value and the other second region including the other second local maximum value, the first region corresponds to the core portion and the second regions respectively correspond to the side cladding portions, the local minimum values of the horizontal refractive index distribution curve W are smaller than an average refractive index of each of the side cladding portions, a refractive index in whole of the horizontal refractive index distribution curve W continuously varies, the optical waveguide is configured to have a vertical refractive index distribution curve T in a thickness direction of the cross-sectional plane of the optical waveguide, the vertical refractive index distribution curve T has a first section including a third local maximum value and having outer sides, and two second sections respectively positioned on the outer sides of the first section so as to be opposed to each other, a refractive index in the first section continuously decreases from the third local maximum value toward the second sections, a refractive index in each of the second sections is substantially constant, and the first section corresponds to the core portion and the second sections respectively correspond to the cladding layers.

(2) The optical waveguide described in above (1), wherein the second local maximum values in the second regions of the horizontal refractive index distribution curve W are respectively positioned at areas other than the vicinities of boundary planes between the core portion and each of the side cladding portions.

(3) The optical waveguide described in above (2), wherein the second local maximum values in the second regions of the horizontal refractive index distribution curve W are respectively positioned at central portions of the second regions, and a refractive index in the one second region continuously decreases from the one second local maximum value toward the one local minimum values, and a refractive index in the other outer region continuously varies from the other second local maximum value toward the other local minimum value.

(4) The optical waveguide described in any one of above (1) to (3), wherein a difference between each of the local minimum values and the average refractive index of each of the side cladding portions is in the range of 3 to 80% with respect to a difference between each of the local minimum values and the first local maximum value.

(5) The optical waveguide described in above (4), wherein the difference between each of the local minimum values and the first local maximum values is in the range of 0.005 to 0.07.

(6) The optical waveguide described in any one of above (1) to (5), wherein when the width direction of the cross-sectional plane of the core layer is defined as a horizontal axis and a refractive index of the core layer is defined as a vertical axis, the horizontal refractive index distribution curve W has a convex portion at the vicinity of the first local maximum value and concave portions at the vicinity of each of the local minimum values.

(7) The optical waveguide described in any one of above (1) to (5), wherein the horizontal refractive index distribution curve W has a flat portion positioned at the vicinity of the first local maximum value, a refractive index in the flat portion is substantially constant, and a length of the flat portion is equal to or shorter than 100 µm.

(8) The optical waveguide described in any one of above (1) to (7), wherein when a width of an area positioned at the vicinity of the first local maximum value having a refractive index being equal to or higher than the average refractive index is defined as "a" [µm] and a width of an area positioned at the vicinity of each of the local minimum values having a refractive index being lower than the average refractive index is defined as "b" [µm], "a" and "b" satisfy a relationship of 0.01a≤b≤1.2a.

(9) The optical waveguide described in any one of above (1) to (8), wherein the third local maximum value of the vertical refractive index distribution curve T is positioned at a central portion of the first region corresponding to the core portion.

(10) The optical waveguide described in any one of above (1) to (9), wherein a difference between the third local maximum value and the refractive index of each of the second sections in the vertical refractive index distribution curve T is larger than a difference between the first local maximum value and each of the local minimum values in the horizontal refractive index distribution curve W.

(11) The optical waveguide described in any one of above (1) to (10), wherein the core layer includes a plurality of the core portions and a plurality of the side cladding portions, and each of the core portions and each of the side cladding portions are alternately arranged.

(12) An electronic device comprising the optical waveguide described in any one of above (1) to (11).

According to the present invention, it is possible to provide an optical waveguide which can reduce transmission loss and a rounding of a pulse signal.

Further, it is possible to provide a reliable electronic device by using the optical waveguide.

DETAILED DESCRIPTION OF THE PREFERRED EMBODIMENT

Hereinafter, an optical waveguide and an electronic device of the present invention will be described in detail based on the preferred embodiments shown in the accompanying drawings.

<Optical Waveguide>

Description is first given to the optical waveguide of the present invention.

(First Embodiment)

Figure 1:
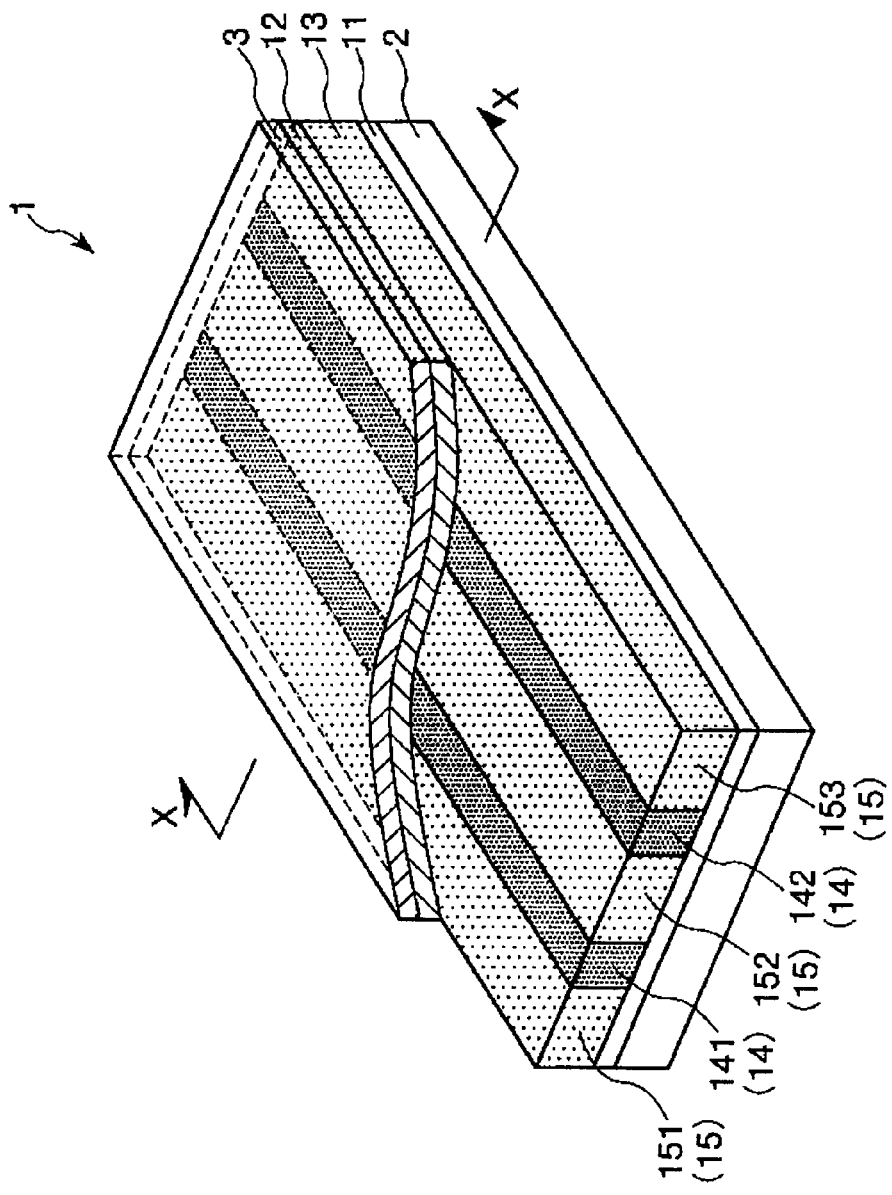
FIG. 1 is a perspective view showing a first embodiment of an optical waveguide according to the present invention (a part thereof is lacked and another part thereof is shown with transparency).
Figure 2:
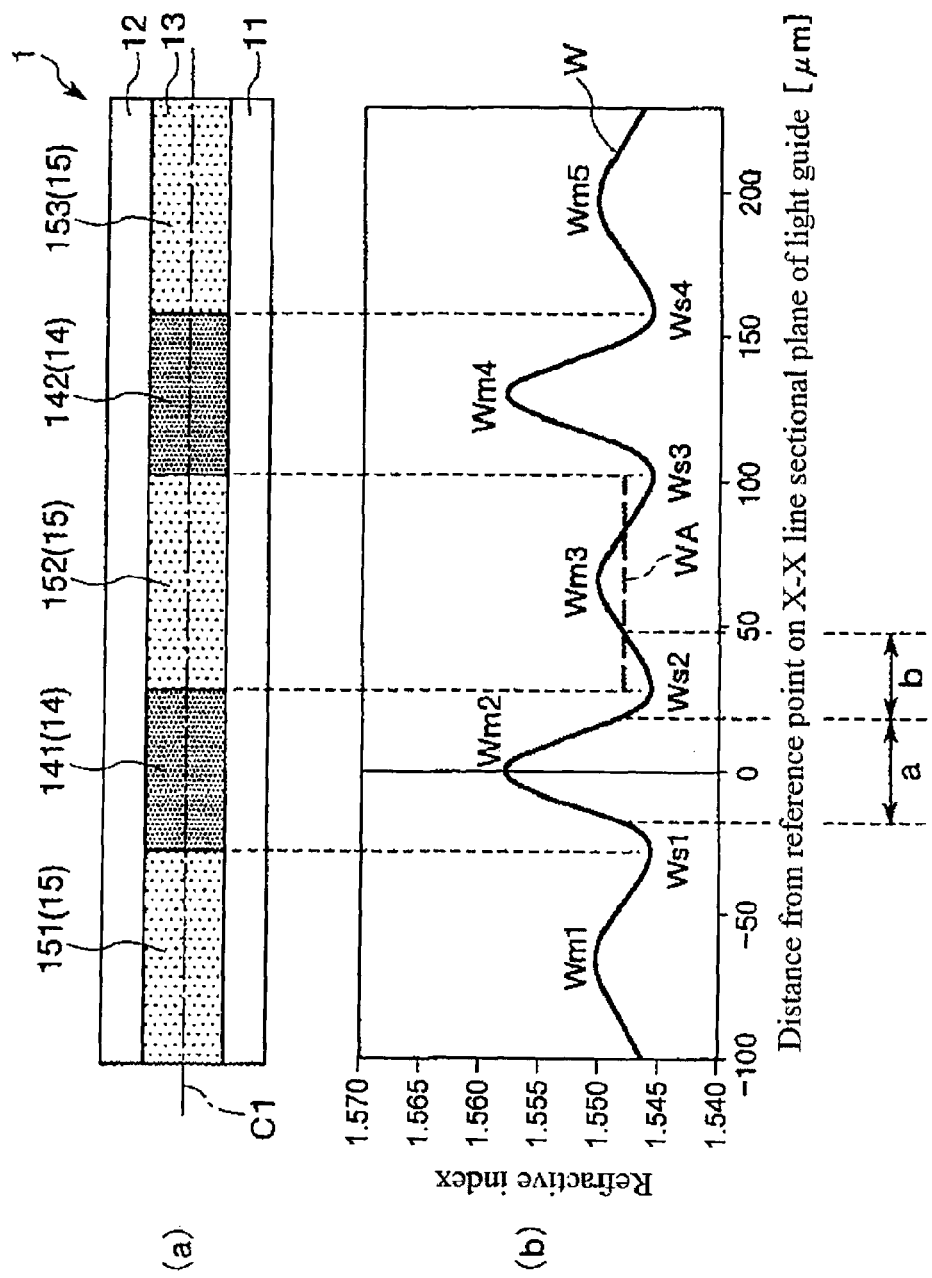
FIG. 2 is a cross-sectional view taken along with an X-X line in FIG. 1 and a graph schematically showing one example of a horizontal refractive index distribution curve W of the optical waveguide taken along with a central line C1 shown in the cross-sectional view. In this graph, a width direction of a core layer is defined as a horizontal axis and a refractive index of the core layer is defined as a vertical axis.
Figure 3:
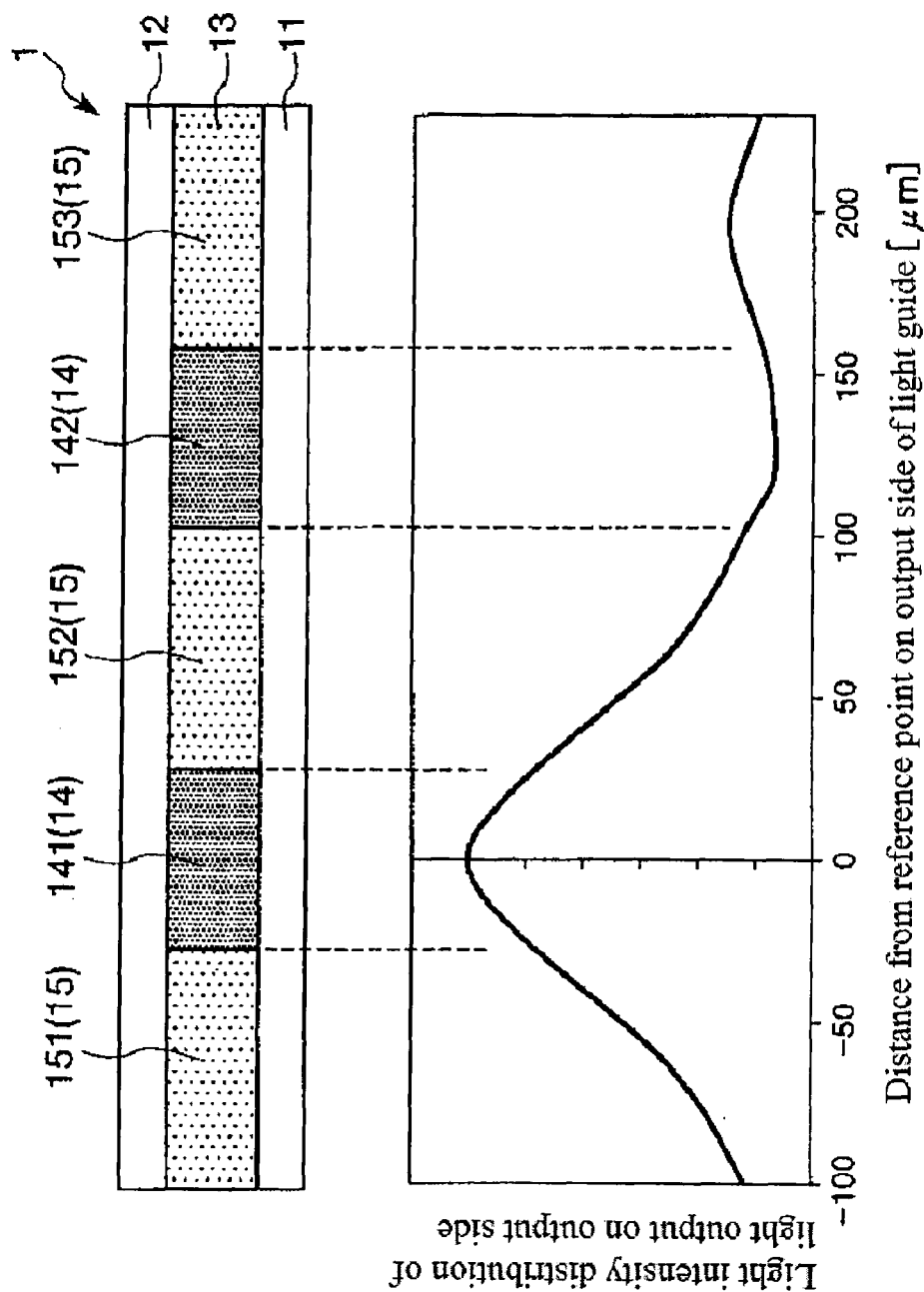
FIG. 3 is a graph showing one example of a light intensity distribution of a light output which is received when a light input is inputted to a core portion of the optical waveguide.

FIG. 1 is a perspective view showing a first embodiment of an optical waveguide according to the present invention (a part thereof is lacked and another part thereof is shown with transparency). FIG. 2 is a cross-sectional view taken along with an X-X line in FIG. 1 and a graph schematically showing one example of a horizontal refractive index distribution curve W of the optical waveguide taken along with a central line C1 shown in the cross-sectional view. In this graph, a width direction of a core layer is defined as a horizontal axis and a refractive index of the core layer is defined as a vertical axis. FIG. 3 is a graph showing one example of a light intensity distribution of a light output which is received when a light input is inputted from a core portion of the optical waveguide. In the following description, an upper side in FIG. 1 is referred to as "upper" and a lower side in FIG. 1 is referred to as "lower". Further, FIG. 1 are drawn in a state that a thickness direction (a vertical direction of each of drawings) thereof is enlarged.

An optical waveguide 1 shown in FIG. 1 has a function of an optical interconnection for transmitting optical signal from one end portion to another end portion of the optical waveguide 1.

Hereinafter, components of the optical waveguide 1 are described in detail.

The optical waveguide 1 includes one cladding layer 11, a core layer 13 and another cladding layer 12, which are laminated in this order from the lower side of FIG. 1.

According to the optical waveguide 1 described later in detail, it is possible to reduce transmission loss and a rounding of a pulse signal. This makes it possible to provide reliable optical communication even in a case where a large volumetric light signal is inputted to the optical waveguide 1.

Further, in a case where a channel in the core layer 13 is multiplexed by forming a plurality of core portions in the core layer 13, the optical waveguide 1 can reduce cross-talk in a width direction thereof.

In another case where a channel in the core layer 13 is multiplexed by laminating a plurality of the core portions in the core layer 13, the optical waveguide 1 can reduce cross-talk in a thickness direction thereof.

Namely, the optical waveguide 1 can have a high-efficient optical transmission property (a first effect).

The optical waveguide 1 is configured to have a horizontal refractive index distribution curve W, which has first local maximum values, second local maximum values and local minimum values, in the width direction thereof (in-plane direction of the layer). Since each of the first local maximum values is positioned between the local minimum values, a large refractive index difference between a core portion 14 and each of side cladding portions 15 is generated in the optical waveguide 1. This makes it possible to suppress (reduce) leak light leaking from the core portion 14. In addition, the optical waveguide 1 is configured to have the second local maximum values, which are lower than each of the first local maximum values, respectively positioned in the side cladding portions 15. Therefore, even in a case where the leak light of the core portion 14 leaks to the side cladding portions 15, the leak light is confined in the vicinities of areas in which the second local maximum values are respectively positioned. This makes it possible to reduce the cross-talk between the core portions 14 which are adjacent to each other in the width direction of the core layer 13.

In addition, the optical waveguide 1 is configured to have a vertical refractive index distribution curve T in the thickness direction thereof (laminated direction of the layers). The vertical refractive index distribution curve T has a shape of a graded-index (GI) type refractive index distribution. In the GI type refractive index distribution, a refractive index continuously decreases from a core portion toward a cladding portion. An optical guide having such a GI type refractive index distribution can provide significantly high-efficient optical confinement effect as compared with an optical guide having a step-index (SI) type refractive index distribution. By using the optical waveguide having the GI type refractive index distribution, it is possible to efficiently reduce optical transmission loss and to achieve high-efficient optical transmission property. Although the reasons why the above effects are provided by the optical waveguide having the GI type refractive index distribution are not sufficiently clear, it is considered that the effects are provided by efficiently suppressing optical penetration from the core portion due to the GI type refractive index distribution.

Further, by using the optical waveguide 1, it is possible to easily optimize a design of the optical waveguide for reducing the optical transmission loss (optical loss) in accordance with requirements of aspect (a second effect).

For example, it is possible to allow the shape of the horizontal refractive index distribution curve W to differ from the shape of the vertical refractive distribution curve T. In particular, by setting a refractive index difference in the thickness direction of the optical waveguide 1 to be larger than a refractive index difference in the width direction of the optical waveguide 1, it is possible to reduce the optical loss caused by bending or rolling up a film including the optical waveguide 1 in the extension direction thereof. This is because it is possible to allow the minimum bending radius to be smaller by enlarging the refractive index difference since a minimum bending radius (curvature), which has no effect on the optical transmission, depends on the refractive index difference.

Further, the optical guide 1 can have high flexibility in the design (a third effect).

The optical guide 1 is formed by, for example, laminating some films (layers). At the time of designing the optical waveguide 1, thicknesses of the cladding layers 11, 12 can be changed by adjusting a thickness of the core layer 13. Since the thickness of the core layer 13 can be accurately controlled, it is possible to maximize effects such as a reduction of an optical coupling loss. When the optical waveguide 1 is bended, compression force is applied to an inside of a bending portion thereof and tensile force is applied to an outside of the bending portion thereof. In this case, unintended change of the refractive index in the optical waveguide 1 is caused. According to the optical waveguide 1 of the present invention, it is possible to easily change the designs of the cladding layers 11, 12 respectively laminated on the both surfaces of the core layer 13 (provided at vertical sides of the core layer 13) with considering the unintended change caused by the bending of the optical waveguide 1.

(Core Layer)

The core layer 13 is configured to have a horizontal refractive index distribution in which non-uniform broadenings of the refractive index are formed in the width direction thereof. The horizontal refractive index distribution curve W is composed of first regions having a relative high refractive index and second regions having a relative low refractive index. This makes it possible to transmit the light input with confining the light input in the first regions.

FIG. 2a is a cross-sectional view taken along with an X-X line in FIG. 1. FIG. 2b is a graph schematically showing one example of the horizontal refractive index distribution curve W of the optical waveguide taken along with a central line C1 shown in the cross-sectional view (FIG. 2a).

As shown in FIG. 2b, the core layer 13 is configured to have the horizontal refractive index distribution curve W having four local minimum values Ws1, Ws2, Ws3, Ws4 and five local maximum values Wm1, Wm2, Wm3, Wm4, Wm5 in the width direction thereof. The five local maximum values is composed of the first local maximum values and the second local maximum values smaller than the first local maximum values.

The local maximum value Wm2 (one of the first local maximum values) is positioned between the local minimum values Ws1, Ws2. The local maximum Wm4 (another of the first local maximum values) is positioned between the local minimum values Ws3, Ws4. The local maximum values Wm1, Wm3, Wm5 respectively correspond to the second local maximum values are smaller than the first local maximum values and the second local maximum values.

In the optical waveguide 1 shown in FIG. 2, the local maximum value Wm2, which is relatively large, is positioned between the local minimum values Ws1, Ws2. Thus, an interval between the local minimum values Ws1, Ws2 corresponds to the core portion 14. To be more specific, the interval between the local minimum values Ws1, Ws2 corresponds to a core portion 141 and an interval between the local minimum values Ws3, Ws4 corresponds to a core portion 142.

A left-side area of the local minimum value Ws1, an interval between the local minimum values Ws2, Ws3 and a right-side area of the local minimum value Ws4 respectively adjoin to side surfaces of the core portion 14. Thus, these areas respectively correspond to the side cladding portions 15 shown in the FIG. 2. To be more specific, the left-side area of the local minimum value Ws1 corresponds to a side cladding portion 151, the interval the local minimum values Ws2, Ws3 corresponds to a side cladding portion 152 and the right-side area of the local minimum value Ws4 corresponds to a side cladding portion 153.

Namely, the horizontal refractive index distribution curve W has at least a region where the second local maximum value, the local minimum value, the first local maximum value, the local minimum value and the second local value are arranged in this order. This region may be repeatedly provided in the horizontal refractive index distribution curve W depending on the number of the core portion 14. In a case where the number of the core portions 14 is two as shown in this embodiment, the horizontal refractive index distribution curve W has a region where the second local maximum value, the local minimum value, the first local maximum value, the local minimum value, the second local maximum value, the local minimum value, the first local maximum value, the local minimum value and the second local maximum value are arranged in this order. Namely, the local maximum values and the local minimum values are alternately arranged in the region. Regarding the local maximum values, the first local maximum values and the second maximum values are alternately arranged in the region.

The local minimum values preferably have the same value as each other. The first local maximum values preferably have the same value as each other. The second local maximum values preferably have the same value as each other. However, each of the first local maximum values, each of the second local maximum values and each of the local minimum values may be slightly different from each other, as long as the local minimum values are smaller than the first local maximum values and the second maximum values and the second local maximum values are smaller than the first local maximum values. In this case, each of differences between each of the first local maximum values, each of the second local maximum values or each of the local minimum values is preferably equal to or less than 100 of an average value of the local minimum values.

The optical waveguide 1 has an elongated shape. Further, the horizontal refractive index distribution curve W keeps the same shape in a longitudinal direction of the optical waveguide 1.

The two elongated core portions 14 and the three side cladding portions 15 adjoining to side surfaces of the core portions 14 (provided at lateral sides of the core portions 14) are formed in the core layer 13 so as to form the horizontal refractive index distribution curve W.

In particular, the optical waveguide 1 shown in FIG. 1 includes the two parallel core portions 141, 142 and the three parallel side cladding portions 151, 152, 153. The parallel core potions 141, 142 and the parallel side cladding portions 151, 152, 153 are alternately arranged each other. In this case, each of the core portions 141, 142 is surrounded by the side cladding portions 151, 152, 153 and the cladding layers 11, 12. Since each of the refractive indexes of the core portions 141, 142 is higher than the refractive indexes of the side cladding portions 151, 152, 153, it is possible to reflect light at boundary planes between each of the core portions 141, 142 and each of the side cladding portions 151, 152, 153. In FIG. 1, the core portions 14 are illustrated by dense dots and the side cladding portions 15 are illustrated by non-dense dots.

The optical waveguide 1 can transmit the light input from the one end portion (input side) to the other end portion (output side) of the core portion 14 by reflecting the light input at the boundary planes between the core portion 14 and each of cladding portions (each of the side cladding portions 15 and the cladding layers 11, 12). Therefore, it is possible to output the light output from the other end portion (output side) of the core portion 14.

The core portion 14 shown in FIG. 1 has a square shape or a rectangular shape in a cross-sectional plane, but a cross-sectional shape of the core portion 14 is not particularly limited thereto. For example, the cross-sectional shape of the core portion 14 may be a circular shape such as a true circle, an ellipse and an oval, or a polygonal shape such as a triangular shape, a pentagonal shape and a hexagonal shape.

A width and a height of the core portions 14 (a thickness of the core layer 13) are not particularly limited to a specific value, but preferably in the range of about 1 to 200 µm, more preferably in the range of about 5 to 100 µm, and even more preferably in the range of 20 to 70 µm.

Each of the four local minimum values Ws1, Ws2, Ws3, Ws4 is smaller than an average refractive index WA of each of the side cladding portions 15 adjoining to each of the local minimum values Ws1, Ws2, Ws3, Ws4. Therefore, regions having a refractive index lower than each of the side cladding portions 15 are respectively formed between the core portions 14 and the side cladding portions 15. As a result, steep slopes are respectively formed at the vicinities of the local minimum values Ws1, Ws2, Ws3, Ws4. Since these steep slopes can suppress (reduce) the leak light leaking from the core potions 14, it is possible to obtain (produce) the optical waveguide 1 which can reduce the transmission loss.

The horizontal refractive index distribution curve W continuously varies over the whole area thereof. This makes it possible to improve the optical confinement effects of the core portions 14, and thereby allowing the transmission loss of the optical waveguide 1 to be smaller than the step-index type optical waveguide.

Further, almost of the light input is intensively transmitted through the vicinities of central portions of the core portions 14 because the horizontal refractive index distribution curve W has the local minimum values Ws1, Ws2, Ws3, Ws4 and continuously varies. As a result, transmission time differences between optical paths are not likely to occur. Therefore, even in a case where light to be transmitted contains a pulse signal, it is possible to suppress (reduce) the rounding of the pulse signal (unwanted broadening of the pulse signal). This makes it possible to obtain (provide) the optical waveguide 1 which can improve quality of optical communication.

In the above description, the expression "the horizontal refractive index distribution curve W continuously varies" means a state that the horizontal refractive index distribution curve W has rounded parts which can be differentiated.

In a case where the core portions 14 and the side cladding portions 15 are formed in the core layer 13 as in this embodiment, it is generally impossible to allow an average refractive index difference between the core portions 14 and the side cladding portions 15 to be sufficiently-large because of restrictions due to a method for generating refractive index differences in the optical waveguide 1. According to the present invention, it is possible to reliably confine light in the core portions 14 even in a case where the average refractive index difference between the core portions 14 and the side cladding portions 15 is small. As a result, the present invention can particularly provide remarkable effects of the optical waveguide 1 produced by forming the core portions 14 and the side cladding portions 15 in the same layer.

As shown in FIG. 2, the local maximum values Wm2, Wm4 of the horizontal refractive index distribution curve W are respectively positioned in the core portions 141, 142, but preferably positioned at central portions of the core portions 141, 142. This makes it possible to increase a probability that the light is intensively transmitted through the central portions of the core portions 141, 142, so that a possibility that the light leaking to the side cladding portions 151, 152, 153 becomes relative low. As a result, it is possible to reduce the transmission loss of the core portions 141, 142.

The central portion of the core portion 141 is an area whose central point is positioned at the middle point between the local minimum values Ws1, Ws2, and whose width is equal to 30% of the width of the core portion 141.

Each of the local maximum values Wm2, Wm4 is preferably positioned at central point of each of the core portions 141, 142, but each of the local maximum values Wm2, Wm4 may not be always positioned at the central point of each of the core portions 141, 142. When each of the local maximum values Wm2, Wm4 is positioned at any points other than the vicinities of end portions of the core portions 141, 142 (the vicinities of the boundary planes between each of the core portions 141, 142 and each of the side cladding portions 151, 152, 153), it is possible to avoid a significant deterioration of transmission loss property. In other words, it is possible to partially suppress (reduce) the transmission loss of the core portions 141, 142 by doing this.

The vicinities of the end portions of the core portions 141 respectively correspond to side end areas of the core portion 141 whose width are equal to 5% of the width of the core portion 141.

As shown in FIG. 2b, the local maximum values Wm1, Wm3, Wm5 of the horizontal refractive index distribution curve W are respectively positioned in the side cladding portions 151, 152, 153. The local maximum values Wm1, Wm3, Wm5 are preferably positioned at any point other than the vicinities of the end portions of the side cladding portions 151, 152, 153 (boundary planes between each of the core portions 141, 142 and each of the side cladding portions 151, 152, 153). This makes it possible to take sufficient spaces between the local maximum values Wm2, Wm4 of the core portions 141, 142 and the local maximum values Wm1, Wm3, Wm5 of the side cladding portions 151, 152, 153, and thereby allowing possibility of leaking the transmitted light from the core portions 141, 142 to the side cladding portions 151, 152, 153 to be sufficiently-low. As a result, it is possible to reduce the transmission loss of the core portions 141, 142.

The vicinities of the end portions of the side cladding portions 151, 152, 153 respectively correspond to side end areas of the side cladding portions 151, 152, 153 whose widths are equal to 5% of the width of each of the side cladding portions 151, 152, 153.

Each of the local maximum values Wm1, Wm3, Wm5 is preferably positioned in a central portion of each of the side cladding portions 151, 152, 153. Further, a refractive index in each of the side cladding portions 151, 152, 153 preferably decreases from the local maximum values Wm1, Wm3, Wm5 toward the minimum values Ws1, Ws2, Ws3, Ws4 in continuity. This makes it possible to maximize spaces between the local maximum values Wm2, Wm4 of the core portions 141, 142 and the local maximum values Wm1, Wm3, Wm5 of the side cladding portions 151, 152, 153, and to reliably confine light in the vicinities of the local maximum values Wm1, Wm3, Wm5. As a result, it is possible to reliably suppress (reduce) the leak light leaking from the core portions 141, 142.

Further, each of the local maximum values Wm1, Wm3, Wm5 is smaller than each of the local maximum values Wm2, Wm4 of the core portions 141, 142. The side cladding portions 151, 152, 153 do not have high-efficient optical transmission property as compared with the core portions 141, 142, but the side portions 151, 152, 153 have slightly optical transmission property because the refractive index of each of the side cladding portions 151, 152, 153 is higher than surrounding areas. As a result, the side cladding portions 151, 152, 153 can confine the leak light leaking from the core portions 141, 142, and thereby preventing the leak light from spreading to the other core portions. In other words, it is possible to suppress the cross-talk by existence of the local maximum values Wm1, Wm3, Wm5.

As described above, each of the local minimum values Ws1, Ws2, Ws3, Ws4 is smaller than the average refractive index WA of each of the side cladding portions 15 adjoining to each of the local minimum values Ws1, Ws2, Ws3, Ws4. Differences between each of the local minimum values Ws1, Ws2, Ws3, Ws4 and the average refractive index WA are preferably set to fall within the predetermined range. In particular, the differences between each of the local minimum values Ws1, Ws2, Ws3, Ws4 and the average refractive index WA are preferably in the range of about 3 to 80% of differences between each of the local minimum values Ws1, Ws2, Ws3, Ws4 and each of the local maximum value Wm2, Wm4, more preferably in the range of about 5 to 50%, even more preferably in the range of about 7 to 20%. By setting the differences between each of the local minimum values Ws1, Ws2, Ws3, Ws4 and the average refractive index WA to fall within the above range, it is possible to allow the side cladding portions 15 to have a necessary and sufficiently-high optical transmission property for suppressing the cross-talk. If the differences between each of the local minimum values Ws1, Ws2, Ws3, Ws4 and the average refractive index WA are smaller than the above lower limit, there is a case where it is impossible to suppress the cross-talk because the optical transmission properties of the side cladding portions 15 are insufficient. On the other hand, if the differences between each of the local minimum values Ws1, Ws2, Ws3, Ws4 and the average refractive index WA are larger than the above upper limit, there is a case where the optical transmission properties of the side cladding portions 15 become too excessive and negatively affects the optical transmission properties of the core portions 141, 142.

Differences between each of the local minimum values Ws1, Ws2, Ws3, Ws4 and each of the local maximum values Wm1, Wm3, Wm5 are preferably in the range of about 6 to 90% of differences between each of the local minimum values Ws1, Ws2, Ws3, Ws4 and each of the local maximum values Wm2, Wm4, more preferably in the range of about 10 to 70%, even more preferably in the range of 14 to 40%. By setting the differences between each of the local minimum values Ws1, Ws2, Ws3, Ws4 and each of the local maximum values Wm1, Wm3, Wm5 to fall within the above range, it is possible to optimize a balance between the refractive indexes of the side cladding portions 15 and the refractive indexes of the core portions 14. As a result, it is possible to allow the optical waveguide 1 to have superior optical transmission property and to be capable of reliably suppressing the cross-talk.

The differences between each of the local minimum values Ws1, Ws2, Ws3, Ws4 and each of the local maximum values Wm2, Wm4 are preferably as large as possible, but preferably in the range of about 0.005 to 0.07, more preferably in the range of about 0.007 to 0.05, and even more preferably in the range of about 0.01 to 0.03. By setting the differences between each of the local minimum values Ws1, Ws2, Ws3, Ws4 and each of the local maximum values Wm2, Wm4 to fall within the above range, it is possible to allow these differences to be necessary and sufficiently large for reliably confining light in the core portions 141, 142.

When the width direction of the cross-sectional plane of the core layer 13 is defined as a horizontal axis and the refractive index of the core layer 13 is defined as a vertical axis, the horizontal refractive index distribution curve W may have approximately invert V-shaped portions protruding toward the upper side thereof at the vicinities of the local maximum values Wm2, Wm4 in a state that the refractive index continuously varies (that is, the refractive index of the horizontal refractive index distribution curve W, other than points of the local maximum values and the local minimum values, linearly varies). However, as shown in FIG. 2b, the horizontal refractive index distribution curve W preferably has approximately convex portions protruding toward the upper side thereof at the vicinities of the local maximum values Wm2, Wm4 (that is, the whole of the vicinities of the local maximum values Wm2, Wm4 are rounded). By forming the horizontal refractive index distribution curve W having such rounding portions, it is possible to more improve the optical confinement effects of the core portions 141, 142.

The horizontal refractive index distribution curve W may have approximately V-shaped portions protruding toward the lower side thereof at the vicinities of the local minimum values Ws1, Ws2, Ws3, Ws4 in a state that the refractive index continuously varies (that is, the refractive index of the horizontal refractive index distribution curve W, other than points of the local maximum values and the local minimum values, linearly varies). However, as shown in FIG. 2b, the horizontal refractive index distribution curve W preferably has approximately concave portions protruding toward the lower side at the vicinities of the local minimum values Ws1, Ws2, Ws3, Ws4 (that is, the wholes of at the vicinities of the local minimum values Ws1, Ws2, Ws3, Ws4 are rounded).

The present inventors have succeeded in finding out that a light intensity distribution obtained from the light output of the optical waveguide 1 is extremely useful for suppressing the cross-talk of the optical waveguide 1. The light output is obtained by inputting the light input to the one end portion (input side) of one of the core portions 141, 142 of the optical waveguide 1 and then receiving the transmitted light input (that is the light output) at the other end portion (output side) of the one of the core portions 141, 142.

FIG. 3 is a graph showing one example of the light intensity distribution of the light output which is received when the light input is inputted to the core portion 141 of the optical waveguide 1.

When the light input is inputted to the core portion 141, the light intensity distribution of the light output has a maximum light intensity at a central point of the core portion 141. In the light intensity distribution, a light intensity generally decreases with distance from the central point of the core portion 141. According to the optical waveguide 1 of the present invention, it is possible to obtain a light intensity distribution having a local minimum value positioned in the core portion 142 which is adjacent to the core portion 141. By positioning the local minimum value in the core portion 142, it is possible to significantly reduce the cross-talk of the core portion 142. As a result, it is possible to obtain the optical waveguide 1 which can reliably prevent the interference even in a case where the optical waveguide 1 has the multiple channels and high density of channels.

In a prior optical waveguide, a light intensity distribution does not have a local minimum value in one core portion being adjacent to another core potion to be inputted light input. Further, the light intensity distribution of the prior optical waveguide has a local maximum value positioned in the other one core portion to be inputted the light input. Therefore, the prior optical waveguide has suffered from the cross-talk. In contrast, the optical waveguide of the present invention having the above light intensity distribution is extremely useful for suppressing the cross-talk.

The reasons why the optical waveguide of the present invention can obtain the above light intensity distribution are not sufficiently clear, but it is considered that one of the reasons is a shift of the light intensity distribution, in which the local maximum value is positioned in the core portion 142 such as the prior optical waveguide, toward the side cladding portion 153 adjoining to the core portion 142. This shift is caused by the unique horizontal refractive index distribution curve W having the local minimum values Ws1, Ws2, Ws3, Ws4 and continuously varying. Namely, it is possible to suppress the cross-talk by the shift of the light intensity distribution caused by the unique horizontal refractive index distribution curve W.

When the light intensity distribution of the light output is shifted toward one of the side cladding portions 15, a light receiving element is positioned in response to the shift. Therefore, the interference (cross-talk) is hardly to occur, and deterioration of the optical communication quality is not occurred.

The above light intensity distribution of the light output can be observed with a high possibility by using the optical waveguide of the present invention, but the above light intensity distribution of the light output is not always observed even in a case of using the optical waveguide of the present invention. Depending on some conditions such as an NA (numerical aperture) of the light input, a cross-sectional square measure of the core portion 141 and a pitch between the core portions 141, 142, there are some cases where a distinct local minimum value is not formed or the local minimum value is not positioned in the core portion 142. Even in the above cases, it is possible to reliably suppress the cross-talk.

In the horizontal refractive index distribution curve W shown in FIG. 2b, a width of an area positioned at the vicinity of each of the local maximum values Wm2, Wm4 having a refractive index being continuously higher than the average refractive index WA of each of the side cladding portions 15 is defined as "a" [μm] and a width of each of an area positioned at the vicinity of each of the local minimum values Ws1, Ws2, Ws3, Ws4 having a refractive index being continuously lower than the average refractive index WA of each of the side cladding portions 15 is defined as "b" [μm]. In this case, "a" and "b" preferably satisfy a relationship of about $0.01a \leq b \leq 1.2a$, more preferably satisfy a relationship of about $0.03a \leq b \leq 1.0a$, even more preferably satisfy a relationship of about $0.1a \leq b \leq 0.8a$. By setting "a" and "b" to satisfy the above relationship, it is possible for substantive widths of the local minimum values Ws1, Ws2, Ws3, Ws4 to provide the aforementioned functions and effects. If "b" is smaller than the above lower limit, there is a case where the optical confinement effect decreases because the substantive widths of the local minimum values Ws1, Ws2, Ws3, Ws4 do not have sufficiently-long lengths. If "b" is larger than the above upper limit, there is a case where it becomes difficult to multiplex and density the channels because the substantive widths of the local minimum values Ws1, Ws2, Ws3, Ws4 are broadened more than necessary, thereby restricting the widths of the core portions 141, 142 or the pitch distance between the core portions 141, 142.

It is possible to approximate the average refractive index WA of each of the side cladding portions 15 with a median of the local maximum value Wm1 and the local minimum value Ws1.

As described above, the horizontal refractive index distribution curve W may have the approximately convex portions protruding the upper side at the vicinities of the local maximum values Wm1, Wm2, Wm3, Wm4, Wm5. However, the horizontal refractive index distribution curve W may have approximately flat portions having a substantially constant refractive index at the vicinities of top portions of the convex portions, which are respectively positioned at the local maximum values Wm1, Wm2, Wm3, Wm4, Wm5. Even in a case where the horizontal refractive index distribution curve W has the flat portions, the optical waveguide of the present invention can provide the aforementioned functions and effects. The approximately flat portions having the substantially constant refractive index are defined by areas whose refractive index variation is smaller than 0.001 and refractive indexes of both side areas continuously decrease.

A length of each of the flat portions is not particularly limited to a specific value, but preferably equal to or shorter than 100 μm, more preferably equal to or shorter than 20 μm, and even more preferably equal to or shorter than 10 μm.

In this embodiment, while description is given to a case where the core layer 13 has the two core portions 14, the number of the core portions 14 is not limited thereto. The number of the core portions 14 may be one, three or more.

In an example case where the number of the core portions 14 is one, the horizontal refractive index distribution curve W of the optical waveguide 1 has the two local minimum values which are smaller than the average refractive index WA such as described above, and continuously varies over the whole thereof. If the number of the core potions 14 increases to three, four, five or more, the number of local minimum values contained in the horizontal refractive index distribution curve W increases six, eight, ten or more along with increase of the number of the core portions 14.

A constituent material (main material) of the core layer 13 may be any material, as long as it can generate the above refractive index differences. In particular, examples of such constituent material include: various kinds of resin materials such as an acryl-based resin, a methacryl-based resin, polycarbonate, polystyrene, a cyclic ether-based resin (e.g., an epoxy resin or an oxetane-based resin), polyamide, polyimide, polybenzoxazole, polysilane, polysilazane, a silicone-based resin, a fluoro-based resin, polysilane, polyurethane and a cyclic olefin-based resin (e.g., a benzocyclobutene-based resin or a norbornene-based resin); a glass material such as quartz glass and borosilicic acid glass; and the like. In this regard, the resin material may be a composite material containing different compounds in combination.

Among them, it is preferable to use the norbornene-based resin (polymer). The norbornene-based polymer can be obtained using various kinds of well-known polymerizations such as ring opening metathesis polymerization (ROMP), a combination of ROMP and hydrogenation, polymerization via radicals or cations, polymerization using a cationic palladium polymerization initiator and polymerization using other polymerization initiator than them (e.g., a nickel polymerization initiator or another transition metal polymerization initiator).

(Cladding Layer)

The cladding layers 11, 12 respectively correspond to the cladding portions laminated on an upper surface and a lower surface of the core layer 13 (provided at vertical sides of the core layer 13).

An average thickness of each of the cladding layers 11, is preferably in the range of about 0.1 to 1.5 times of an average thickness of the core layer 13 (an average height of the core layer 13). In particular, the average thickness of each of the cladding layers 11, 12 is preferably in the range of 1 to 200 μm, more preferably in the range of 5 to 100 μm, and even more preferably in the range of 10 to 60 μm. By setting the average thickness of each of the cladding layers 11, 12 to fall within the above range, it is possible to prevent increasing a size (thickness) of the optical waveguide 1 and sufficiently provide the functions of the cladding portions.

A constituent material of each of the cladding layers 11, 12 may be the same material as the above constituent materials of the core layer 13, but is preferably the norbornene-based polymer.

At the time of selecting the constituent material of the core layer 13 and the constituent material of each of the cladding layers 11, 12, it is necessary to consider a refractive index difference between both the constituent materials. In particular, it is necessary to select both the constituent materials so as to allow the refractive index of the constituent material of the core portions 14 to be sufficiently-high for reliably reflecting light at boundary planes between the core portions 14 and each of the cladding layers 11, 12. By selecting such constituent material, it is possible to generate a sufficient-large refractive index difference in the thickness direction of the optical waveguide 1. As a result, it is possible to suppress the leak light leaking from each of the core portions 14 to the cladding layers 11, 12.

From a viewpoint of suppressing light attenuation, it is also important that an adhesion (compatibility) between the constituent of the core layer 13 and the constituent material of each of the cladding layer 11, 12 is high.

The vertical refractive index distribution curve T of the optical waveguide 1 in the thickness direction of the optical waveguide 1 has a shape differing from the shape of the horizontal refractive index distribution curve W.

FIG. 4a is a cross-sectional view taken along with the X-X line in FIG. 1 which shows a part of the core portion and parts of the cladding portions. FIG. 4b is a graph schematically showing one example of the vertical refractive index distribution curve T of the optical waveguide taken along with a central line C2 shown in FIG. 4a. In FIG. 4b, the refractive index of the core layer 13 is defined as a horizontal axis and a position on the central line C2 (distance from reference point on the X-X line cross-sectional plane of the optical waveguide) is defined as a horizontal axis.

As described above, the optical waveguide 1 includes the cladding layers 11, 12 and the core layer 13. The vertical refractive index distribution curve T in the thickness direction of the cross-sectional plane through the core portion 14 has a local maximum value Tm (the third maximum value) and a first section T1 in which a refractive index continuously decreases from the local maximum value Tm toward both side end portions of the first section T1. The first section T1 including the local maximum value Tm corresponds to the core portion 14 shown in FIG. 4a.

The vertical refractive index distribution curve T further has second sections T2 which are respectively positioned on outer side of the core portion 14 so as to opposed to each other and has a substantially constant refractive index. The second sections T2 respectively correspond to the cladding layers 11, 12 shown in FIG. 4a. Namely, as described above, the vertical refractive index distribution curve T has the shape of the graded-index (GI) type refractive index distribution.

In boundary planes between the first section T1 and each of the second sections T2, a refractive index may continuously vary or discontinuously vary.

Figure 4:
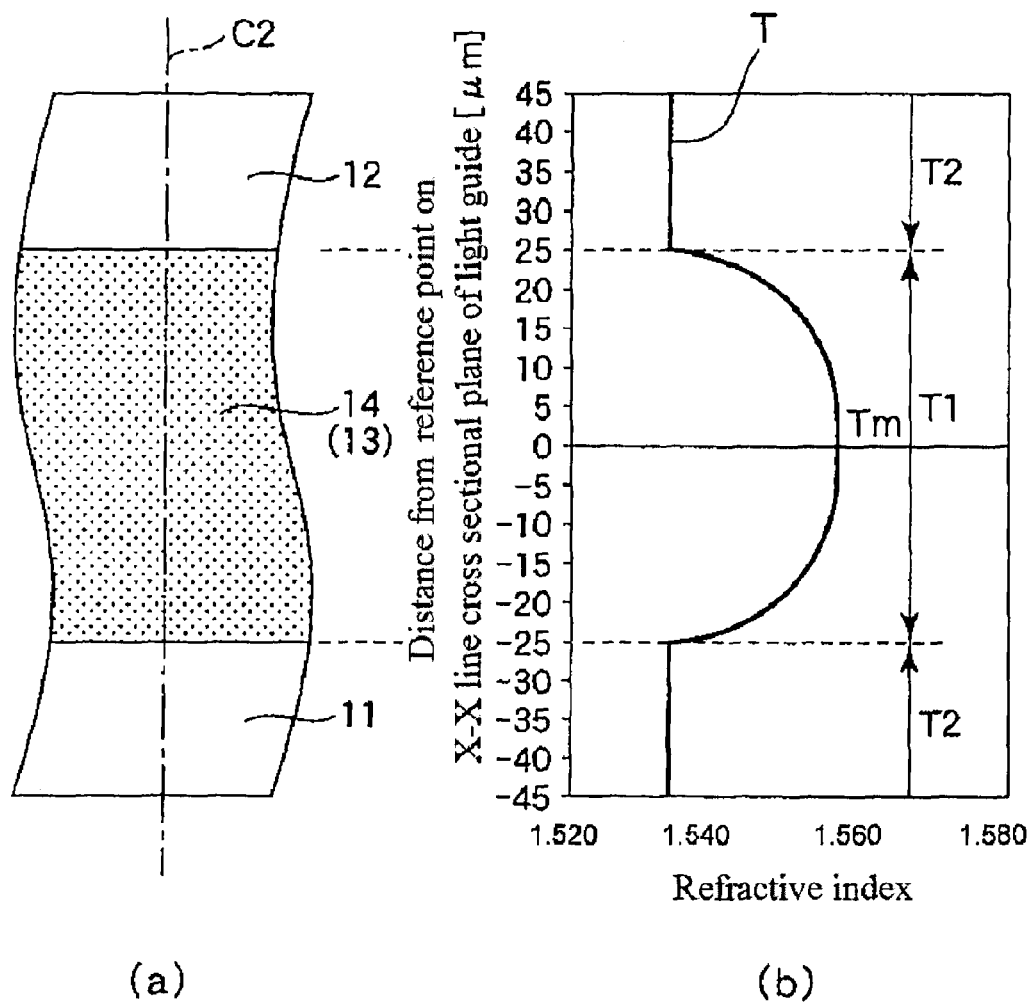
FIG. 4 is a cross-sectional view taken along with the X-X line in FIG. 1 which shows a part of the core portion and parts of cladding portions and a graph schematically showing one example of a vertical refractive index distribution curve T of the optical waveguide taken along with a central line C2 shown in the cross-sectional view.

The local maximum value Tm of the vertical refractive index distribution curve T shown in FIG. 4 is positioned at a central portion of the first section T1 corresponding to the core portions 14. This makes it possible to increase probability that the light is intensively transmitted through the central portions of the core portions 14, so that possibility that the light leaking to the cladding layer 11, 12 becomes relative low. As a result, it is possible to reduce the transmission loss of the core portions 14.

As described above, the optical waveguide 1 of the present invention is configured to have the horizontal refractive index distribution curve W having the aforementioned shape and the vertical refractive index distribution curve T having the aforementioned shape. Therefore, the optical waveguide 1 is configured to have a structure which can suppress the leaking of the light from the optical waveguide 1 to outsides and increase the possibility that the light is intensively transmitted through the central portions of the core portions 14 in the width direction as well as the thickness direction of each of the core portions 14. As a result, the optical waveguide 1 can reliably prevent the transmission loss, the rounding of pulse signal and the cross-talk.

For example, in a case of using the optical waveguide 1 formed by laminating a plurality of the core layers 13, the vertical refractive index distribution curve T can reliably prevent the cross-talk among the core layers 13 from occurring. Namely, when the light input is inputted to one of the core portions 14 formed in a first layer of the core layers 13, it is possible to reliably prevent the light input from interfering in another of the core portions 14 formed in a second layer of the core layers 13. Therefore, it is possible to multiplex and density the channels of the optical waveguide 1 in the thickness direction as well as in the width direction.

The central portion of the core portion 14 is area whose central point is positioned at the middle point of the core portion 14, and whose thickness is equal to 30% of the thickness of the core portion 14.

The local maximum value Tm may not be always positioned at the central portion of the core portion 14. When the local maximum value Tm is positioned at any point other than the vicinities of the end portions of the core portion 14 (the vicinities of the boundary planes between the core portion 14 and each of the cladding layers 11, 12), it is possible to avoid the significant deterioration of transmission loss property. In other words, it is possible to partially suppress (reduce) the transmission loss of the core portions 14 by doing this.

The vicinities of the end portions of the core portion 14 respectively correspond to side end areas of the core portion 14 whose thickness are equal to 5% of the thickness of the core portion 141.

In the vertical refractive index distribution curve T, a difference between the local maximum value Tm positioned in the core portions 14 and a refractive index n2 of each of the cladding layers 11, 12 (ratio of the local maximum value Tm to the refractive index n2) is preferably as large as possible. In particular, the refractive index difference (ratio) is preferably equal to or more than 0.5%, and more preferably equal to or more than 0.8%. An upper limit for the difference (ratio) may not be limited to a specific value, but is preferably set about 5.5%. If the refractive index difference (ratio) is smaller than the above lower limit, there is a case where the optical transmission efficiency decreases. On the other hand, if the refractive index difference (ratio) is larger than the above upper limit, there is a case where it is hardly expected that the optical transmission efficiency becomes higher.

The ratio of the local maximum value Tm to the refractive index n2 is represented by the following formula.

$$\text{The ratio}(\%) = |Tm/n2 - 1| \times 100$$

The refractive index difference (Tm−n2) is set a specific value depending on the above preferable range of the ratio, but the refractive index difference (Tm−n2) is more preferably larger than differences between each of the local minimum values Ws1, Ws2, Ws3, Ws4 and each of the first local maximum values Wm2, Wm4. This makes it possible to suppress the transmission loss in the thickness direction of the optical waveguide 1. As a result, it is possible to provide the optical waveguide 1 having high transmission efficiency.

The refractive index difference (Tm−n2) is preferably equal to or larger than 100.5% of the differences between each of the local minimum values Ws1, Ws2, Ws3, Ws4 and each of the first local maximum values Wm2, Wm 4 of the horizontal refractive index distribution curve W, more preferably equal to or larger than 101%, and even more preferably equal to or larger than 102%. This makes it possible to suppress the transmission as necessary and sufficient.

In the vertical refractive index distribution curve T, the second sections T2 have a substantially constant refractive index. In particular, a variation rate of the refractive index in each of the second sections T2 is preferably equal to or less than 10%, and more preferably equal to or less than 5%.

The vertical refractive index distribution curve T may have an approximately convex portion protruding the upper side. Further, the vertical refractive index distribution curve T may has an approximately flat portion having a substantially constant refractive index at the vicinity of top portion of the convex portion (that is, the vicinity of the local maximum value Tm (the third local maximum value)). Even in a case where the vertical refractive index distribution curve T has the approximately flat portion, the optical waveguide of the present invention can provide the aforementioned functions and effects. The approximately flat portion having the substantially constant refractive index is defined by an area whose refractive index variation is smaller than 0.001 and refractive indexes of both sides of the area continuously decrease.

A length of the flat portion is not particular limited to a specific value, but preferably equal to or shorter than 100 μm, more preferably equal to or shorter than 20 μm, and even more preferably equal to or shorter than 10 μm.

(Support Film)

As shown in FIG. 1, a support film 2 may be laminated on a bottom surface of the optical waveguide 1 as necessary.

The support film 2 can protect and reinforce the optical waveguide 1 by supporting the bottom surface of the optical waveguide 1. This makes it possible to improve reliability and mechanical characteristic of the optical waveguide 1.

Examples of a constituent material of such a support film 2 include: various kinds of resin materials such as polylefin (e.g., polyethylene terephthalate (PET), polyethylene or polypropylene), polyimide and polyamide; and metal materials such as copper, aluminum and silver. In a case of using the metal materials, a metal foil is preferably used as the support film 2.

A thickness of the support film 2 is not particular limited to a specific value, but preferably in the range of 5 to 200 μm, and more preferably in the range of 10 to 100 μm. This makes it possible to allow the support film 2 to have appropriate rigidity. As a result, the support film 2 can reliably support the optical waveguide 1, and a flexibility deterioration of the optical waveguide 1 by the support film 2 become hardly to occur.

The support film 2 adheres or bonds to the optical waveguide 1. Examples of a adhering or bonding method include a thermally compression bonding method, an adhesion method using an adhesive agent or a pressure-sensitive adhesive agent and the like.

Examples of the adhesive agent include; an acryl-based adhesive agent, an urethane-based adhesive agent, a silicone-based bonding adhesive agent, various kinds of hot melt adhesive agents such as a polyester-based adhesive agent and a modified-olefin-based adhesive agent, and the like. Further, as an adhesive agent having superior high heat resistance, a thermoplastic polyimide adhesive agent such as polyimide, polyimide amide, polyimide amide ether, polyester imide, polyimide ether is preferably used. Since an adhesive agent layer constituted from the material has a relatively high flexibility, even if the optical waveguide 1 is deformed, the adhesive agent layer can be freely deformed depending on the deformation of the optical waveguide 1. As a result, it is possible to reliably prevent separation of the optical waveguide 1 which would occur due to the deformation thereof.

An average thickness of the adhesive layer is not particular limited to a specific value, preferably in the range of about 1 to 100 μm, and more preferably in the range of 5 to 60 μm.

(Cover Film)

On the other hand, as shown in FIG. 1, a cover film 3 may be laminated on a top surface of the optical waveguide 1 as necessary.

The cover film 3 can protect the optical waveguide 1 and support the optical waveguide 1 from the top surface of the optical waveguide 1. This makes it possible to protect the optical waveguide 1 from dirt and cracking, and thereby it is possible to improve the reliability and the mechanical characteristic of the optical waveguide 1.

A constituent material of such a cover film 3 may be the same constituent material as the constituent material of the support film 2. Examples of the constituent material of the cover film 3 include: various kinds of resin materials such as polylefin (e.g., polyethylene terephthalate (PET), polyethylene or polypropylene), polyimide and polyamide; and metal materials such as copper, aluminum and silver. In a case of using the metal materials, a metal foil is preferably used as the cover film 3. In a case where a mirror is formed in the middle of the optical waveguide 1, the constituent material of the cover film 3 is preferably substantially transparent because the light passes through the cover film 3.

An average thickness of the cover film 3 is not particularly limited to a specific value, but preferably in the range of 3 to 50 μm, and more preferably in the range of 5 to 30 μm. By setting the average thickness of the cover film 3 to fall within the above range, it is possible to allow the cover film 3 to have sufficiently-high optical transmittance and rigidity for reliably protecting the optical waveguide 1.

The cover film 3 adheres or bonds to the optical waveguide 1. Examples of a adhering or bonding method include a thermally compression bonding method, an adhesion method using a bonding adhesive agent or a pressure-sensitive adhesive agent, and the like.

While the optical waveguide 1 constituted by laminating the cladding layers 11, 12 and the core layer 13 is described as this embodiment, the optical waveguide 1 of the present invention may be constituted by integrally forming the cladding layers 11, 12 and the core layer 13.

(Second Embodiment)

Next, description will be given to a second embodiment of the optical waveguide according to the present invention.

Figure 5:
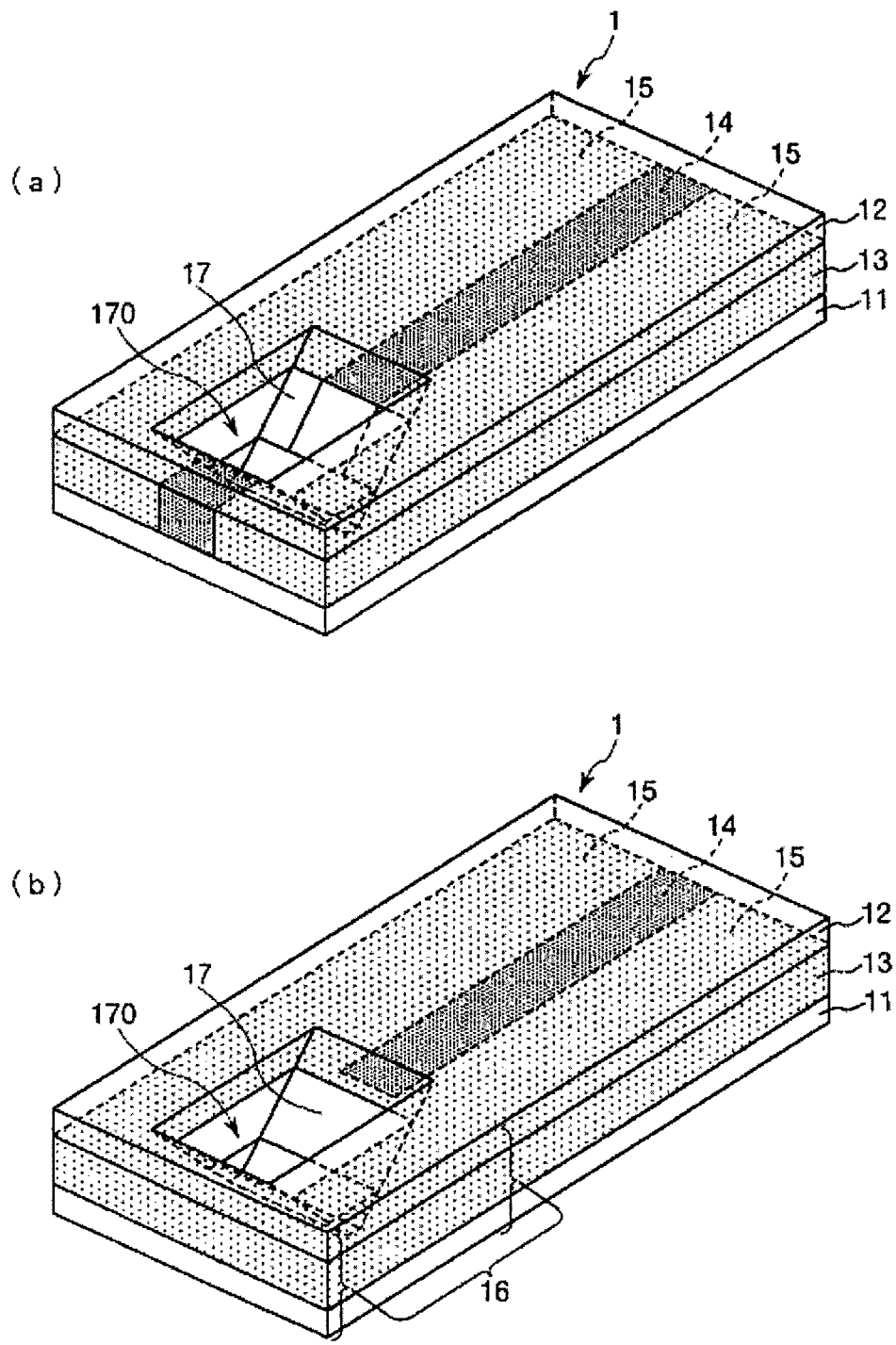
FIG. 5 is a perspective view showing a second embodiment of the optical waveguide according to the present invention (a part thereof is shown with transparency).

FIG. 5 is a perspective view showing the second embodiment of the optical waveguide according to the present invention (a part thereof is shown with transparency). In order to make the optical waveguide 1 more visible, a part of the core portion 14, the support film 2 and the cover film 3 are omitted in FIG. 5.

Hereinafter, the second embodiment of the optical waveguide will be described by placing emphasis on the points differing from the first embodiment of the light device, with the same matters omitted from description. In FIG. 5, the same components as the first embodiment are labeled with the same numerical number and omitted from the description.

The second embodiment of the optical waveguide has the same configuration as the first embodiment of the optical waveguide, except that the second embodiment of the optical waveguide has a mirror (reflection plane) 17 for changing a traveling direction of the light which propagates in the core portion 14.

A concave portion (hole) 170 having one side surface and another side surface forming a V-shape in cross section is formed (defined) in the optical waveguide 1 so as to partially pass through the optical waveguide 1 in the width direction. The mirror 17 is constituted of the one side surface (inner surface) of the concave portion 170. The one side surface of the concave portion 170 is flat and has a 45 degree angle with respect to an axis line of the core portion 14. By reflecting the light propagating in the core portion 14 at the mirror 17, it is possible to bend an optical pass (traveling direction) of the light by 90 degree angle toward the lower side of FIG. 5 (lower side of the optical waveguide 1). In contrast, by reflecting the light propagating from the lower side of FIG. 5 at the mirror 17, it is possible to introduce (incident) the light into the core portion 14. Namely, the mirror has a function as optical changing means for changing the optical pass of the light propagating in the core portion 14.

Worked surfaces of the cladding layers 11, 12 and the core layer 13 on the mirror 17 are exposed. The worked surface of the core portion 14 is positioned at an approximately center of the side surfaces of the mirror 17.

The mirror 17 may be formed so as to cover only the core portion 14, but it is preferred that the mirror 17 is formed so as to cover the cladding portions 11, 12, the core portion 14 and the side cladding portion 15 surrounding the core portion 14 as shown in FIG. 5a. This makes it possible to increase an effective area of the mirror 17 for reflecting the light. As a result, it is possible to suppress (reduce) mirror loss.

A reflective film may be formed on the mirror 17 (the worked surfaces constituting the mirror 17) as necessary. Examples of the reflective film include a metal film such as Au, Ag and Al, a film constituted of a material having a refractive index lower than the core portion 14, and the like.

Examples of a method for forming the reflective film on the mirror 17 include a physical vapor deposition method such as a vacuum vapor deposition method, a chemical vapor deposition such as a CVD, a plating method and the like.

On the other hand, another configuration example of the second embodiment is shown in FIG. 5b. In the optical waveguide 1 shown in FIG. 5b, the core portion 14 does not extend to one side end portion of the optical waveguide 1. Namely, there is an interval between the one end side portion of the optical waveguide 1 and one end portion of the core portion 14. Further, the side cladding portion 15 is provided in the interval. Hereinafter, the interval between the one end side portion of the optical waveguide 1 and the one end portion of the core portion 14 is referred to as a core portion defect area 16.

The mirror 17 is formed in the core portion defect area 16. The worked surfaces of the cladding layer 11, 12 and the core layer 13 are exposed on the mirror 17. Among them, only the worked surfaces of the side cladding portions 15 are exposed on the worked surface of the core layer 13. In other hand, both the worked surface of the core portion 14 and the worked surfaces of the side cladding portions 15 are exposed on the worked surface of the core layer 13 shown FIG. 5a.

In the mirror 17 shown in FIG. 5b, since the worked surface (exposed surface) of the core layer 13 is constituted of one material, the mirror has a uniform smoothness. This is because a degree of processing in a plane of the mirror 17 becomes uniformity by forming the worked surface by processing only one material. As a result, the mirror 17 can have a superior reflective property and it is possible to suppress (reduce) the mirror loss.

Since the core portion defect portion 16 (the mirror 17) is apart from the core portion 14, the core portion defect portion 16 (the mirror 17) has no density non-uniformity of reaction products derived from monomers. This makes it possible to suppress (reduce) non-uniformities of reflective property in the width direction as well as the thickness direction of the mirror 17, thereby allowing the mirror 17 to have especially superior reflective property.

<Method for Producing Optical Waveguide>

Next, description will be given to one example of methods for producing the optical waveguide 1.

(First Method for Producing)

At first, a first method for producing the optical waveguide 1 is described in detail.

Figure 8:
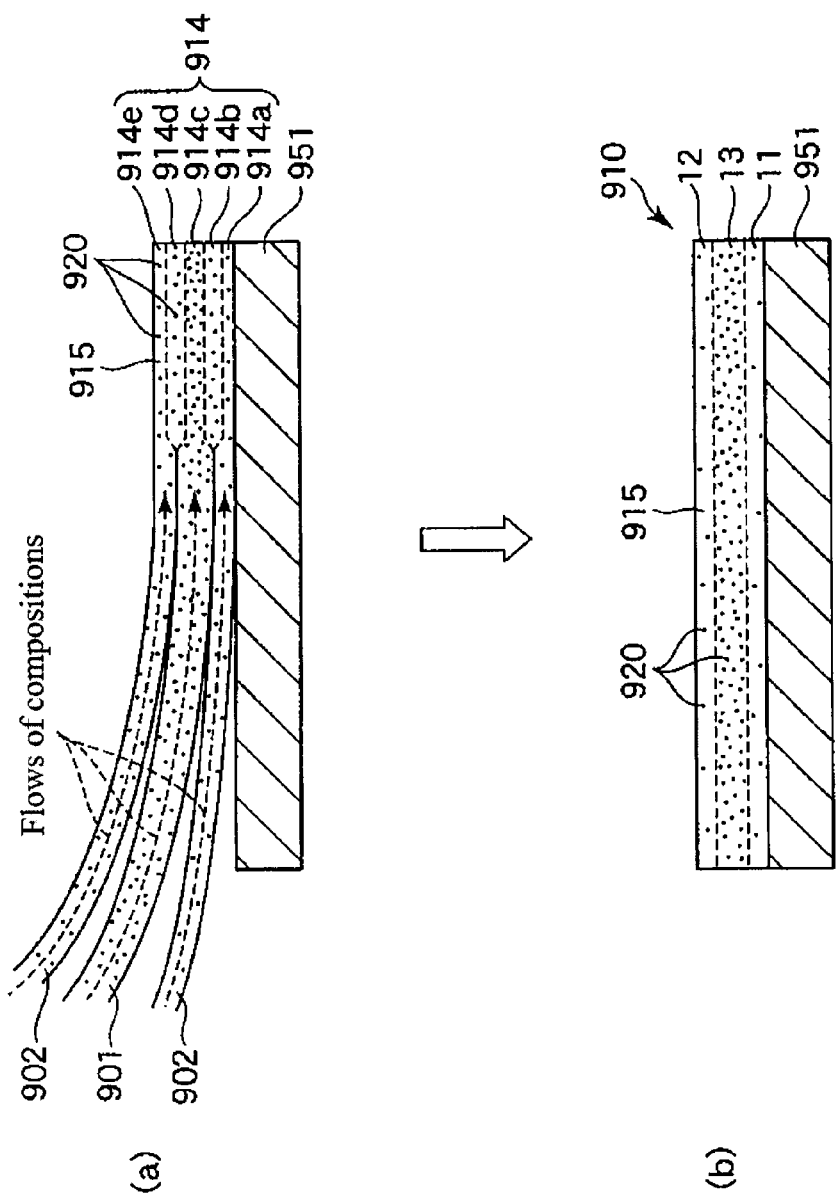
FIG. 8 is a drawing showing a process of a first method for producing the optical waveguide shown in FIG. 1.
Figure 9:
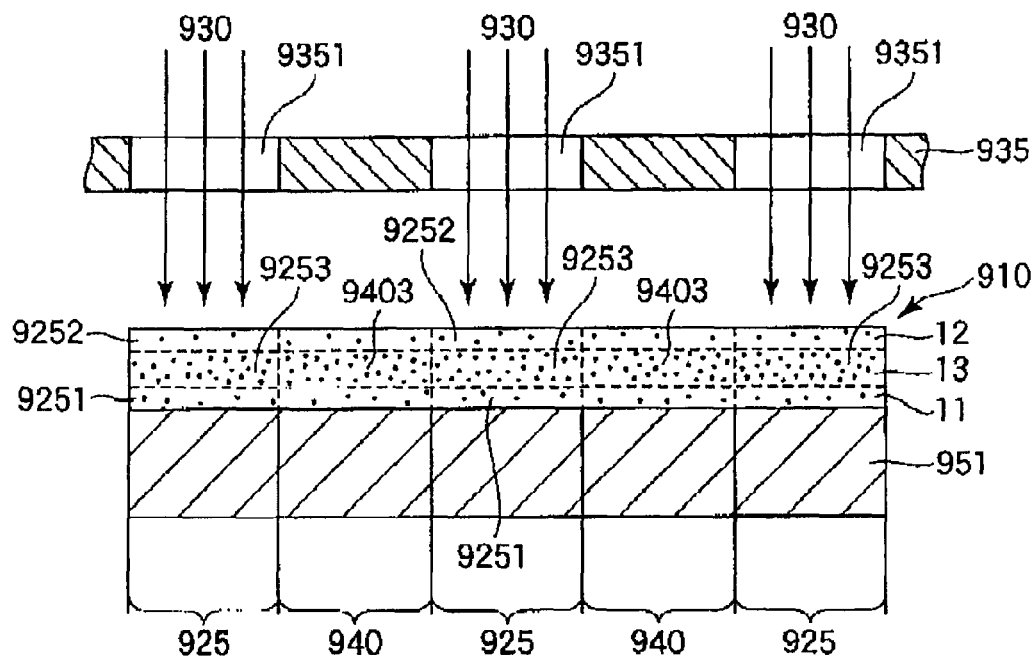
FIG. 9 is a drawing showing another process of the first method for producing the optical waveguide shown in FIG. 1.
Figure 10:
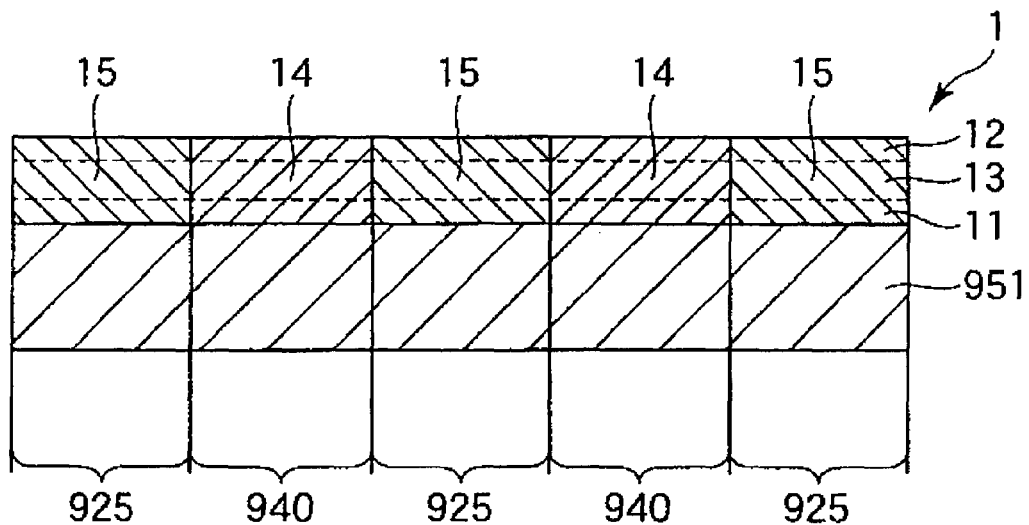
FIG. 10 is a drawing showing another process of the first method for producing the optical waveguide shown in FIG. 1.

Each of FIGS. 8 to 10 is drawing showing a process of a first method for producing the optical waveguide 1 shown in FIG. 1. In the following description, upper sides in FIGS. 8 to 10 are referred to as "upper" and lower sides in FIGS. 8 to 10 are referred to as "lower".

The first method for producing the optical waveguide 1 comprises the following two steps. [1] Obtaining a layer 910 by extruding and laminating two optical waveguide forming compositions 901, 902 (a first composition and a second composition) on a support substrate 951. Next, [2] obtaining the optical waveguide 1 by irradiating active radiation to a part of the layer 910 for generating a refractive index difference in the layer 910.

Hereinafter, the steps are described in series.

[1] First, the optical waveguide forming compositions 901, 902 are prepared.

Each of the optical waveguide forming compositions 901, 902 contains a polymer 915 and an additional agent 920 (in this embodiment, the additional agent 920 contains at least a monomer). However, components of the optical waveguide forming compositions 901, 902 are slightly different from each other.

Regarding the two compositions, the optical waveguide forming composition 901 is mainly used for forming the core layer 13. By irradiating the active radiation to the optical waveguide forming composition 901, at least active reactions between the monomers in the polymer 915 is proceeded. As a result, a change of the refractive index distribution is caused. In other words, the optical waveguide forming composition 901 is a composition being capable of forming the core portion 14 and the side cladding portions 15 in the core layer 13 by generating the refractive index difference due to a bias of content ratios of the polymer 915 and the monomer.

On the other hand, the optical waveguide forming composition 902 is mainly used for forming the cladding layers 11, 12. The optical waveguide forming composition 902 is constituted of a material having a refractive index lower than the optical waveguide forming composition 901.

A refractive index difference between the optical waveguide forming compositions 901, 902 can be appropriately adjusted by setting components of the polymer 915 and the monomer and the content ratios of the polymer 915 and the monomer.

For example, in a case where the monomer has a refractive index lower than the polymer 915, the content ratio of the monomer in the optical waveguide forming composition 902 is higher than the content ratio of the monomer in the optical waveguide forming composition 901. In contrast, in a case where the monomer has a refractive index higher than the polymer 915, the content ratio of the monomer in the optical waveguide forming composition 901 is higher than the content ratio of the monomer in the optical waveguide forming composition 902. In other words, according to the refractive indexes of the polymer 915 and the monomer, the components of the polymer 915 and the additional agent 920 in the optical waveguide forming compositions 901, 902 are appropriately selected.

The components of the optical waveguide forming composition 901, 902 is preferably set so that the content ratio of the monomer in the optical waveguide forming composition 901 is approximately equal to the content ratio of the monomer in the optical waveguide forming composition 902. By setting the components in this way, a difference between the content ratios of the monomers in the optical waveguide forming compositions 901, 902 becomes small. As a result, a diffusive movement of the monomers between the optical waveguide forming compositions 901, 902 caused by the difference between the content ratios of the monomers is suppressed. As described above, the diffusive movement of the monomers is useful for generating the refractive index difference, but there is a case where it is impossible to prevent the monomers from moving toward undesired directions. By using a multi-layered (multi-colored) extrusion molding method described later, it is possible to generate the refractive index difference in the thickness direction of the layer 910. Therefore, in a case of using the multi-layered extrusion molding method, it is permissible that at least the diffusive movement of the monomers in the thickness direction of the layer 910 is suppressed. However, it is preferable to suppress the undesirable diffusive movement of the monomers in the thickness direction of the layer 910. By suppressing the diffusive movement of the monomer toward the undesired directions, it is possible to reliably produce the optical waveguide 1 having the vertical refractive index distribution curve T to be finally produced.

In a case where the content ratio of the monomer in the optical waveguide forming composition 901 is set so as to be approximately equal to the content ratio of the monomer in the optical waveguide forming composition 902, it is possible to generate the refractive index difference by making a condition difference of the polymer 915 or the monomer between the optical waveguide forming compositions 901, 902. In particular, it is possible to generate the refractive index difference by using different components between the polymers 915 in the optical waveguide forming compositions 901, 902. Even in a case where the components of the polymers 915 in the optical waveguide forming compositions 901, 902 are identical to each other, it is possible to generate the refractive index difference by making a molecular weight difference or a polymerization degree difference between the polymers 915 in the optical waveguide forming compositions 901, 902. Further, it is possible to generate the refractive index difference by making a component difference between the monomers in the optical waveguide forming compositions 901, 902. By doing in this way, it is possible to set the content ratios of the monomer in the optical waveguide forming compositions 901, 902 to be approximately equal. As a result, it is possible to generate the refractive index difference between the optical waveguide forming compositions 901, 902 together with suppressing the diffusive movement of the monomer.

Next, the optical waveguide forming compositions 901, 902 are laminated on the support substrate 951 by the multi-layer extrusion molding method.

In the multi-layer extrusion molding method, the optical waveguide forming composition 901 is extruded in the form of one layer and the optical waveguide forming compositions 902 are simultaneously extruded on an upper side and a lower side of the layer of the optical waveguide forming composition 901. As a result, a multi-layered compact 914 constituted of three laminated layers is formed in one step. In this step, the optical waveguide forming compositions 901, 902 are slightly mixed with each other at boundary planes between the optical waveguide forming compositions 901, 902 in the multi-layered compact 914 because the optical waveguide forming composition 902 laminated on the upper side of the optical waveguide forming composition 901, the optical waveguide forming composition 901 and the optical waveguide forming composition 902 laminated on the lower side of the optical waveguide forming composition 901 are extruded in this order. Therefore, in the vicinities of the boundary planes between the compositions, there are regions where a content ratio of the optical waveguide forming compositions 901, 902 continuously varies along with the thickness direction thereof because parts of the optical waveguide forming compositions 901, 902 are mixed with each other at the boundary planes. Thus, the multi-layered compact 914 shown in FIG. 8a has a first molding layer 914a constituted of the optical waveguide forming composition 902, a second molding layer 914b constituted of a mixture of the optical waveguide forming compositions 901, 902, a third molding layer 914c constituted of the optical waveguide forming composition 901, a forth molding layer 914d constituted of the mixture of the optical waveguide forming compositions 901, 902, and a fifth molding layer 914e constituted of the optical waveguide forming composition 902, which are laminated from the lower side of FIG. 8a in this order.

Next, the layer 910 is obtained by vaporing (desolvating) a solvent contained in the multi-layered compact 914 (see FIG. 8b).

The obtained layer 910 has the cladding layer 11 constituted of the first molding layer 914a, the core layer 13 constituted of the second molding layer 914b, the third molding layer 914c and the forth molding layer 914d and the cladding layer 12 constituted of the fifth layer 914e. These layers are laminated from the lower side of FIG. 8b in this order.

The polymer (matrix) 915 is substantially uniformity and randomly contained in the obtained layer 910. The additional agent 920 is approximately uniformity and randomly dispersed in the polymer 915. Namely, the additional agent 920 is approximately uniformity and randomly dispersed in the layer 910.

An average thickness of the layer 910 is appropriately set depending on the thickness of the optical waveguide 1 to be formed. The average thickness of the layer 910 is not particularly limited to a specific value, but preferably in the range of about 10 to 500 µm, and more preferably in the range of about 20 to 300 µm.

As the support substrate 951, for example, a silicon substrate, a silicon dioxide substrate, a glass substrate, polyethylene terephthalate (PET) film or the like can be used.

The multi-layered compact 914 used for obtaining the layer 910 can be prepared by using a die coater (multi-layer extrusion molding apparatus) 800 described in the follows.

Figure 6:
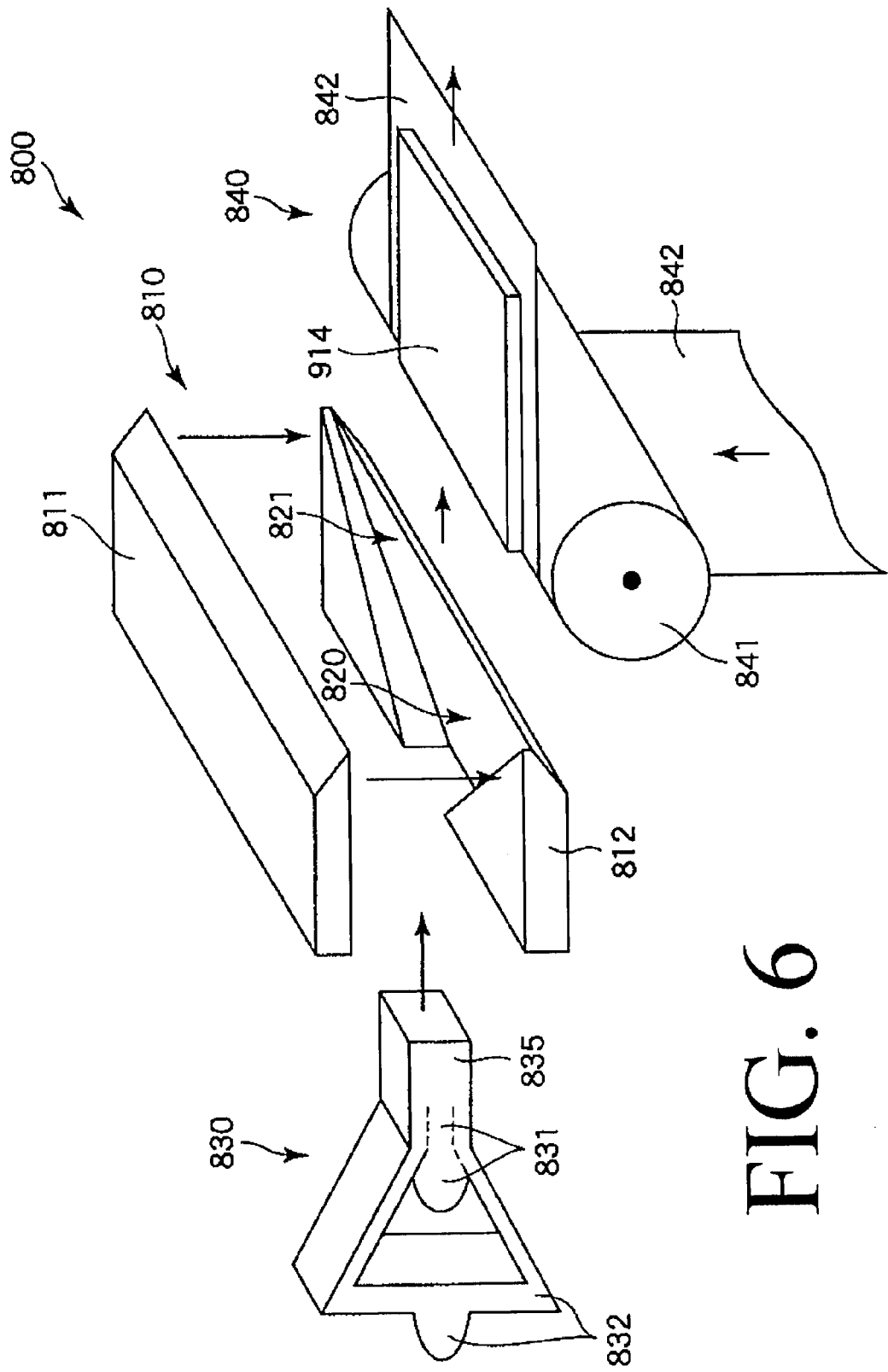
FIG. 6 is a perspective view showing a die coater for preparing a multi-layered compact.
Figure 7:
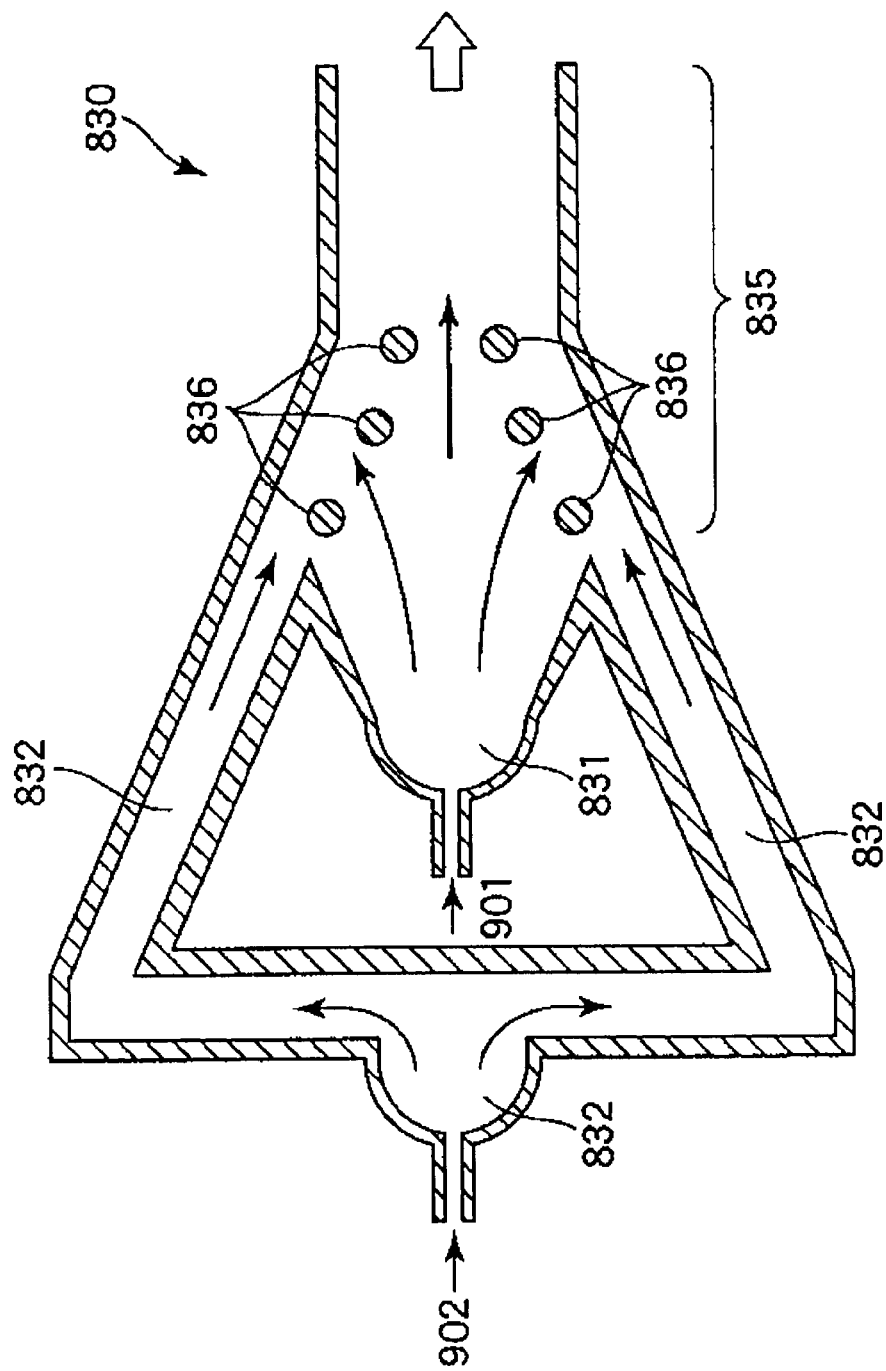
FIG. 7 is a vertical cross-sectional view showing a part of the die coater in enlarged scale.

FIG. 6 is a perspective view showing the die coater for preparing the multi-layered compact 914. FIG. 7 is a vertical cross-sectional view showing a part of the die coater in enlarged scale.

The die coater 800 has a die head 810 constituted of an upper lip 811 and a lower lip 812 provided below the upper lip 811 as shown in FIG. 6.

Each of the upper lip 811 and the lower lip 812 is constituted of an elongated block. The upper lip 811 and the lower lip 812 are configured to engage with each other. In a matching face between the upper lip 812 and the lower lip 812, a manifold 820 having a cavity is defined (formed). A width of the manifold 820 continuously increases toward a right-side end portion of the die head 810. On the other hand, a thickness of the manifold 820 continuously decreases toward the right-side end portion of the die head 810. The width of the manifold 820 (a width of the cavity) reaches a maximum value at the right-side end portion of the manifold 820. On the other hand, the thickness of the manifold 820 (a thickness of the cavity) reached a minimum value at the right-side end portion of the manifold 820. A slit 821 is defined at the right-side end portion of the manifold 820.

The die head 810 can extrude the optical waveguide forming compositions 901, 902, which are supplied from a left-side end portion of the manifold 820, toward the right side of the manifold 820 through the slit 821 with molding the optical waveguide forming compositions 901, 902. Therefore, a width and a thickness of the multi-layered compact 914 are set depending on a shape (thickness and width) of the slit 821.

A mixing unit 830 is provided at a left side of the die head 810. The mixing unit 830 is constituted by combining two feed pipes for supplying the optical waveguide forming compositions 901, 902 to the die head 810. One of the feed pipes is a first feed pipe 831 for supplying the optical waveguide forming composition 901 to the die head 810. The other of the feed pipes is a second feed pipe 832 for supplying the optical waveguide forming composition 902 to the die head 810.

The optical waveguide forming composition 901 supplied from the first feed pipe 831 is contacted with the optical waveguide forming composition 902 supplied from the second feed pipe 832 at a connecting portion 835 for connecting the mixing unit 830 with the die head 810 and then the optical waveguide forming compositions 901, 902 are supplied to the manifold 820. The second feed pipe 832 branches into an upper line and a lower line. The upper line and the lower line are respectively connected with an upper portion and a lower portion of the connecting portion 835. On the other hand, the first feed pipe 831 is connected with a middle portion of the connecting portion 835. Namely, a middle flow of the optical waveguide forming composition 901 is combined with two flows of the optical waveguide forming composition 902 at the connecting portion 835 so as to hold the middle flow between the two flows.

As shown in FIG. 7, the mixing unit 830 has a plurality of pins 836 provided on a meeting point of the first feed pipe 831 and the second feed pipes 832. Each of the pins 836 has an elongated cylindrical shape. Each of longitudinal axes of the pins 836 is perpendicular to extension directions of the first feed pipe 831 and the second feed pipe 832. In FIG. 7, three of the pins 836 are provided between the upper portion and the middle portion of the connecting portion 835. The other three of the pins 836 are provided between the middle portion and the lower portion of the connecting portion 835. The number of the pins 836 is not particularly limited to a specific value, but preferably two or more, and more preferably in the range of 3 to 10. A configuration such as the pin 836 is not particularly limited, as long as it can generate turbulent flows between the optical waveguide forming compositions 901, 902. For example, other configuration such as a mesh or a panting metal can be used instead of the pins 836.

A conveying unit 840 for conveying the extruded multi-layered compact 914 is provided at the right side of the die head 810. The conveying unit 840 has a roller 841 and a conveying film 842 which is moved ahead by rolling of the roller 841. While the conveying film 842 is moved from the lower side toward the right side of FIG. 6 by the rolling of the roller 841, the multi-layered compact 914 is putted on the conveying film 842 at a position where the roller 841 is fixed. This makes it possible to convey the multi-layered compact 914 to the right side of FIG. 6 with keeping a shape of the multi-layered compact 914.

Next, an operation of the die coater 800 is described in detail. When the optical waveguide forming components 901, 902 are simultaneously supplied into the mixing unit 830, three layer flows are generated in the connecting portion 835. In this time (when the optical waveguide forming components 901, 902 are combined in the connecting portion 835), the flows of the optical waveguide forming components 901, 902 are turbulent by the plurality of the pins 836 provided on the meeting point of the first feed pipe 831 and the second feed pipes 832. By this turbulent of the flows, the boundary planes between the layers becomes unclear. As a result, mixed regions constituted of the mixture of the optical waveguide compositions 901, 902 are made at the vicinities of the boundary planes.

The layer flows generated as the above manner are elongated in the width direction of the manifold 820 of the die head 810 and compressed in the thickness direction of the manifold 820 of the die head 810 as flowing. As a result, the multi-layered compact 914 is formed by laminating the first molding layer 914*a*, the second molding layer 914*b*, the third molding layer 914*c*, the fourth molding layer 914*d* and the fifth molding layer 914*e*, which are laminated from the lower side in this order. By using such a multi-layered compact 914, it is possible to finally obtain the optical waveguide 1 having the vertical refractive index distribution T in the thickness direction of the optical waveguide 1.

Then, the multi-layered compact 914 is provided on the conveying film 842. The convey film 842 may be used as the support substrate 951 just as it is.

As described above, the die coater 800 shown in FIG. 6 can produce the layer 910 containing one core layer 13. In a case of producing the layer 910 containing a plurality of the core layers 13, it is possible to obtain the layer 910 by changing a configuration of the mixing unit 830 depending on the number of the core layers 13. In particular, it is possible to obtain the layer 910 by branching the first feed pipe 831 and the second feed pipe 832 depending on the number of core layers 13 and providing the branched second feed pipes 832 so as to hold each of the layers constituted of the optical waveguide forming composition 901, which are supplied from the branched first feed pipes 831, between the layers constituted of the optical waveguide forming composition 902 supplied from the branched second feed pipes 832.

By irradiating the active radiation 930 to the layer 910 containing the plurality of the core layer 13, it is possible to form a plurality of the core portions 14 and the side cladding portions 15 in the plurality of the core layers 13 in one time and one irradiating. In this case, it is possible to produce the optical waveguide 1 having the plurality of the core layers 13 with fewer steps. Further, position gaps of the core portions 14 between the plurality of the core layers 13 are hardly to occur. As a result, it is possible to produce the optical waveguide 1 having especially superior dimension accuracy. Such an optical waveguide 1 can provide especially high efficient of light coupling when the optical waveguide 1 is connected with the light receiving element.

The multi-layer extrusion molding method and the die coater are one example of the method and the apparatus for producing the multi-layered compact 914. For example, variety of method (apparatus) such as an injection molding method (apparatus), a coating method (apparatus) or a printing method (apparatus) can be used, as long as it can mix the compositions at the vicinities of the boundary planes between the layers.

Nest, the polymer 915 and the additional agent 920 are described in detail.

(Polymer)

The polymer 915 is used as a base polymer of the optical waveguide 1.

As the polymer 915, it is preferable to use a composition having sufficiently-high transparency (being colorless and transparent) and compatibility with the after-mentioned monomer. Among them, it is more preferable to use the composition in which the monomer can be reacted (polymerized or cross-linked), and which has sufficiently-high transparency even after the monomer are polymerized.

In this regard, the expression "having compatibility" means that the monomer can be at least blended with the polymer 915 so as to cause no phase separation between the monomer and the polymer 915 in the optical waveguide forming materials 901, 902 and the layer 910.

Examples of such a polymer 915 include a cyclic olefin-based resin such as a benzocyclobutene-based resin or a norbornene-based resin, an acryl-based resin, a methacryl-based resin, polycarbonate, polystyrene, an epoxy-based resin, polyimide, polybenzoxazole, a silicone-based resin, a fluoro-based resin, and the like. These resins can be singly used or be used in combination of two or more of them (e.g., a polymer alloy, a polymer blend or a copolymer).

Among them, it is especially preferable to use a polymer 915 containing the cyclic olefin-based resin as a major component thereof. By using such a polymer 915, it is possible to obtain the optical waveguide 1 having superior optical transmission property and superior heat resistance.

Hydrogen atom(s) of the cyclic olefin-based resin may be not substituted or substituted with another group(s).

Examples of the cyclic olefin-based resin include a norbornene-based resin, a benzocyclobutene-based resin and the like.

Among them, it is preferable to use the norbornene-based resin. This is because the norbornene-based resin has superior heat resistance, high transparence and the like. Further, since the norbornene-based resin has high hydrophobicity, it is possible to obtain the optical waveguide 1 in which dimensional change or the like is hardly to occur due to water absorption thereof.

Further, the norbornene-based polymer may be either a homopolymer including a single repeating unit or a copolymer including two or more kinds of repeating units.

Examples of such a norbornene-based polymer include: addition-type polymers such as:

(1) an addition-type (co)polymer obtained by addition (co) polymerizing a norbornene-based monomer;

(2) an addition-type copolymer obtained by addition copolymerizing a norbornene-based monomer and ethylene or α-olefin;

(3) an addition-type copolymer obtained by addition copolymerizing a norbornene-based monomer and non-conjugated diene, if needed, another monomer; and (4) a ring opening-type norbornene-based (co)polymer, or a resin obtained by optionally hydrogenating it;

(5) a ring opening-type norbornene-based copolymer obtained by ring opening copolymerizing a norbornene-based monomer and ethylene or α-olefin, or a resin obtained by optionally hydrogenating it; and (6) a ring opening-type norbornene-based copolymer obtained by ring opening copolymerizing a norbornene-based monomer and non-conjugated diene or another monomer, or a resin obtained by optionally hydrogenating it. In this regard, examples of these copolymers include a random copolymer, a block copolymer, an alternating copolymer and the like.

These norbornene-based polymers can be obtained by using various kinds of well-known polymerizations such as ring opening metathesis polymerization (ROMP), a combination of ROMP and hydrogenation, polymerization via radicals or cations, polymerization using a cationic palladium polymerization initiator and polymerization using another polymerization initiator (e.g., a nickel polymerization initiator or another transition metal polymerization initiator).

Among them, it is preferable to use a norbornene-based polymer including at least one repeating unit represented by the following formula 1 (structural formula "B"), that is, the addition-type norbornene-based (co)polymer. This is because the norbornene-based (co)polymer has advantages in transparency, heat resistance and flexibility. Therefore, for example, in a case where an electrical component and the like are mounted on the obtained optical waveguide 1 through a solder, the optical waveguide 1 can have high heat resistance, that is, anti-reflow property.

[Formula 1]

B

Such a norbornene-based polymer can be appropriately synthesized using a norbornene-based monomer which will be described (e.g., a norbornene-based monomer represented by the below described structural formula "C" or a cross-linkable norbornene-based monomer).

When the optical waveguide 1 is embedded in various products, there is a case where the product is used at a temperature of about 80° C. Therefore, such an addition-type (co)polymer is preferably used from a viewpoint of ensuring the heat resistance.

Among them, it is preferable to use a norbornene-based polymer including a norbornene repeating unit having a substituent group containing a polymerizable group or a norbornene repeating unit having a substituent group containing a aryl group.

As the norbornene repeating unit having the substituent group containing the polymerizable group, preferable is at least one of a norbornene repeating unit having a substituent group containing an epoxy group, a norbornene repeating unit having a substituent group containing a (meth)acryl group and a norbornene repeating unit having a substituent group containing a alkoxysilyl group. This is because these polymerizable groups have high reactivity among various kinds of polymerizable groups.

Further, by using a norbornene-based polymer including two or more kinds of such norbornene repeating units each having the substituent group containing the polymerizable group, it is possible to improve both the flexibility and the heat resistance of the optical waveguide 1.

On the other hand, since the norbornene-based polymer including the norbornene repeating unit having the substituent group containing the aryl group has especially high hydrophobicity deriving from the aryl group, use of such a norbornene-based polymer makes it possible to more reliably prevent dimensional change of the optical waveguide 1 or the like from occurring.

Further, a norbornene-based polymer including an alkyl norbornene repeating unit is preferably used. In this regard, the alkyl group may be either a linear type or a branched type.

The norbornene-based polymer including the alkyl norbornene repeating unit can have high flexibility. Therefore, use of such a norbornene-based polymer makes it possible to impart high flexibility to the optical waveguide 1.

Further, since such a norbornene-based polymer has excellent transmittance for a light having a specific wavelength (especially, near 850 nm), it is also preferably used.

Concrete examples of the above norbornene-based polymer including the norbornene repeating unit include a homopolymer of a hexyl norbornene, a homopolymer of a phenyl ethyl norbornene, a homopolymer of a benzyl norbornene, a copolymer of a hexyl norbornene and a phenyl ethyl norbornene, a copolymer of a hexyl norbornene and a benzyl norbornene, and the like.

For these reasons, as the norbornene-based polymer, it is preferable to use polymers represented by the following formulas (1) to (4) and (8) to (10).

[Formula 2]

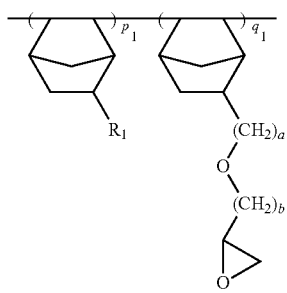

(1)

wherein $R_1$ is an alkyl group having a carbon number of 1 to 10, "a" is an integer of 0 to 3, "b" is an integer of 1 to 3, and "$p_1$"/"$q_1$" is 20 or less.

The norbornene-based resin including the repeating unit represented by the formula (1) can be produced as follows.

Norbornene including R1 and norbornene including an epoxy group at a side chain thereof are dissolved into toluene, and then they are solution polymerized using a Ni compound (A) as a catalyst, to thereby obtain the norbornene-based resin represented by the formula (1).

[Formula 3]

(A)

In this regard, the norbornene including the epoxy group at the side chain thereof can be produced, for example, through the steps (i) and (ii).

(i) Synthesis of norbornene methanol (NB—$CH_2$—OH)

Cyclopentadiene (CPD) generated by cracking dicyclopentadiene (DCPD) and α-olefin ($CH_2$=CH—$CH_2$—OH) are reacted with each other under high temperature and pressure.

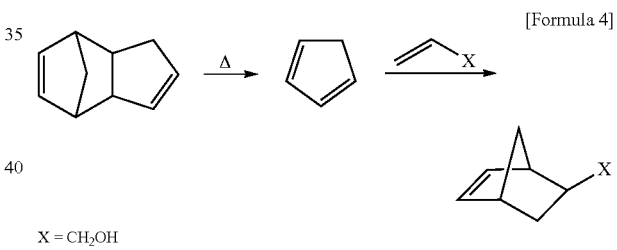

[Formula 4]

X = $CH_2OH$ (ii) Synthesis of epoxynorbornene

Norbornene methanol and epichlorohydrin are reacted with each other, to thereby obtain the epoxynorbornene.

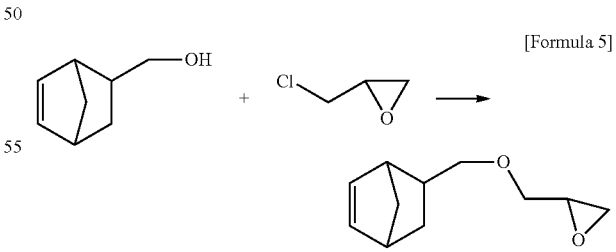

[Formula 5]

In this regard, in the case where "b" is 2 or 3 in the formula (1), a compound in which the methylene group of the epichlorohydrin is change to an ethylene group or a propylene group is used.

Among the norbornene-based resins each represented by the above formula (1), preferable is a norbornene-based polymer represented by the above formula (1) in which R1 is an alkyl group having a carbon number of 4 to 10 and each of "a" and "b" is 1 such as a copolymer of butyl norbornene and methyl glycidyl ether norbornene, a copolymer of hexyl norbornene and methyl glycidyl ether norbornene, or a copolymer of decyl norbornene and methyl glycidyl ether norbornene. This is because use of such resins makes it possible to improve both the flexibility and the heat resistance of the optical waveguide 1.

[Formula 6]

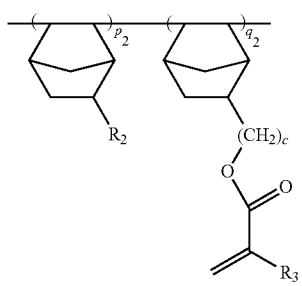

(2)

wherein $R_2$ is an alkyl group having a carbon number of 1 to 10, $R_3$ is a hydrogen atom or a methyl group, "c" is an integer of 0 to 3, and "$p_2$"/"$q_2$" is 20 or less.

The norbornene-based resin including the repeating unit represented by the formula (2) can be produced by dissolving norbornene including R2 and norbornene including an acryl group and a methacryl group at a side chain thereof into toluene, and then solution polymerizing them using the above Ni compound (A) as a catalyst.

Among the norbornene-based resins represented by the above formula (2), it is preferable to use a norbornene-based polymer represented by the above formula (2) in which $R_2$ is an alkyl group having a carbon number of 4 to 10 and "c" is 1 such as a copolymer of butyl norbornene and 2-(5-norbornenyl) methyl acrylate, a copolymer of hexyl norbornene and 2-(5-norbornenyl) methyl acrylate, a copolymer of decyl norbornene and 2-(5-norbornenyl) methyl acrylate. This is because use of such resins makes it possible to improve both the flexibility and the heat resistance of the optical waveguide 1.

[Formula 7]

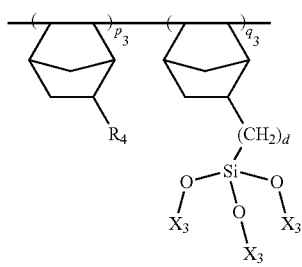

(3)

wherein $R_4$ is an alkyl group having a carbon number of 1 to 10, each $X_3$ is independently an alkyl group having a carbon number of 1 to 3, "d" is an integer of 0 to 3, and "$p_3$"/"$q_3$" is 20 or less.

The norbornene-based resin including the repeating unit represented by the formula (3) can be produced by dissolving norbornene including $R_4$ and norbornene including an alkoxy silyl group at a side chain thereof into toluene, and then solution polymerizing them using the above Ni compound (A) as a catalyst.

Among the norbornene-based resins each represented by the above formula (3), it is preferable to use a norbornene-based resin represented by the above formula (3) in which $R_4$ is an alkyl group having a carbon number of 4 to 10, "d" is 1 or 2 and $X_3$ is a methyl group or an ethyl group such as a copolymer of butyl norbornene and norbornenyl ethyl trimethoxysilane, a copolymer of hexyl norbornene and norbornenyl ethyl trimethoxysilane, a copolymer of decyl norbornene and norbornenyl ethyl trimethoxysilane, a copolymer of butyl norbornene and triethoxysilyl norbornene, a copolymer of hexyl norbornene and triethoxysilyl norbornene, a copolymer of decyl norbornene and triethoxysilyl norbornene, a copolymer of butyl norbornene and trimethoxysilyl norbornene, a copolymer of hexyl norbornene and trimethoxysilyl norbornene, a copolymer of decyl norbornene and trimethoxysilyl norbornene.

[Formula 8]

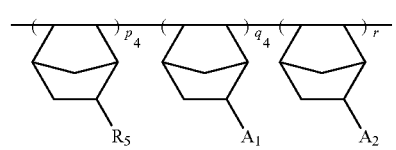

(4)

wherein $R_5$ is an alkyl group having a carbon number of 1 to 10, each of $A_1$ and $A_2$ is independently a group represented by the following formula (5), (6) or (7) but is the same substituent group at the same time, and "$p_4$"/("$q_4$"+"r") is 20 or less.

The norbornene-based resin including the repeating unit represented by the formula (4) can be produced by dissolving norbornene including $R_5$ and norbornene including $A_1$ and $A_2$ at a side chain thereof into toluene, and then solution polymerizing them using the above Ni compound (A) as a catalyst.

(5)

[Formula 9]

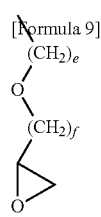

wherein "e" is an integer of 0 to 3, and "f" is an integer of 1 to 3.

[Formula 10]

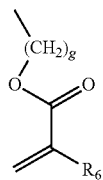

(6)

wherein $R_6$ is a hydrogen atom or a methyl group, and "g" is an integer of 0 to 3.

[Formula 11]

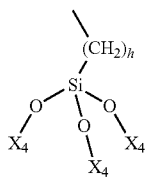

(7)

wherein each $X_4$ is independently an alkyl group having a carbon number of 1 to 3, and "h" is an integer of 0 to 3.

Examples of the norbornene-based resins each represented by the above formula (4) include: a terpolymer of any one of butyl norbornene, hexyl norbornene and decyl norbornene, 2-(5-norbornenyl) methyl acrylate, and any one of norbornenyl ethyl trimethoxysilane, the triethoxysilyl norbornene and trimethoxysilyl norbornene; a terpolymer of any one of butyl norbornene, hexyl norbornene and decyl norbornene, 2-(5-norbornenyl) methyl acrylate, and methyl glycidyl ether norbornene; a terpolymer of any one of butyl norbornene, hexyl norbornene and decyl norbornene, methyl glycidyl ether norbornene and any one of norbornenyl ethyl trimethoxysilane, triethoxysilyl norbornene and trimethoxysilyl norbornene; and the like.

[Formula 12]

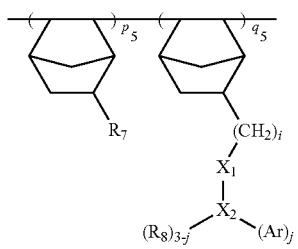

(8)

wherein $R_7$ is an alkyl group having a carbon number of 1 to 10, $R_8$ is an oxygen atom, a methyl group or an ethyl group, Ar is an aryl group, $X_1$ is a hydrogen atom or a methyl group, $X_2$ is a carbon atom or a silicon atom, "i" is an integer of 0 to 3, "j" is an integer of 1 to 3, and "$p_5$"/"$q_5$" is 20 or less.

The norbornene-based resin including the repeating unit represented by the formula (8) can be produced by dissolving norbornene including $R_7$ and norbornene including —$(CH_2)$i-$X_1$—$X_2(R_8)_{3-j}(Ar)_j$ at a side chain thereof into toluene, and then solution polymerizing them using the above Ni compound (A) as a catalyst.

Among the norbornene-based resins each represented by the above formula (8), it is preferable to use a norbornene-based resin represented by the above formula (8) in which $X_1$ is the oxygen atom, $X_2$ is the silicon atom, and Ar is a phenyl group.

From the viewpoints of controlling the flexibility, the heat resistance and the refractive index, it is more preferable to use a norbornene-based resin represented by the above formula (8) in which $R_7$ is an alkyl group having a carbon number of 4 to 10, $X_1$ is the oxygen atom, $X_2$ is the silicon atom, Ar is the phenyl group, $R_8$ is the methyl group, "i" is 1, and "j" is 2 such as a copolymer of butyl norbornene and diphenyl methyl norbornene methoxysilane, a copolymer of hexyl norbornene and diphenyl methyl norbornene methoxysilane, or a copolymer of decyl norbornene and diphenyl methyl norbornene methoxysilane.

In particular, the following norbornene-based resin is preferable to use.

[Formula 13]

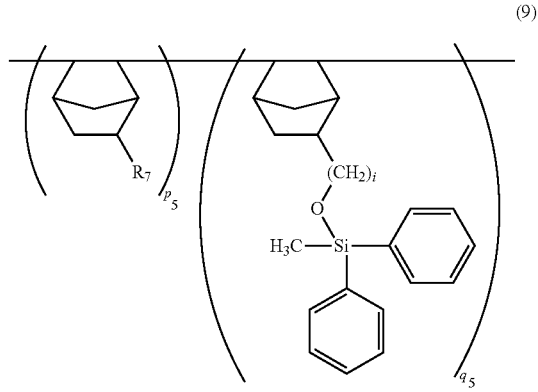

(9)

wherein $R_7$, "$p_5$", "$q_5$" and "i" of the formula (9) are the same as those of the formula (8).

Further, from the viewpoints of controlling the flexibility, the heat resistance and the refractive index, it may be used that a norbornene-based resin represented by the above formula (8) in which $R_7$ is an alkyl group having a carbon number of 4 to 10, $X_1$ is the methylene group, $X_2$ is the carbon atom, Ar is the phenyl group, $R_8$ is the hydrogen atom, "i" is 0, and "j" is 1 such as a copolymer of butyl norbornene and phenyl ethyl norbornene, a copolymer of hexyl norbornene and phenyl ethyl norbornene, or a copolymer of decyl norbornene and phenyl ethyl norbornene methoxysilane.

Furthermore, as the norbornene-based resin, the following resin may be used.

[Formula 14]

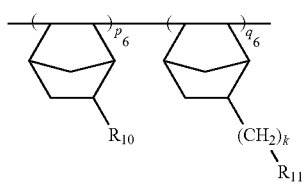

(10)

wherein $R_{10}$, is an alkyl group having a carbon number of 1 to 10, $R_{11}$ is an aryl group, "k" is an integer of 0 to 4, and "$p_6$"/"$q_6$" is 20 or less.

Further, "$p_1$"/"$q_1$" to "$p_3$"/"$q_3$", "$p_5$"/"$q_5$", "$p_6$"/"$q_6$" or "$p_4$"/("$q_4$"+"r") is 20 or less, but is preferably 15 or less, and more preferably in the range of 0.1 to 10. This makes it possible to fully exhibit the effects to be obtained by containing various kinds of norbornene repeating units.

On the other hand, as described above, the polymer 915 may be the acryl-based resin, the methacryl-based resin, the epoxy-based resin, the polyimide, the silicone-based resin, the fluoro-based resin, the polysilane, the polyurethane or the like.

Among them, examples of the acryl-based resin or the methacryl-based resin include poly(methyl acrylate), poly(methyl methacrylate), poly(epoxy acrylate), poly(epoxy methacrylate), poly(amino acrylate), poly(amino methacrylate), polyacrylic acid, polymethacrylic acid, poly(isocyanate acrylate), poly(isocyanate methacrylate), poly(cyanate acrylate), poly(cyanate methacrylate), poly(thioepoxy acrylate), poly(thioepoxy methacrylate), poly(allyl acrylate), poly(allyl methacrylate), an acrylate-epoxy acrylate copolymer (e.g., a copolymer of methyl methacrylate and glycidyl methacrylate), a styrene-epoxy acrylate copolymer, and the like. As the acryl-based resin or the methacryl-based resin, one of these resins or a composite material containing two or more of these resins can be used.

Further, examples of the epoxy resin include an alicyclic epoxy resin, a bisphenol A-type epoxy resin, a bisphenol F-type epoxy resin, a bisphenol S-type epoxy resin, a biphenyl-type epoxy resin containing a biphenyl chemical structure, a naphthalene chemical structure-containing epoxy resin, a dicyclopentadiene-type epoxy resin containing a dicyclopentadiene chemical structure, a phenol novolac-type epoxy resin, a cresol novolac-type epoxy resin, a triphenyl methane-type epoxy resin, a triphenyl methane-type epoxy resin, an aliphatic epoxy resin, triglycidyl isocyanurate and the like. As the epoxy resin, one of these resins or a composite material containing two or more of these resins can be used.

Furthermore, the polyimide is not limited to a specific kind, as long as it is a resin obtained by curing (imidizing) a polyamide acid which is a polyimide resin precursor through ring-closing reaction thereof.

Furthermore, for example, the polyamide acid can be obtained as a solution state by reacting tetracarboxylic acid dianhydrate with diamine at an equal molar ratio in N,N-dimethyl acetamide.

Examples of the tetracarboxylic acid dianhydrate include pyromellitic acid dianhydrate, 3,3',4,4'-biphenyl tetracarboxylic acid dianhydrate, 2,2-bis(2,3-dicarboxy phenyl)-1,1,1,3,3,3-hexafluoropropane dianhydrate, 2,2-bis(3,4-dicarboxy phenyl)-1,1,1,3,3,3-hexafluoropropane dianhydrate, 3,3',4,4'-benzophenone tetracarboxylic acid dianhydrate, bis(3,4-dicarboxy phenyl)ether dianhydrate, bis(3,4-dicarboxy phenyl) sulfonic acid dianhydrate, and the like.

On the other hand, examples of the diamine include m-phenyl diamine, p-phenyl diamine, 3,4'-diaminodiphenyl ether, 4,4'-diaminodiphenyl ether, 4,4'-diaminodiphenyl sulfone, 3,3'-diaminodiphenyl sulfone, 2,2-bis(4-aminophenoxyphenyl)propane, 2,2-bis(4-aminophenoxyphenyl)hexafluoropropane, 1,3-bis(4-aminophenoxy)benzene, 1,4-bis(4-aminophenoxy)benzene, 2,4-diaminotoluene, 2,6-diaminotoluene, diaminodiphenyl methane, 4,4'-diamino-2,2-dimethyl biphenyl, 2,2-bis(trifluoromethyl)-4,4'-diaminobiphenyl, and the like.

Further, examples of the silicone-based resin include a silicone rubber, a silicone elastomer and the like. These silicone-based resins can be obtained by reacting a silicone rubber monomer or a silicone oligomer with a curing agent.

Examples of the silicone rubber monomer or oligomer include a monomer or oligomer containing a methyl siloxane group, an ethyl siloxane group or a phenyl siloxane group.

As the silicone rubber monomer or oligomer, a monomer or oligomer, in which a functional group capable of photo-reacting such an epoxy group, a vinyl ether group or an acryl group is introduced, is preferably used.

Further, examples of the fluoro-based resin include a polymer obtained by polymerizing a monomer having a fluorine-containing aliphatic ring structure, a polymer obtained by cyclizing and polymerizing a fluorine-containing monomer having two or more polymerizable unsaturated bonds, a polymer obtained by copolymerizing a fluorine-containing monomer with a radical polymerizable monomer, and the like.

Examples of the fluorine-containing aliphatic ring structure include perfluoro(2,2-dimethyl-1,3-dioxole), perfluoro(4-methyl-1,3-dioxole), perfluoro(4-methoxy-1,3-dioxole), and the like.

Further, examples of the fluorine-containing monomer include perfluoro(allyl vinyl ether), perfluoro(butenyl vinyl ether), and the like.

Furthermore, examples of the radical polymerizable monomer include tetrafluoroethylene, chlorotrifluoroethylene, perfluoro(methyl vinyl ether), and the like.

Polysilane may be any polymers, as long as it is a polymer having a main chain composed of only Si atoms. The main chain may be either a linear type or a branch type. To the Si atom of the polysilane, an organic substituent group other than the Si atom such as a hydrogen atom, a hydrocarbon group or an alkoxy group may be bonded.

Among them, examples of the hydrocarbon group include an aliphatic hydrocarbon group having a carbon number of 1 to 10, an aromatic hydrocarbon group having a carbon number of 6 to 14, and the like. These hydrocarbon groups may be substituted with halogen.

Concrete examples of the hydrocarbon group include a linear hydrocarbon group such as a methyl group, an ethyl group, a propyl group, a butyl group, a hexyl group, an octyl group, a decyl group, a trifluoro propyl group or a nonafluoro hexyl group, an alicyclic hydrocarbon group such as a cyclohexyl group or a methyl cyclohexyl group, and the like.

Concrete examples of the aromatic hydrocarbon group include a phenyl group, a p-tolyl group, a biphenyl group, an anthracyl group, and the like.

Examples of the alkoxy group include an alkoxy group having a carbon number of 1 to 8, and concrete examples of the alkoxy group include a methoxy group, an ethoxy group, a phenoxy group, an octyloxy group and the like.

Further, the polyurethane may be any polymers each containing urethane bonds (—O—CO—NH—) in a main chain thereof, any copolymers each containing urethane bonds and urea bonds (e.g., —NH—CO—NH—, —NH—CO—N= or —NH—CO—N<) in a main chain thereof, or the like.

In this regard, in order to obtain a polymer 915 having relatively high refractive index, the polymer 915 can be, in general, synthesized (polymerized) using a monomer having an aromatic ring (aromatic group), a nitrogen atom, a bromine atom or a chlorine atom. On the other hand, in order to obtain a polymer 915 having relatively low refractive index, the polymer 915 can be, in general, synthesized (polymerized) using a monomer having an alkyl group, a fluorine atom or an ether chemical structure (ether group).

As the polymer 915 having relatively high refractive index, a norbornene-based polymer containing an aralkyl norbornene repeating unit is preferable. Such a norbornene-based polymer has an especially high refractive index.

Examples of an aralkyl group (aryl alkyl group) contained in the aralkyl norbornene repeating unit include a benzyl group, a phenyl ethyl group, a phenyl propyl group, a phenyl butyl group, a naphthyl ethyl group, a naphthyl propyl group, a fluorenyl ethyl group, a fluorenyl propyl group, and the like. Among them, the benzyl group or the phenyl ethyl group is especially preferable. This is because the norbornene-based polymer containing such a repeating unit has an extremely high refractive index.

Further, it is preferred that the aforementioned polymer 915 contains a cleavable group (cleavable pendant group) branching from the main chain thereof and having a chemical structure of which at least a part can be cleaved and removed from the main chain by being irradiated with actinic radiation. A refractive index of such a polymer 915 decreases due to the cleavage of the cleavable group. The refractive index difference can be generated in the layer 910 by the presence or absence of the irradiation of the actinic radiation.

Examples of the polymer 915 containing such a cleavable group include a polymer containing at least one of a chemical structure of —O—, a chemical structure of —Si-aryl and a chemical structure of —O—Si— in its molecular structure. Such cleavable groups are relatively easily cleaved under the action of cations.

Among them, as the acid cleavable group whose cleavage allows the refractive index of the polymer 915 to be lowered, a substituent group including at least one of a chemical structure of —Si-diphenyl and a chemical structure of —O—Si-diphenyl is preferable.

Examples of the polymer 915 containing the cleavable group as a side chain thereof include cyclic olefin-based resins such as polymers of monocyclic monomer (e.g., cyclohexene, cyclooctene) and polymers of polycyclic monomer (e.g., norbornene, norbornadiene, dicyclopentadiene, dihydrodicyclopentadiene, tetracyclododecene, tricyclopentadiene, dihydrotricyclopentadiene, tetracyclopentadiene, dihydrotetracyclopentadiene). Among them, one or more cyclic olefin-based resins selected from the polymers of the polycyclic monomer are preferably used. This is because these cyclic olefin-based resins have excellent heat resistance.

In this regard, a polymerization type of such cyclic olefin-based resins may be a well-known polymerization type such as a random polymerization or a block polymerization. Concrete examples of the polymer of norbornene-type monomer include a (co)polymer of the norbornene-type monomer, a copolymer of the norbornene-type monomer and the other monomer capable of copolymerizing the norbornene-type monomer such as an alpha olefin, a hydrogen additive thereof, and the like. These cyclic olefin-based resins can be synthesized using a well-known polymerization method including an addition polymerization method and a ring-opening polymerization method. Among them, a cyclic olefin-based resin obtained using the addition polymerization method (especially, a norbornene-based resin), that is, an addition polymer of the norbornene-based compound is preferably. This is because such a norbornene-based resin has superior properties such as transparency, heat resistance and flexibility.

Examples of the norbornene-based resin containing the cleavable group as a side chain thereof include a norbornene-based resin represented by the formula (8) in which X1 is the oxygen atom, X2 is the silicon atom and Ar is the phenyl group.

Further, the side chain shown in the formula (3) may be cleaved at a chemical structure of Si—O—X3 contained in the alkoxysilyl group.

For example, the norbornene-based resin represented by the formula (9) is considered to be reacted with an acid generated from the photo acid generator (herebelow, referred to as "PAG") as follows. In this regard, a partial chemical structure containing the side chain in which "i" is 1 is mainly shown in the following scheme.

[Formula 15]

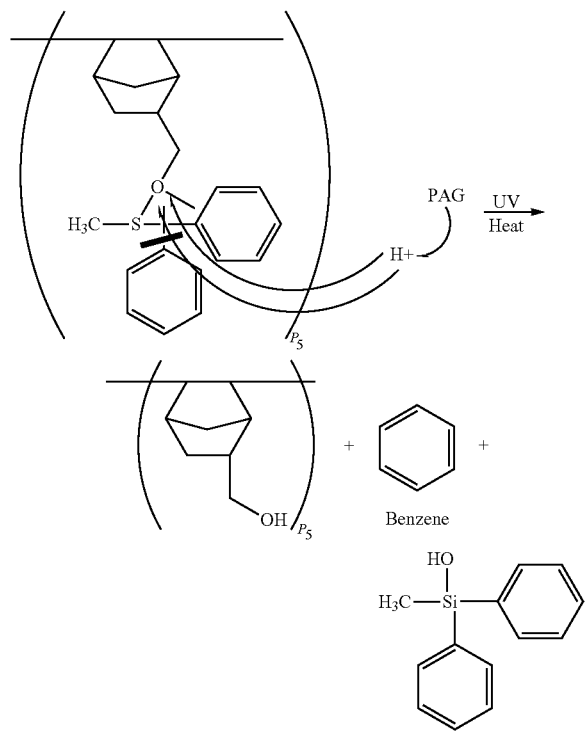

The norbornene-based resin represented by the formula (9) may further include an epoxy group as the side chain thereof. The use of such a norbornene-based resin makes it possible to manufacture an optical guide 1 having high adhesiveness with respect to a base material.

Concrete examples of the norbornene-based resin include the following resin.

[Formula 16]

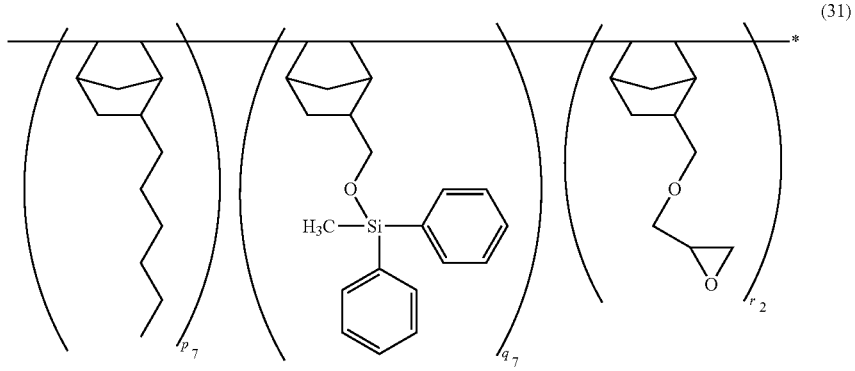

wherein "$p_7$"/"$q_7+r_2$" is 20 or less.

For example, the resin (compound) represented by the formula (31) can be obtained by dissolving hexylnorbornene, diphenyl methyl norbornene methoxysilane (norbornene containing —$CH_2$—O—$Si(CH_3)(Ph)_2$ as a side chain thereof) and epoxynorbornene into toluene, and then polymerizing them using a Ni compound as a catalyst in the toluene (solution).

Examples of another cleavable group include a substituent group having an acetophenone chemical structure at an end thereof. This cleavable group can be relatively easily cleaved under the action of free radicals.

An amount of the cleavable group contained in the polymer 915 including the cleavable group at the side chain thereof is not limited to a specific value, but is preferably in the range of 10 to 80 wt %, and more preferably in the range of 20 to 60 wt %. By setting the amount to a value falling within the above range, the polymer 915 can have flexibility and a refractive index modulation property (that is, an effect of changing a refractive index difference) in a good balance.

For example, by increasing the amount of the cleavable group, it is possible to widen a range of the refractive index to be changed by the polymer 915.

The polymers 915 contained in the optical waveguide forming compositions 901, 902 may contain the same or different component with each other. By containing the same component, the optical waveguide forming compositions 901, 902 become likely to be mixed with each other because compatibility between the compositions becomes high. As a result, it is possible to improve a continuousness of the vertical refractive index distribution curve T.

In another case where the polymers 915 in the optical waveguide forming compositions 901, 902 contain the different component with each other, one of the polymers 915 may have the cleavable group (reactive medium) and the other of the polymers 915 may have no cleavable group (reactive medium). For example, it is preferred that the polymer 915 contained in the optical waveguide forming composition 901 has the cleavable group and the polymer 915 contained in the optical waveguide forming composition 902 has no cleavable group. As a result, since the cleavable group only contained in the core layer 13 is cleaved, it is possible to generate the refractive index differences in the core layer 13. In the other hand, since the cleavable groups contained in the cladding layers 11, 12 are not cleaved, the refractive indexes in the cladding layers 11, 12 are not changed, thereby it is possible to allow the refractive indexes in the cladding layers 11, 12 to be relatively-constant. In this case, it is possible to avoid the process of adding the additional agent 920 (monomer, polymerization initiator or the like) to the optical waveguide forming compositions 901, 902.

On the other hand, in a case where at least the after-mentioned additional agent 920 in the optical waveguide forming composition 901 contains the monomer, it is not always necessary that the polymers 915 contained in the optical waveguide forming compositions 901, 902 have the cleavable group.

(Additional Agent)

In this embodiment, the additional agents 920 in the optical waveguide forming compositions 901, 902 contain the monomer. Further, in this embodiment, the additional agent 920 in the optical waveguide forming composition 901 further contains the polymerization initiator. On the other hand, the additional agent 920 in the optical waveguide forming composition 902 does not contain the polymerization initiator.

((Monomer))

The monomer is a composition which can generate the refractive index difference between an irradiated region and a non-irradiated region in the layer 910 by reacting and producing a reaction product when the after-mentioned active radiation is irradiated to the monomer in the irradiated region.

This reaction product contains at least one selected from the group consisting of a polymer obtained by polymerizing the monomer in the polymer 915, a cross-linking chemical structure cross-linking the polymer 915 via the monomer, and a branching chemical structure branching from the polymer 915 which is obtained by bonding the monomer thereto.

Since the refractive index difference between the irradiated region and the non-irradiated region is generated due to a refractive index difference between the polymer 915 and the monomer, the monomer contained in the additional agent 920 is selected in consideration of a magnitude relationship with the refractive index of the polymer 915.

In particular, in a case where it is required that the refractive index in the irradiated region is high, a combination of the polymer 915 having a relatively-low refractive index and the monomer having a relatively-high refractive index higher than the polymer 915 is used. In another case where it is required that the refractive index in the irradiated region is low, a combination of the polymer 915 having a relatively-high refractive index and the monomer having a relatively-low refractive index lower than the polymer 915 is used.

The expression "the refractive index is high" or "the refractive index is low" does not mean absolute values of the refractive indexes but a relative relationship between materials.

In a case where the refractive index in the irradiated region of the layer 910 decreases by the reaction of the monomer (producing the reaction product), this region, where the refractive index decreases, generates the local minimum value of the horizontal refractive index distribution curve W.

In a case where the refractive index in the irradiated region of the layer 910 increases by the reaction of the monomer (producing the reaction product), this region, where the refractive index increases, generates the local maximum value of the horizontal refractive index distribution W.

As the monomer, a composition having the compatibility with the polymer 915 and the refractive index differing from the refractive index of the polymer 915 by 0.01 or more is preferably used.

Such a monomer is not limited to a specific kind, as long as it is a compound having a polymerizable chemical structure. Examples of the monomer include a norbornene-based monomer, an acrylic acid (methacrylic acid)-based monomer, an epoxy-based monomer, an oxetane-based monomer, a vinyl ether-based monomer and a styrene-based monomer, and one or more of which may be used independently or in combination.

Among them, it is preferable to use a monomer or oligomer having a cyclic ether group such as an oxetanyl group or an epoxy group, or the norbornene-based monomer as the monomer. Since ring-opening of the cyclic ether group easily occurs, the monomer or oligomer having the cyclic ether group can be immediately reacted. Further, use of the norbornene-based monomer makes it possible to obtain the optical waveguide 1 having superior optical transmission property and superior heat resistance and flexibility.

A molecular weight (weight average molecular weight) of the monomer or oligomer having the cyclic ether group is preferably in the range of 100 to 400.

As the monomer or oligomer having the oxetanyl group, a compound selected from the following formulas (11) to (20) is preferable. Such a compound has high transparence at a wavelength of approximate 850 nm, flexibility and heat resistance in a good balance. Further, these compounds may be used independently or in combination.

[Formula 17]

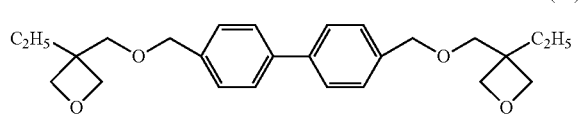

(11)

[Formula 18]

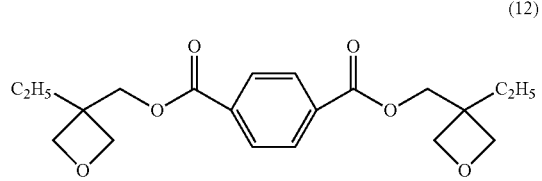

(12)

[Formula 19]

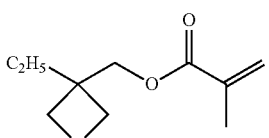
(13)

[Formula 20]

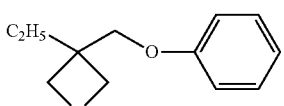
(14)

[Formula 21]

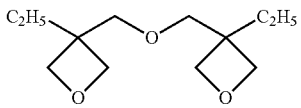
(15)

[Formula 22]

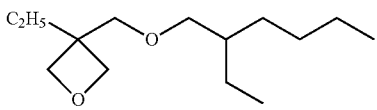
(16)

[Formula 23]

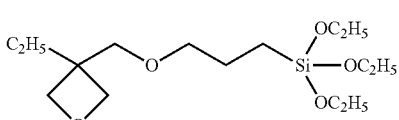
(17)

[Formula 24]

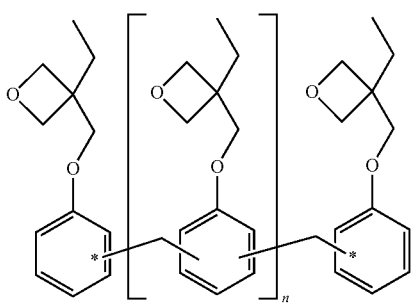
(18)

Wherein "n" is 0 to 3.

[Formula 25]

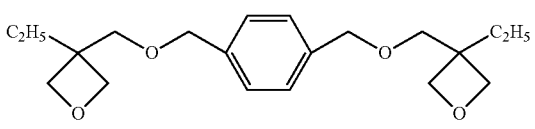
(19)

[Formula 26]

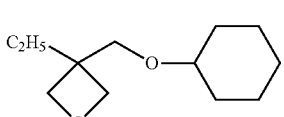
(20)

Among these monomers and oligomers, the compositions represented by the formulas (13), (15), (16), (17), (20) are preferably used from a viewpoint of ensuring the refractive index difference with respect to the polymer 15.

The compositions represented by the formula (15), (20) are more preferably used because the compositions represented by the formula (15), (20) have the refractive index difference with respect to the polymer 915, a low molecular weight and high flowability and are not likely to vapor.

As the compound having the oxetanyl group, compounds represented by the following formulas (32) and (33) can be used. As the represented by the formula (32), "TESOX" produced by TOAGOSEI CO., LTD. or the like can be used. As the represented by the formula (33), "OX-SQ" produced by TOAGOSEI CO., LTD. or the like can be used.

[Formula 27]

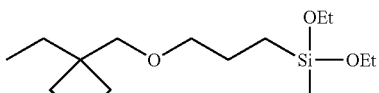
(32)

[Formula 28]

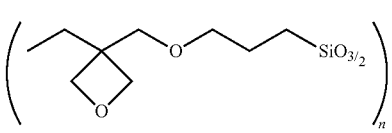
(33)

wherein "n" is 1 or 2.

Examples of the monomer or oligomer having the epoxy group include the following compound. Such a monomer or oligomer having the epoxy group is polymerized through the ring-opening of the epoxy group under the existence of an acid.

As the monomer or oligomer having the epoxy group, compounds represented by the following formulas (34) to (39). Among them, the alicyclic epoxy monomers represented by the formulas (36) to (39) are preferably used. This is because the epoxy ring has excellent reactivity due to large strain energy thereof.

The compound represented by the formula (34) is epoxynorbornene, and as such a compound, for example, "EpNB" produced by PROMERUS LLC can be used. The compound represented by the formula (35) is γ-glycidoxypropyl trimethoxysilane, and as such a compound, for example, "Z-6040" produced by Dow Corning Toray Silicone Co., Ltd. can be used. Further, the compound represented by the formula (36) is 1-(3,4-epoxycyclohexyl)ethyl trimethoxysilane, and as such a compound, for example, "E0327" produced by Tokyo Chemical Industry Co., Ltd. can be used.

The compound represented by the formula (37) is 3,4-epoxycyclohexenyl methyl-3',4'-epoxycyclohexene carboxylate, and as such a compound, for example, "CELLOXIDE 2000" produced by Daicel Corporation can be used.

The compound represented by the formula (37) is 3,4-epoxycyclohexenyl methyl-3',4'-epoxycyclohexene carboxylate, and as such a compound, for example, "CELLOX-IDE 2021P" produced by Daicel Corporation can be used. Further, the compound represented by the formula (38) is 1,2-epoxy-4-vinyl cyclohexane, and as such a compound, for example, "CELLOXIDE 2000" produced by Daicel Corporation can be used.

The compound represented by the formula (39) is 1,2:8,9 diepoxylimonene, and as such a compound, for example, "CELLOXIDE 3000" produced by Daicel Corporation can be used.

[Formula 29]

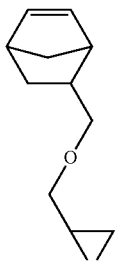

(34)

[Formula 30]

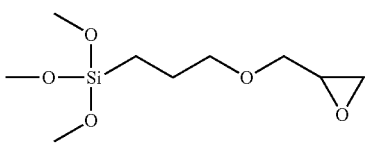

(35)

[Formula 31]

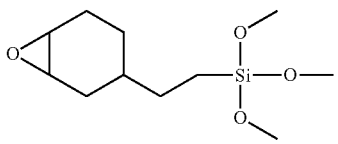

(36)

[Formula 32]

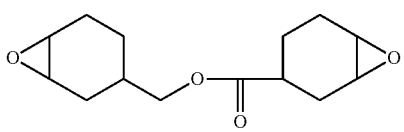

(37)

[Formula 33]

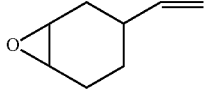

(38)

[Formula 34]

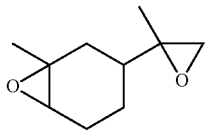

(39)

Furthermore, as the monomer, the monomer having the oxetanyl group, the oligomer having the oxetanyl group, the monomer having the epoxy group and the oligomer having the epoxy group may be used in combination.

Initiation reaction of the monomer or oligomer having the oxetanyl group from which the polymerization thereof starts is slow. On the other hand, Initiation reaction of the monomer or oligomer having the epoxy group from which the polymerization thereof starts is fast, but growth reaction thereof is slow. For these reasons, by using the monomer having the oxetanyl group, the oligomer having the oxetanyl group, the monomer having the epoxy group and the oligomer having the epoxy group in combination, the refractive index difference between the irradiated region and the non-irradiated region can be reliably generated by being irradiated with the light.

In particular, when the monomer represented by the formula (20) is defined as "a first monomer" and the monomer containing the above component B is defined as "a second monomer", the first monomer and the second monomer is preferably used in combination. Further, when a mixing ratio of the first monomer and the second monomer is defined as (a weight of the second monomer)/(a weight of the first monomer), the mixing ratio is preferably in the range of about 0.1 to 1, and more preferably in the range of 0.1 to 0.6. By setting the mixing ratio to fall within the above range, it is possible to improve a balance between reaction speed of the monomer and the heat resistance of the optical waveguide 1.

Examples of a monomer corresponding to the second monomer include a monomer having an oxetanyl group different from the monomer represented by the formula (20), and a monomer having a vinyl ether group. Among them, it is preferable to use at least one of the epoxy compound (especially, cycloaliphatic epoxy compound) and a bifunctional oxetane compound (monomer having two oxetanyl groups). Use of these second monomers makes it possible to improve the reactivity of the first monomer and the polymer 915. As a result, the optical guide can have superior heat resistance with keeping transparence thereof.

Concrete examples of such a second monomer include the compound of the above formula (15), the compound of the above formula (12), the compound of the above formula (11), the compound of the above formula (18), the compound of the above formula (19), and the compounds of the above formulas (34) to (39).

The norbornene-based monomer gives a generic name of a monomer including at least one norbornene chemical structure represented by the following structural formula A. Examples of the norbornene-based monomer include a monomer represented by the following structural formula C.

[Formula 35]

A

[Formula 36]

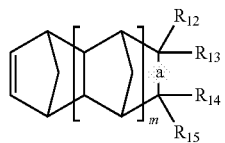

wherein "a" is a single bond or a double bond, each of $R_{12}$ to $R_{15}$ is independently a hydrogen atom, a substituted hydrocarbyl group, an unsubstituted hydrocarbyl group or a functional substituent group, "m" is an integer of 0 to 5, and in the case where a is the double bond, one of $R_{12}$ and $R_{13}$ and one of $R_{14}$ and $R_{15}$ are not present.

Examples of the unsubstituted hydrocarbyl group include a linear or branched alkyl group having a carbon number of 1 to 10 ($C_1$-$C_{10}$), a linear or branched alkenyl group having a carbon number of 2 to 10 ($C_2$-$C_{10}$), a linear or branched alkynyl group having a carbon number of 2 to 10 ($C_2$-$C_{10}$), a cycloalkyl group having a carbon number of 4 to 12 ($C_4$-$C_{12}$), a cycloalkenyl group having a carbon number of 4 to 12 ($C_4$-$C_{12}$), a aryl group having a carbon number of 6 to 12 ($C_6$-$C_{12}$), and an aralkyl group (an aryl alkyl group) having a carbon number of 7 to 24 ($C_7$-$C_{24}$). Further, each of $R_{12}$ and $R_{13}$ or each of $R_{14}$ and $R_{15}$ may be an alkylidenyl group having a carbon number of 1 to 10 ($C_1$-$C_{10}$).

For example, examples of acrylic acid (methacrylic acid)-based monomer other than the above mentioned monomer include acrylic acid, methacrylic acid, acrylic acid ester, methacrylic acid ester, acrylic acid amide, methacrylic acid amide, acrylonitrile and the like, and one or more of which may be used independently or in combination.

Concrete examples of the acrylic acid (methacrylic acid)-based monomer include (meth)acrylic acid 2-ethylhexyl, (meth)acrylic acid cyclohexyl, (meth)acrylic acid 2-butoxyethyl and the like.

Further, examples of the vinyl ether-based monomer include alkyl vinyl ethers such as methyl vinyl ether, ethyl vinyl ether, n-propyl vinyl ether, isopropyl vinyl ether, n-butyl vinyl ether, isobutyl vinyl ether, tert-butyl vinyl ether, n-pentyl vinyl ether, n-hexyl vinyl ether, n-octyl vinyl ether, n-dodecyl vinyl ether, 2-ethyl hexyl vinyl ether and cyclohexyl vinyl ether and cycloalkyl vinyl ethers, and one or more of which may be used independently or in combination.

Furthermore, examples of the styrene-based monomer include styrene, divinyl benzene and the like, and one or more of which may be used independently or in combination.

In this regard, a combination of these monomers and the aforementioned polymer 915 is not limited, and may be any combination.

Further, at least a part of the monomer may be oligomerized.

Additive amount of these monomers is preferably in the range of 1 to 50 parts by weight, and more preferably in the range of 2 to 20 parts by weight with respect to 100 parts by weight of the polymer. This makes it possible to modulate the refractive index between the core layer and the cladding layer, and achieve a good balance between the flexibility and the heat resistance thereof.

The monomers contained in the optical waveguide forming compositions 901, 902 may contain the same or different component with each other. In a case where the monomer contained in the optical waveguide forming composition 901 is identical to the monomer contained in the optical waveguide forming composition 902, it is possible to clearly form the vertical refractive index distribution curve T because the diffusive movement of the monomers between the optical waveguide forming compositions 901, 902 is reliably caused. As a result, it is possible to obtain the optical waveguide 1 having superior properties.

In a case where the optical waveguide forming composition 901 contains the monomer, the optical waveguide forming composition 902 may not contain the monomer. In this case, since the diffusive movement of the monomer in the cladding layers 11, 12 is not caused, it is possible to uniform the refractive index in the cladding layers 11, 12.

((Polymerization Initiator))

The polymerization initiator can act the monomer and accelerate the reactions of the monomer due to the irradiation of the active radiation.

The polymerization initiator is appropriately selected and used depending on the kind of the polymerization reaction or the cross-linking reaction of the monomer. For example, a radical polymerization initiator is exclusively used for the acrylic acid (methacrylic acid)-based monomer and the styrene-based monomer, and a cationic polymerization initiator is exclusively used for the epoxy-based monomer, the oxetane-based monomer, the vinyl ether-based monomer.

Examples of the radical polymerization initiator include benzophenones, acetophenones and the like.

On the other hand, examples of the cationic polymerization initiator include Lewis acid generation type compound such as a diazonium salt, Broensted acid generation type compound such as an iodonium salt, a sulfonium salt and the like.

In particular, in a case where the monomer having the cyclic ether group is used, the following cationic polymerization initiator (photo acid generator) is preferably used.

As the photo acid generator, for example, it is preferable to use a compound such as sulfonium salts (e.g., triphenyl sulphonium trifluoromethane sulfonate; tris(4-t-butyl phenyl) sulfonium-trifluoromethane sulfonate)); diazonium salts (e.g., p-nitrophenyl diazonium hexafluorophosphate); ammonium salts, phosphonium salts; iodonium salts (e.g., diphenyl iodonium trifluoromethane sulfonate, (tricumyl) iodonium-tetrakis(pentafluorophenyl) borate; quinone diazides; diazimethanes (e.g., bis(phenyl sulfonyl) azimethane; sulfonic acid esters (e.g., 1-phenyl-1-(4-methyl phenyl) sulfonyloxy-1-benzoyl methane, N-hydroxynaphthalimido-trifluoro methane sulfonate; disulphones (e.g., diphenyl disulphone); triazines (e.g., tris(2,4,6-trichloromethyl)-s-triazine, 2-(3,4-methylenedioxyphenyl)-4,6-bis-(trichloromethyl)-s- triazine; and the like. In this regard, one or more of these photo acid generators may be used independently or in combination.

An amount of the polymerization initiator is preferably in the range of 0.01 to 0.3 parts by weight, and more preferably in the range of 0.02 to 0.2 parts by weight with respect to 100 parts by weight of the polymer. This makes it possible to improve reactivity.

In this embodiment, as described above, since the additional agent 920 in the optical waveguide forming composition 901 contains the polymerization initiator, the polymerization of the monomer only in the core layer 13 is accelerated. On the other hand, since the additional agent 920 in the optical waveguide forming composition 902 does not contain the polymerization initiator, the polymerizations of the monomers in the cladding layers 11, 12 are not accelerated. As a result, it is possible to suppress the variations of the refractive indexes in the cladding layers 11, 12, so that it is possible to relatively uniform the refractive indexes in the cladding layers 11, 12.

The addition of the polymerization initiator is not limited to the above cases. Both of the optical waveguide forming compositions 901, 902 may contain the polymerization initiator. In this case, since it is preferable to suppress the polymerizations of the monomers in the cladding layers 11, 12 as much as possible, it is preferred that the additive amount or the kind of the polymerization initiator contained in the optical waveguide forming composition 901 is different from the additive amount or the kind of the polymerization initiator contained in the optical waveguide forming composition 902. In particular, for example, a polymerization initiator having high reactivity with respect to a wavelength of the after-mentioned active radiation 930 is used as the polymerization initiator contained in the optical waveguide forming composition 901 and a polymerization initiator having low reactivity with respect to the wavelength of the after-mentioned active radiation 930 is used as the polymerization initiator contained in the optical waveguide forming composition 902. In a case where the polymerization initiators contained in the optical waveguide forming compositions 901, 902 are the same kind with each other, the additive amounts of the polymerization initiators contained in the optical waveguide forming compositions 901, 902 are different from each other.

Further, a photo acid generator may be used as the polymerization initiator contained in the optical waveguide forming composition 901, and a heat acid generator may be used as the polymerization initiator contained in the optical waveguide forming composition 902. In this case, the polymerization of the monomer only in the core layer 13 is mainly accelerated by the irradiation of the active radiation 930, so that the horizontal refractive index distribution curve W is formed. On the other hand, the polymerizations of the monomers in the cladding layers 11, 12 are not accelerated in this time. After forming the horizontal refractive index distribution curve W, the polymerizations of the monomers in the cladding layers 11, 12 are accelerated by heating the layer 910. As a result, a vertical refractive index distribution curve T' in the thickness direction is fixed.

Examples of the heat acid generator include a sulfonium salt-type compound such as triphenyl sulfonium trifluoromethane sulphonic acid or triphenyl sulfonium nonatrifluoro butane sulphonic acid; an iodonium salt-type compound such as diphenyl iodonium trifluoromethane sulphonic acid or diphenyl iodonium nonafluoro butane sulphonic acid; a phosphonium salt-type compound such as pentaphenyl phosphonium trifluoromethane sulphonic acid or pentaphenyl phosphonium nonafluoromethane sulphonic acid; and the like.

The addition agent 920 may contain a sensitizer or the like in addition to the monomer and the polymerization initiator. The sensitizer can reduce energy and time for activation (reaction or decomposition) of the polymerization initiator by increasing sensitivity with respect to light or converting a wavelength of light to an appropriate wavelength for the activation of the polymerization initiator.

Such a sensitizer is not limited to a specific kind, but is preferably selected depending on sensibility of the polymerization initiator or a peak absorption wavelength of the sensitizer. Examples of the sensitizer include anthracenes such as 9,10-dibutoxy anthracene (CAS number 76275-14-4), xanthones, anthraquinones, phenanthrenes, chrysenes, benzpyrenes, fluoracenes (fluoranthenes), rubrenes, pyrenes, indanthrenes, thioxanthen-9-ones, and one or more of which may be used independently or in combination.

Concrete examples of the sensitizer include 2-isopropyl-9H-thioxanthen-9-one, 4-isopropyl-9H-thioxanthen-9-one, 1-chloro-4-propoxythioxanthone, phenothiazine and a mixture thereof.

An amount of the sensitizer contained in the optical waveguide forming compositions 901, 902 is preferably equal to or more than 0.01 to 0.3% by weight, more preferably equal to or more than 0.5% by weight, even more preferably equal to or more than 1% by weight. An upper limit of the sensitizer is preferably equal to or less than 5% by weight.

In this regard, the additional agent 920 may further contain a catalyst precursor, a co-catalyst, an antioxidant, an UV absorber, a photostabilizer, a silane coupling agent, a coating surface improvement agent, a heat polymerization inhibitor, a labeling agent, a surface-active agent, a medium, a save stabilizer, a plasticizer, a lubricant, a filler, an inorganic particle, an antioxidant, a wettability improvement agent, an antistatic agent and the like.

The layer 910 containing the polymer 915 and the additional agent 920 has a predetermined refractive index generated by the function of the additional agent 920 uniformly dispersed in the polymer 915.

Next, a mask (masking) 935 in which an aperture (window) is defined (formed) is prepared. The active radiation 930 is irradiated to the layer 910 through the mask 935 (see FIG. 9).

Hereinafter, description will be given to a case of using the monomer having a refractive index lower than the polymer 915 as one example. In the optical waveguide forming compositions 901, 902 which are used for forming the layer 910, the component of the polymer 915 is selected so as to meet a relational expression (the refractive index of the optical waveguide forming composition 901)>(the refractive index of the optical waveguide forming composition 902). This makes it possible to generate the vertical refractive index distribution curve T'. In the vertical refractive index distribution curve T', a maximum refractive index is positioned at a center portion in the thickness direction of the layer 910 and the refractive index continuously decreases from the central portion in the thickness direction toward surfaces of the layer 910.

In this example, the irradiated regions 925 on which the active radiation 930 is irradiated mainly become the side cladding portions 15.

In this example, apertures (windows) 9351 corresponding to a pattern of the side cladding portions 15 to be formed are defined in a large part of the mask 935. The apertures 9351 are used for defining (forming) transmitting portions for transmitting the active radiation 930. Although a pattern of the core portions and the side cladding portions 15 depends on the horizontal refractive index distribution curve W which is formed by the irradiation of the active radiation 930, a pattern of the apertures 9351 is not completely identical to the pattern of the side cladding portions 15. Thus, there is a case where there are some misalignments between the pattern of the side cladding portions 15 and the pattern of the apertures 9351.

The mask 935 may be preliminarily prepared (separately prepared, for example, the mask 935 may be a plate-like mask) or formed on the layer 910 by, for example, a vapor deposition method or a coating method.

Preferred examples of the mask 935 include a photo mask constituted of a fused silica, a PET base material or the like, a stencil mask, a metal film formed by the vapor deposition method or the like, and the like. Among them, each of the photo mask and the stencil mask is preferably used because it is possible to easily and accurately form a fine pattern (micropattern) to the masks and to easily handle the masks, so that it is possible to improve productivity of the mask 935.

In FIG. 9, the apertures (windows) 9351 of the mask 935 are shown. The apertures (windows) are formed by removing parts of the mask 935 according to the pattern of the active radiation 930 to be irradiated to the irradiated regions 925. However, in a case of using the photo mask constituted of the fused silica, the PET base material or the like, shielding portions which shield the active radiation 930 and are constituted of a metal shielding material such as chrome may be provided on the photo mask. In this case, regions other than regions on which the shielding portions are provided correspond to the windows (transmitting portions).

The active radiation 930 is not particularly limited to a specific kind, as long as it can initiate an optical chemically reaction (change) of the polymerization initiator and cleave the cleavable group of the polymer 915. Examples of the active radiation 930 include visible light, ultraviolet light, infrared light, laser light, electron ray, X ray and the like.

Among them, the active radiation 930 is appropriately selected depending on the kinds of the polymerization initiator and the cleavable group. In a case where the polymerization initiator contains the sensitizer, the active radiation 903 is appropriately selected depending on the kinds of the polymerization initiator, the cleavable group and the sensitizer. The active radiation 930 is not particularly limited to a specific kind, but preferably has a peak wavelength in the wavelength band of 200 to 450 nm. This makes it possible to easily activate the polymerization initiator and cleave the cleavable group.

A radiation amount of the active radiation 930 is preferably in the range of about 0.1 to 9 $J/cm^2$, more preferably in the range of about 0.2 to 6 $J/cm^2$, and even more preferably in the range of about 0.2 to 3 $J/cm^2$.

When the active radiation 930 is irradiated to the layer 910 through the mask 935, the polymerization initiator is activated in the irradiated regions 9253 (the irradiated regions 925) of the core layer 13. This makes it possible to polymerize the monomers in the irradiated regions 9253. Since the polymerizations of the monomers result in decreasing an amount of the monomer in each of the irradiated regions 9253, the monomer in each of the non-irradiated regions 9253 of the core layer 13 is diffusively moved toward the irradiated regions 9253. Since the polymer 915 and the monomer are appropriately selected so as to form the refractive index difference curve described above, the refractive index difference between each of the irradiated regions 9253 and each of the non-irradiated regions 9403 in the core layer 13 is generated by the diffusive movement of the monomer. On the other hand, since the irradiated regions 9251 and the non-irradiated regions 9252 in the cladding layers 11, 12 do not contain the polymerization initiator, the polymerizations of the monomers are suppressed.

Figure 11:
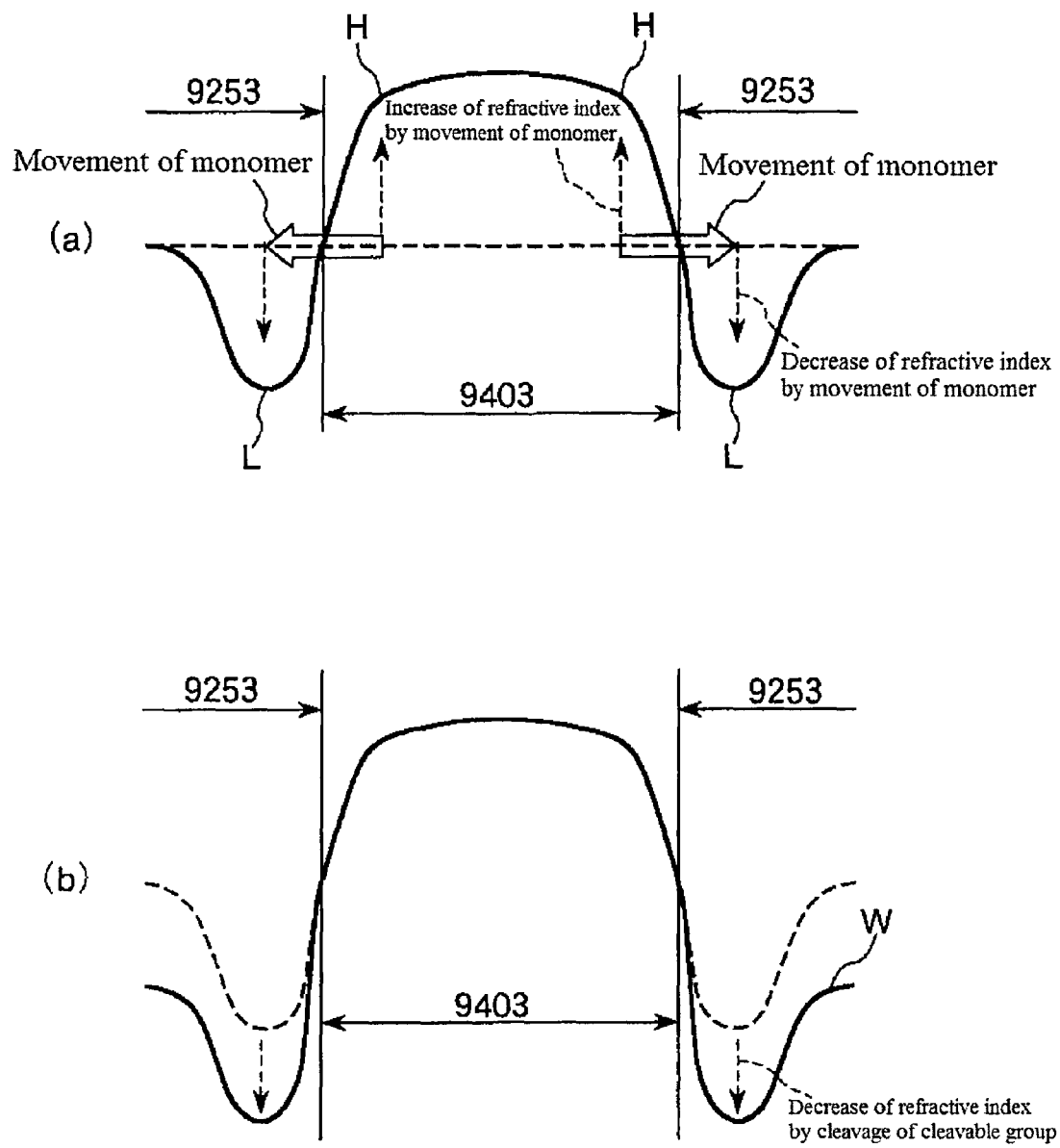
FIG. 11 is a graph showing a process for generating a refractive index difference between each of irradiated regions and a non-irradiated region. In this graph, a width direction of the layer is defined as a horizontal axis and a refractive index of the layer is defined as a vertical axis.

FIG. 11 is a graph showing a process for generating a refractive index difference between each of the irradiated regions 9253 and the non-irradiated region 9403. In this graph, the width direction of the layer 910 is defined as a horizontal axis and the refractive index of the layer 190 is defined as a vertical axis.

In this embodiment, since the monomer having the refractive index lower than the polymer 915 is used, the refractive index in the non-irradiated region 9403 increases and the refractive index in each of the irradiated regions 9253 decreases by the diffusive movement of the monomer (see FIG. 11*a*).

It would appear that the diffusive movement of the monomer is caused by a concentration gradient of the monomer resulted by decreasing the amount of the monomer in each of the irradiated regions 9253. Therefore, the monomer in the non-irradiated region 9403 is not moved toward the irradiated regions 9253 all at once, but the monomer is gradually moved toward the irradiated regions 9253 depending on a distance from the irradiated regions 9253. Then, the diffusive movement of the monomer in the non-irradiated region 9403 is caused so as to compensate for lacks of the monomers in the irradiated regions 9253. As a result, as shown in FIG. 11*a*, a high refractive index portion H is formed in the non-irradiated region 9403 and low refractive index portions L are respectively formed in the irradiated regions 9253 adjoining to the high refractive index portion H through the boundary with the non-irradiated region 9403. Since the high refractive index portion H and the low refractive index portions L are formed by the diffusive movement of the monomer, a refractive index distribution curve containing the high refractive index portion H and the low refractive index portions L inevitably has smooth curves. In particular, the high refractive index portion H forms, for example, an approximately convex portion protruding the upper side and the low refractive index portions L respectively form approximately concave portions protruding the lower side.

Since the polymer obtained by polymerizing the monomer as described above has the approximately same refractive index as the monomer before using for obtaining the polymer (a refractive index difference is in the range of about 0 to 0.001), the refractive index in the irradiated regions 9253 decreases along with a proceeding of the polymerization of the monomer depending on the amount of the monomer and an amount of the reaction product derived from the monomer. Therefore, by appropriately adjusting the amount of the monomer, the amount of the polymerization initiator and the like, it is possible to control the shape of the horizontal refractive index distribution curve W.

On the other hand, the monomer in the non-irradiated region 940 is not polymerized because the polymerization initiator contained in the non-irradiated region 940 is not activated.

The diffusive movement of the monomer gradually becomes hard to occur along with the proceeding of the polymerization of the monomer. Therefore, the concentration of the monomer in each of the irradiated regions 9253 inevitably decreases depending on the distance from the non-irradiated regions 9403. As a result, the low refractive index portions L in the irradiated regions 9253 are likely to have a symmetric shape and a gradient of the refractive index in the irradiated regions 9253 become steeper. This makes it possible to obtain the optical waveguide of the present invention having the horizontal refractive index distribution curve W.

As described above, the polymer preferably has the cleavable group. The cleavable group is cleaved by the irradiation of the active radiation 930 and causes the decrease of the refractive index of the polymer 915. Thus, when the active radiation 930 is irradiated to the irradiated regions 9253, the diffusive movement of the monomer is caused and the cleavable group is cleaved from the polymer 915. As a result, the refractive index in the irradiated regions 925 decreases more as compared with the refractive index in a state that the active radiation 930 is not irradiated to the irradiated regions 9253 (see FIG. 11*b*).

Since this decrease of the refractive index is uniformly caused in whole of the irradiated regions 9253, the refractive index differences between the high refractive index portion H and each of the low refractive index portions L are more enlarged. As a result, the horizontal refractive index distribution curve W shown in FIG. 11*b* is formed. Both of the change of the refractive index shown in FIG. 11*a* and the change of the refractive index shown in FIG. 11*b* are caused at the approximately same time. By such changes of the refractive index, the refractive index differences are more enlarged.

By adjusting the radiation amount of the active radiation 930, it is possible to control the refractive index differences and the shape of the horizontal refractive index distribution curve W. For example, by increasing the radiation amount of the active radiation 930, it is possible to enlarge the refractive index differences. Further, the layer 910 may be dry before the active radiation 930 is irradiated. In this case, by adjusting a dryness of the layer 910, it is possible to control the shape of the horizontal refractive index distribution curve W. For example, by increasing the dryness of the layer 910, it is possible to reduce a diffusive movement distance of the monomer.

In the irradiated regions 9253, the diffusive movement of the monomer from each of the irradiated regions 9252, 9253 of the cladding layers 11, 12 is caused as well as the diffusive movement of the monomer from the non-irradiated region 9403 of the core layer 13. As a result, the refractive index in each of the irradiated regions 9253 further decreases. On the other hand, the refractive index in each of the irradiated regions 9251, 9252 increases along with the diffusive movement of the monomer. However, since the component of the polymer 915 in each of the irradiated regions 9251, 9252 and other conditions are preliminarily set so that the refractive index in each of the irradiated regions 9251, 9252 becomes low, the increase of the refractive index does not hinder the functions of the optical waveguide 1.

In the irradiated regions 9251, 9252 of the cladding layers 11, 12, the cleavable group is cleaved and then the refractive index of the polymer 915 decreases as is the cases with the irradiated regions 9253. As a result, the refractive index in each of the irradiated regions 9251, 9252 further decrease as well as the irradiated region 9253.

Based on the above mechanism, the optical waveguide 1 having the horizontal refractive index distribution curve W is obtained (see FIG. 10). In this embodiment, both the monomer and the cleavable group in the core layer 13 work as a reaction medium which causes chemical reactions resulting in the changes of the refractive index by the irradiation of the active radiation 930. As a result, the refractive index differences generated in the horizontal refractive index distribution curve W become more enlarged as compared with the case where the additional agent 920 does not contain the monomer or the polymer 915 does not contain the cleavable group.

As shown FIG. 2*b*, the horizontal refractive index distribution curve W has the local minimum values Ws1, Ws2, Ws3, Ws4 which are derived from the low refractive index portions L. Positions of these local minimum values respectively correspond to the boundary planes between the core portions 14 and the side cladding portions 15.

In a contrast case where the monomer having the refractive index higher than the polymer 915 is used, the refractive index increases along with the diffusive movement of the monomer. Therefore, the irradiated regions 925 and the non-irradiated regions 940 are set depending on the increase of the refractive index.

Figure 12:
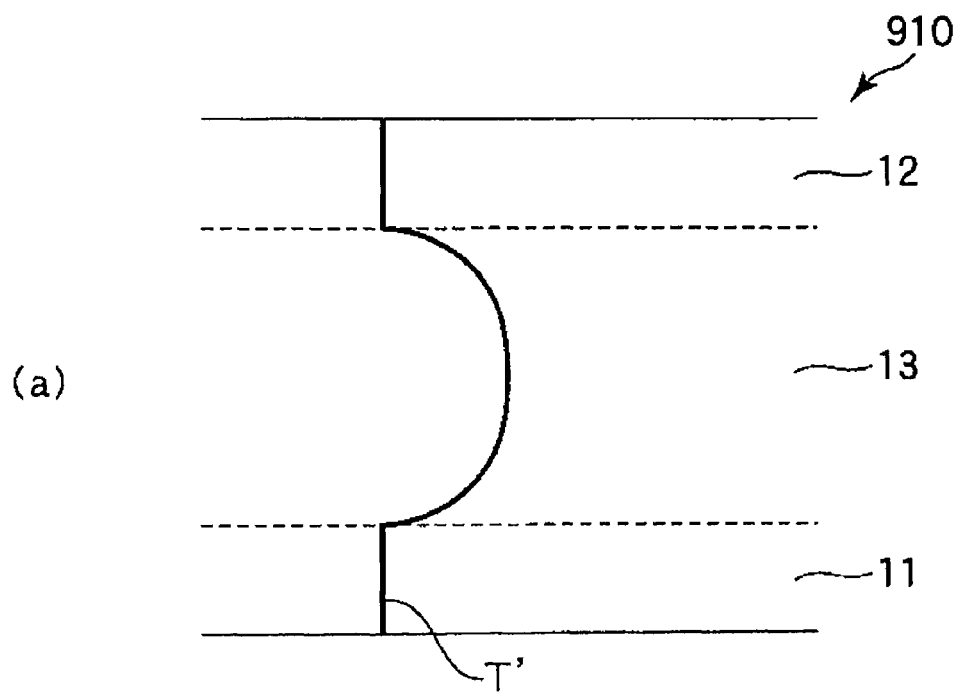
FIG. 12 is a graph showing the vertical refractive index distribution curve T of the optical waveguide. In this graph, a refractive index of the optical waveguide appeared in a cross-sectional plane is defined as a horizontal axis and a thickness direction of the optical waveguide is defined as a vertical axis.
Figure 12:
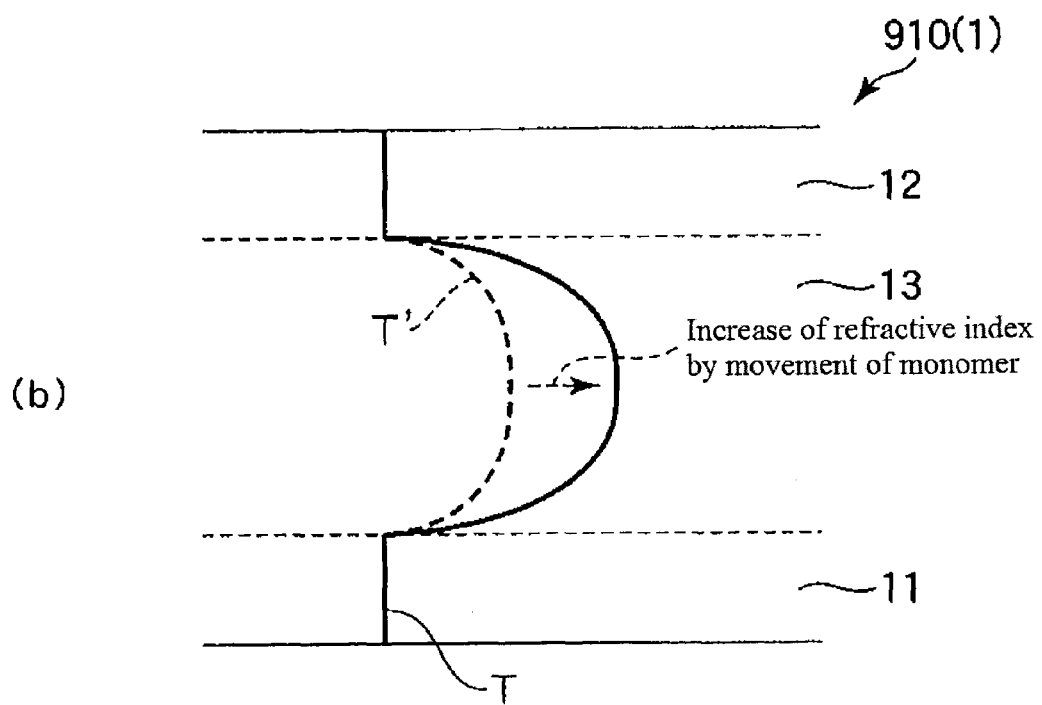

As shown in FIG. 12*a*, the layer 910 is configured to have the vertical refractive index distribution curve T' as it is called the graded-index type in the thickness direction before the active radiation 930 is irradiated. As described above, the vertical refractive index distribution curve T' in the thickness direction is generated by obtaining the layer 910 constituted of the optical waveguide forming compositions 901, 902, whose refractive indexes are different from each other, with the multi-layer molding method.

When the active radiation 930 is irradiated to the layer 910 through the mask 935, if the content ratios of the monomer in the light forming compositions 901, 902 are different from each other, the monomer in the non-irradiated region 9403 is diffusively moved toward the irradiated regions 9253. As a result, in the vertical refractive index distribution curve T' in the thickness direction of the core layer 14, the refractive index in a region corresponding to the core portion 14 increases in the same manner. On the other hand, the refractive indexes do not change in the cladding layers 11, 12 respectively provided on the upper surface and the lower surface of the core portion 14. As a result, the refractive index differences between the core portion 14 and each of the cladding layers 11, 12 are enlarged.

Based on the above mechanism, the optical waveguide 1 having the vertical refractive index distribution curve T as it is called the graded-index type with a large refractive index difference is obtained (see FIG. 12*b*). In a case where a shape of a refractive index distribution curve which can provide sufficient effect is formed in the vertical refractive index distribution curve T', the aforementioned process for changing the vertical refractive index distribution curve T' to the vertical refractive index distribution curve T may be omitted.

The horizontal refractive index distribution curve W has a certain level of correlative relationship with the concentration of the reaction product derived from the monomer in the core layer 13. Thus, by measuring the concentration of the reaction product derived from the monomer, it is possible to indirectly identify the horizontal refractive index distribution curve W of the optical waveguide 1.

Similarly, the vertical refractive index distribution curve T has a certain level of correlative relationship with the concentration of the reaction product in the core layer 13. Thus, by measuring the concentration of the reaction product derived from the monomer, it is possible to indirectly identify the vertical refractive index distribution curve T of the optical waveguide 1.

Examples of the reaction product derived from the monomer include an unreacted monomer such as a monomer and a composition obtained by reacting the monomer (such as an oligomer obtained by reacting the monomer), a polymer obtained by reacting the monomer and the like.

It is possible to measure the concentration of the reaction product, for example, by a line analysis or a surface analysis such as FT-IR or TOF-SIMS.

Further, the light intensity distribution of the light output of the optical waveguide 1 has a certain level of correlative relationships with the horizontal refractive index distribution curve W and the vertical refractive index distribution curve T. Thus, by using the light intensity distribution of the light output, it is possible to indirectly measure the horizontal refractive index distribution curve W and the vertical refractive index distribution curve T.

Further, for example, (1) a method that the refractive index distribution curve is measured by measuring an interference pattern depending on the refractive index and calculating the refractive index distribution curve from the interference pattern by using a dual-beam interference microscope, and (2) a method that the refractive index distribution curve is measured by using a RNF (Refracted Near Filed method) may be used for directly measuring the refractive index distribution curves. For the RNF, a measurement condition, for example, disclosed in JP H05-332880A may be used. On the other hand, the dual-beam interference microscope is preferably used because it is possible to easily measure the refractive index distribution curve.

Hereinafter, one example of the method for measuring the refractive index distribution by using the dual-beam interference microscope is described in detail. At first, an optical waveguide piece is prepared by slicing the optical waveguide in the cross-sectional direction (in the width direction). For example, the optical waveguide is sliced so that the optical waveguide piece has a length of 200 to 300 μm. Next, a chamber is prepared by filling oil having a refractive index of 1.536 into a space between two slide glasses. And then, a measurement sample unit is prepared by putting the optical waveguide piece in the space of the chamber and a blank sample unit, which is the chamber without the optical waveguide piece, is prepared. Next, two split light are respectively introduced to the measurement sample unit and the blank sample unit, and then an image (photograph) of an interference pattern is obtained by combining two transmitting light through the measurement sample unit and the blank sample unit. Since the interference pattern is made by the refractive index distribution (phase distribution) of the optical waveguide piece, it is possible to measure (identify) the horizontal refractive index distribution curve W in the width direction of the optical waveguide by analyzing the image (photograph) of the interference pattern. At the time of obtaining the horizontal refractive index distribution curve W, it is possible to improve measurement accuracy of the horizontal refractive index distribution curve W by analyzing a plurality of the images (photographs). The plurality of the images (photographs) can be obtained by moving a prism provided in the dual-beam interference microscope so as to change a light path length. By doing this, it is possible to obtain the plurality of the images (photographs) which respectively has different intervals or positions of the interference pattern. When the image (photograph) of the interference pattern is analyzed, analysis points may be set, for example, every 2.5 µm.

In a case where light having a high directional property such as laser light is used as the active radiation 930, the mask 935 may not be used.

Next, the layer 910 is heat-treated as necessary. In this heat-treating process, the monomer in the irradiated regions 9253 of the core layer 13 is further polymerized.

A heating temperature in the heat-treating process is not particularly limited to a specific value, but preferably in the range of 30 to 180° C., and more preferably in the range of 40 to 160° C.

A heating time in the heat-treating process is preferably set so that the polymerizations of the monomers in the irradiated regions 925 are almost completed. In particular, the heating time in the heat-treating process is preferably in the range of 0.1 to 2 hours, and more preferably in the range of 0.1 to 1 hours.

This heat-treating process is carried out as necessary, but may not be carried out. Based on the above method, the optical waveguide 1 is obtained.

After that, the optical waveguide 1 is removed from the support substrate 951 as necessary, the support film 2 is laminated on the lower surface of the optical waveguide 1 and the cover film 3 is laminated on the upper surface of the optical waveguide 1.

The core layer 13 may be formed on not the support substrate 951 but on the cladding layer 11. The cladding layer 12 may not be attached on the core layer 13. The cladding layer 12 may formed on the core layer 13 by coating the constituent material on the core layer 13.

(Second Method for Producing)

Next, a second method for producing the optical waveguide 1 is described in detail.

Hereinafter, the second method for producing will be described by placing emphasis on the points differing from the first method for producing, with the same matters omitted from description.

The second method for producing is identical to the first method for producing, except that the component of the light forming composition 901.

The second method for producing the optical waveguide 1 comprises the following two steps. [1] Obtaining the layer 910 by extruding and laminating the two optical waveguide forming compositions 901, 902 (the first compression and the second compression) on the support substrate 951. Next, [2] obtaining the optical waveguide 1 by irradiating the active radiation to the part of the layer 910 and then heat-treating the layer 910 for generating the refractive index differences in the layer 910 and obtaining the core layer 13 having the core portion 14 and the side cladding portion 15.

Hereinafter, the steps are described in series.

[1] First, the optical waveguide forming compositions 901 is prepared.

The light forming composition 901 used in the second method for producing contains a procatalyst (catalyst precursor) and a promoter instead of the polymerization initiator.

The procatalyst can initiate the reaction (polymerization or cross-linking reaction) of the monomer. An activation temperature of the procatalyst is changed by functions of the promoter activated by the irradiation of the active radiation. According to the change of the activation temperature, reaction initiating temperature differences of the monomer between each of the irradiated regions 9253 and the non-irradiated region 9403 are generated. As a result, it is possible to react the monomer only in the irradiated regions 9253.

The procatalyst may be any compositions, as long as its activation temperature is changed (raised or dropped) by the irradiation of the active radiation. In particular, a composition whose activation temperature drops due to the irradiation of the active radiation is preferably. This makes it possible to form the core layer 13 (optical waveguide 1) by heat-treating at relatively low temperature, and thereby preventing property (light transmitting performance) deterioration of the optical waveguide 1.

As such a procatalyst, a procatalyst containing at least one of compositions represented by the following formulas Ia, Ib is preferably used.

[Formula 37]

  (Ia)

  (Ib)

In the formulas (Ia) and (Ib), $E(R)_3$ is a Group 15 neutral electron donor ligand, E is an element selected from the group comprising elements of Group 15 of the Periodic Table, and R is one of a hydrogen atom, an isotope thereof and a hydrocarbyl group-containing moiety, Q is an anionic ligand selected from the group comprising carboxylate, thiocarboxylate and dithiocarboxylate. Further, in the formula (Ib), LB is a Lewis base, WCA is a weakly coordinating anion, "a" is an integer of 1 to 3, "b" is an integer of 0 to 2, a total number of "a" and "b" is 1 to 3, and "p" and "r" are integers for maintaining balance between an electronic charge of a palladium cation and an electronic charge of the weakly coordinating anion.

Examples of an exemplary compound in accordance with the formula (Ia) include $Pd(OAc)_2(P(i-Pr)_3)_2$, $Pd(OAc)_2(P(Cy)_3)_2$, $Pd(O_2CCMe_3)_2(P(Cy)_3)_2 Pd(OAc)_2(P(Cp)_3)_2$, $Pd(O_2CCF_3)_2(P(Cy)_3)_2$ and $Pd(O_2CC_6H_5)_3(P(Cy)_3)_2$, wherein Cp is a cyclopentyl group and Cy is a cyclohexyl group, but the exemplary compound in accordance with the formula (Ia) is not limited thereto.

Further, a procatalyst containing compounds each represented by the formula (Ib), in which each of "p" and "q" is selected from an integer of 1 or 2, is preferably used.

Examples of an exemplary compound in accordance with the formula (Ib) include $Pd(OAc)_2(P(Cy)_3)_2$, wherein Cy is a cyclohexyl group and Ac is an acetyl group.

Use of these procatalysts makes it possible for the monomer to be effectively reacted. In the case where the monomer is the norbornene-based monomer, the use of them makes it possible for the monomer to be effectively polymerized or cross-linked via the addition polymerization reaction.

A procatalyst whose activation temperature is lower than it should be by about 10 to 80° C. in a state that the activation temperature drops (active potential state) is preferably used as the procatalyst. This makes it possible to reliably generate the refractive index difference between the core portion 14 and the side cladding portion 15.

It is preferable to use the procatalyst containing (mainly composed of) at least one kind of the compounds each represented by the $Pd(OAc)_2(P(i-Pr)_3)_2$ and the compounds each represented by the $Pd(OAc)_2(P(Cy)_3)_2$.

The cocatalyst is a substance that is activated by being irradiated with the actinic radiation and can change the activation temperature of the procatalyst (that is, a polymerization initiation temperature of the monomer).

As such a cocatalyst, any substance can be used, as long as it is activated due to change (reaction or cleavage) of a chemical structure thereof by being irradiated with the actinic radiation. A cocatalyst (photoinitiator) containing (mainly composed of) compounds that are cleaved by being irradiated with actinic radiation having a predetermined wavelength so that they produce cations such as protons or other positive ions and weakly coordinating anions (hereinafter, referred to as "WCA"s) can be preferably used. In this regard, each of the weakly coordinating anions can substitute for a cleavable group included in the compounds of the procatalyst.

Examples of the weakly coordinating anion include a tetrakis(pentafluorophenyl) boric acid ion (hereinafter, referred to as "FABA-"), a hexafluoro antimonic acid ion (hereinafter, referred to as "$SbF_6$—") and the like.

Examples of the cocatalyst (a photo acid generator or a photo base generator) include tetrakis(pentafluorophenyl) gallate, aluminates, antimonates, other borates, other gallates, other carboranes and other halocarboranes in addition to tetrakis(pentafluorophenyl) borates and hexafluoro antimonate each represented by the following formula (38).

[Formula 38]

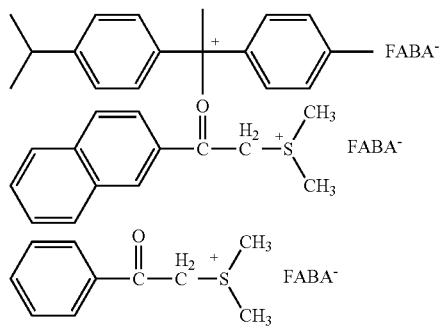

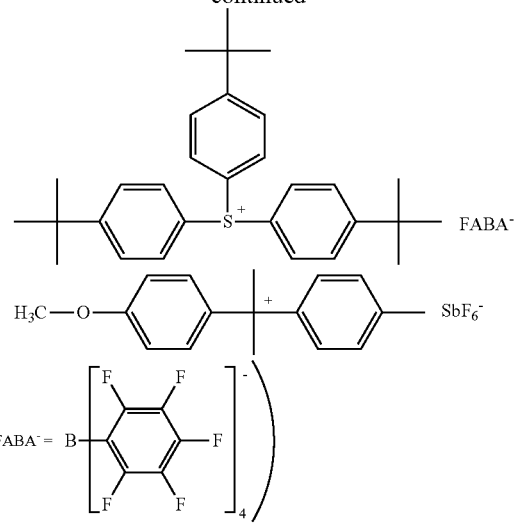

Examples of a marketed production of such a cocatalyst include RHODORSIL (which is a registered trademark and is same below) PHOTOINITIATOR 2074 (CAS 178233-72-2, available from Rhodia USA Inc., Cranbury, N.J.), TAG-372R (dimethyl (2-(2-naphthyl)-2-oxo ethyl) sulfonium tetrakis (pentafluorophenyl) borate, CAS 193957-54-9, available from Toyo Ink Mfg. Co., Ltd., Tokyo, Japan), MPI-103 (CAS 87709-41-9, available from Midori Kagaku Co., Ltd., Tokyo, Japan), TAG-371 (CAS 193957-53-8, available from Toyo Ink Mfg. Co., Ltd., Tokyo, Japan), TTBPS-TPFPB (tris(4-tert-butyl phenyl) sulphonium tetrakis(pentafluorophenyl) borate, available from Toyo Gosei Co., Ltd., Tokyo, Japan), NAI-105 (CAS 85342-62-7, available from Midori Kagaku Co., Ltd., Tokyo, Japan), and the like.

In this regard, in the case where the RHODORSIL PHOTOINITIATOR 2074 is used as the cocatalyst (the first substance), an ultraviolet ray (an UV light) is preferably used as the actinic radiation (an actinic radiation) and a mercury lamp (a high pressure mercury lamp) is preferably used as a means for irradiating the ultraviolet ray. This makes it possible to irradiate an ultraviolet ray (an actinic radiation) having a wavelength of less than 300 nm and sufficient energy onto the layer 910. As a result, it is possible to cleave the RHODORSIL PHOTOINITIATOR 2074 to produce the above cations and the WCAs.

[2]

[2-1] Next, the active radiation 930 is irradiated to the layer 910 through the mask 935 in the same manner as the first method for producing.

In the irradiated regions 9253, the promoter is reacted (bonded) or decomposed by the function of the active radiation 930 and then a cation (proton or other positive ions) and a weakly coordinating anion (WCA) is detached (generated).

The cation and the weakly coordinating anion result in a change (decomposition) of the molecular structure of the procatalyst in the irradiated regions 9253. As a result, the procatalyst transitions to the active potential state (potentially active state).

The procatalyst in the active potential state (or the potentially active state) means a procatalyst in a state that although the activation temperature of the procatalyst is lower than it should be, the procatalyst cannot initiate the reaction of the monomer in the irradiated regions 9253 without raising temperature (that is, in the room temperature).

Therefore, even in a case where the active radiation 930 is irradiated, it is possible to prevent the reaction of the monomer and keep that state by storing the layer 910, for example, at the temperature of about −40° C. Thus, it is possible to preliminarily prepare a plurality of the layer 910 on which the active radiation 930 is already irradiated and obtain the optical waveguide 1 by heat-treating the plurality of the layer 910 thus preliminarily prepared in one time, and thereby improving convenience.

In addition to the change of the molecular structure of the procatalyst, the cleavable group is cleaved from the polymer 915 in the same manner as the first method for producing. As a result, the refractive index differences between each of the irradiated regions 9253 and the non-irradiated region 9403 is generated.

[2-2] Next, the layer 910 is heat-treated (first heat-treatment). This makes it possible to activate the procatalyst in the active potential state (make the procatalyst in an active state), and thereby initiating the reaction (polymerization or cross-linking reaction) of the monomer.

As the reaction of the monomer proceeds, a monomer concentration in each of the irradiated regions 9253 gradually decreases. Thus, monomer concentration differences between each of the irradiated regions 9253 and the irradiated region 9403 are generated and then the monomer is diffusively moved from the non-irradiated region 9403 and gathers in the irradiated regions 9253 so as to eliminate the monomer concentration differences. As a result, the refractive index distribution curve being similar to the first method for producing is formed in the layer 910.

A heating temperature in the first heat-treatment is not particularly limited to a specific value, but preferably in the range of about 30 to 80° C., and more preferably in the range of about 40 to 60° C.

A heating time in the first heat-treatment is preferably set so that the polymerizations of the monomers in the irradiated regions 9253 are almost completed. In particular, the heating time in the heat-treating process (first heat-treatment) is preferably in the range of about 0.1 to 2 hours, and more preferably in the range of about 0.1 to 1 hours.

Next, the layer 910 is heat-treated (second heat-treatment). This makes it possible to react the monomer remaining in each of the non-irradiated regions 9403 and/or the irradiated region 9253 by activating the procatalyst remaining in each of the non-irradiated regions 9403 and/or the irradiated region 9253 (making the procatalyst in the active state) in a direct way or with activating the promoter.

As described above, by reacting the monomer remaining in each of the regions 9253, 9403, it is possible to stabilize the core portion 14 and the side cladding portions 15 to be obtained.

A heating temperature in the second heating-treatment is not particularly limited to a specific value, as long as it can activate the procatalyst or the promoter, but preferably in the range of about 70 to 100° C., and more preferably in the range of about 80 to 90° C.

A heating time in the second heating-treatment is not particularly limited to a specific period, but preferably in the range of about 0.5 to 2 hours, and more preferably in the range of about 0.5 to 1 hours.

Next, the layer 910 is heat-treated (third heat-treatment). This makes it possible to reduce internal stress generated in the core layer 13 to be obtained and further stabilize the core portion 14 and the side cladding portions 15.

A heating temperature in the third heating-treatment is set so as to be higher than the heating temperature in the second heating treatment by 20° C. or more. In particular, the heating temperature in the third heating-treatment is preferably in the range of about 90 to 180° C., and more preferably in the range of about 120 to 160° C.

A heating time in the third heating-treatment is preferably in the range of about 0.5 to 2 hours, and more preferably in the range of about 0.5 to 1 hours. The optical waveguide 1 is obtained through the above steps.

Regarding the second heat-treatment and the third heat-treatment, in a case where the refractive index differences between the core portion 14 and each of the side cladding portions 15 is sufficiently-large before the second heat-treatment or the third heat-treatment is carried out, the second heat-treatment or the third heat-treatment may be omitted.

<Electronic Device>

The aforementioned optical waveguide of the present invention has superior optical transmission property and long-term reliability. Thus, by using the optical waveguide of the present invention, it is possible to obtain an electronic device having high reliability (electronic device of the present invention), which can provide high quality communication between two points.

Examples of the electronic device of the present invention include an electronic device such as a cell phone, a game machine, a router, a WDM device, a personal computer, a television, a home server and the like. The above electronic devices need to communicate large volume data with a processor such as a LSI, a memory device such as a RAM, or the like at high speed. Thus, since a problem which is typically caused in an electrical wiring such as noise or signal deterioration is resolved by using the optical waveguide of the present invention in these electronic devices, it is possible to expect superior improvement in performance of the electronic device.

In the electronic device of the present invention, an amount of heat generation in the optical waveguide is significantly reduced as compared with the case of using the electronic wiring. Thus, it is possible to reduce power for cooling the electronic device, and thereby reducing a power consumption of the electronic device.

Since the optical waveguide of the present invention can reduce the transmission loss and the rounding of pulse signal (unwanted broadening of pulse signal), the cross-talk is not likely to occur even in a case where the optical waveguide has multiple and highly-densified channels. Therefore, the optical waveguide having high density, small size and high reliability is obtained and it is possible to improve reliability of the electronic device and downsize the electronic device by using the optical waveguide in the electronic device.

While the descriptions are given to the optical waveguide and the electronic device of the present invention, the present invention is not limited thereto. For example, arbitrary structures may be added to the optical waveguide.

A method for producing the optical waveguide of the present invention is not limited the above methods. A method comprising a step for changing the refractive index (photobleaching method), a method comprising a step for containing a photocrosslinkable polymer having a unsaturated bond which can photoisomerize or photodimerize in the composition forming the core layer and another step for changing the molecular structure and the refractive index by irradiating the active radiation (photoisomerizing method or photodimerizing method) may be used as the method for producing the optical waveguide of the present invention.

In these methods, since it is possible to adjust an amount of change of the refractive index by controlling the radiation amount of the active radiation, it is possible to form the core layer having the horizontal refractive index distribution curve W by controlling the radiation amount of the active radiation to be irradiated to each layers according to the shape of the horizontal refractive index distribution curve W.

EXAMPLES

Next, embodiments of the present invention are described in detail.

1. Producing Optical Waveguide

Example 1

(1) Synthesis of Norbornene-Based Resin

In a glove box in which each of concentrations of moisture and oxygen was set to 1 ppm or less and dry nitrogen was filled, 7.2 g (40.1 mmol) of hexyl norbornene (HxNB) and 12.9 g (40.1 mmol) of diphenyl methyl norbornene methoxysilane were measured in a 500 mL vial, 60 g of dehydrated toluene and 11 g of ethyl acetate were added thereto, and then an upper part of the vial was sealed by being capped with a sealer made of silicon.

Next, 1.56 g (3.2 mmol) of a Ni catalyst represented by the following chemical formula (A) and 10 mL of dehydrated toluene were measured in a 100 mL vial, a stirrer chip was put thereinto and sealed, and then the catalyst was sufficiently stirred so that it was fully dissolved in the dehydrated toluene.

1 mL of a solution containing the Ni catalyst represented by the following chemical formula (A) was correctly measured using a syringe, and then quantitatively injected into the vial storing the solution containing the above two kinds of norbornenes and stirred for 1 hour at room temperature. At a point when remarkable viscosity rise of the solution was confirmed, the vial was unsealed and then 60 g of tetrahydrofuran (THF) was added thereto and stirred. In this way, a reaction solution was obtained.

9.5 g of acetic anhydride, 18 g of hydrogen peroxide solution (30% concentration) and 30 g of ion-exchanged water were added to a 100 mL beaker and stirred, to thereby prepare a peroxyacetic acid solution in place. Next, a whole quantity of this solution was added to the above it stirred this solution for 12 hours in addition to the above reaction solution and stirred for 12 hours, to thereby preform reduction treatment of Ni.

Next, the treated reaction solution was transferred into a separatory funnel, a lower water layer was removed, and then 100 mL of 30% isopropyl alcohol aqueous solution was added thereto and vigorously stirred. The solution was fully separated into two layers by being left, and then a water layer was removed. This washing process was performed three times at a total. Thereafter, a polymer was produced by dropping an oil layer into an excess of acetone and precipitated. The polymer was separated from the acetone by filtrating it, and then heated and dried for 12 hours in a vacuum-dryer setting to a 60° C. In this way, a polymer #1 was obtained. A molecular weight distribution of the polymer #1 measured by a GPC had Mw of 1,000,000 and Mn of 40,000. Further, a mole ratio of repeating units constituting the polymer #1 identified by NMR was 50 mol % of a hexyl norbornene repeating unit and 50 mol % of a diphenyl methyl norbornene methoxy silane repeating unit.

[Formula 39]

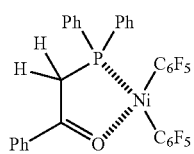

(A)

[Formula 40]

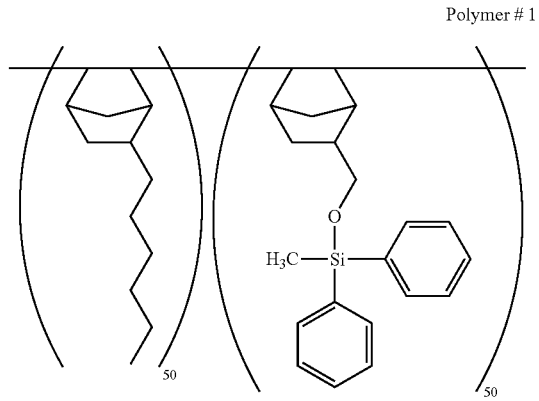

Polymer #1

(2) Production of Optical Guide Formation Composition (First Composition)

10 g of the above purified polymer #1 was measured into a 100 mL glass container, 40 g of mesitylene, 0.01 g of Irganox1076 (produced by Chiba-Geigy) as an antioxidant, 2 g of a cyclohexyl oxetane monomer (that is, the monomer represented by the formula (20)) having a molecular weight of 186 and a boiling point of 125° C./1.33 kPa ("CHOX" produced by TOAGOSEI CO., LTD., CAS #483303-25-9), (2.5E-2 g in 0.1 mL of ethyl acetate) of RhodorsilPhotoinitiator (produced by Rhodia Inc. CAS #178233-72-2) as the polymerization initiator (photo acid generation agent) were added thereto and uniformly dissolved therein, and then filtered with a 0.2 μm PTFE filter. In this way, a pure optical guide formation composition was obtained.

(3) Production of Optical Guide Formation Composition (Second Composition)

An optical guide formation composition was obtained in the same manner as the first composition, except that a polymer in which the mole ratio of the repeating units constituting the above purified polymer #1 was changed to 80 mol % of the hexyl norbornene repeating unit and 20 mol % of the diphenyl methyl norbornene methoxy silane repeating unit was used instead of the polymer #1.

(4) Producing Optical Waveguide

By using the produced optical waveguide forming compositions, layers were formed on the polyethersulphone (PES) film by the multi-layer molding method with the die coater shown in FIG. 6. As a result, a multi-layered compact having an upper layer constituted of the second composition, a lower layer constituted of the second composition and an intermediate layer constituted of the first composition was obtained. Next, the multi-layered compact was left in a dry chamber at the temperature of 55° C. for 10 minutes in order to completely remove the solvent. Then, a photo mask was pressure-bonded on the multi-layered compact and ultraviolet radiation was selectively irradiated to the multi-layered compact through the photo mask with a radiation amount of the ultraviolet radiation of 1300 mJ/cm$^2$. After the irradiation, the photo mask was removed from the multi-layered compact and then the multi-layered compact was left in a heat chamber at the temperature of 150° C. for 1.5 hours. After that, it was confirmed that a clarity guide pattern, the core portion and the side cladding portion were formed. Then, an optical guide piece having a length of 10 cm was prepared by slicing the obtained optical waveguide. Regarding the obtained optical waveguide, the optical waveguide had eight core portions arranged parallel to one another. A width of the core portion was set at 50 μm, a width of the side cladding portion was set at 80 μm, and a thickness of the optical waveguide was set at 100 μm.

(Evaluation for Refractive Index Distribution)

The horizontal refractive index distribution curve W in the width direction was obtained by measuring a cross-sectional plane of the core layer of the obtained optical waveguide along with a center line in the thickness direction with the dual-beam interference microscope. As a result, it was confirmed that the horizontal refractive index distribution curve W had a plurality of local minimum values and local maximum values, and a refractive index which continuously varied.

On the other hand, the vertical refractive index distribution curve T in the thickness direction was obtained by measuring the cross-sectional plane of the optical waveguide along with a center line in the vertical direction through the center of the core portion with the dual-beam interference microscope. As a result, it was confirmed that the vertical refractive index distribution curve T had a first section in which a refractive index continuously varied and two second sections respectively positioned on outer sides of the first section so as to be opposed to each other and having a constant refractive index lower than the refractive index of the first section. Namely, the obtained vertical refractive index distribution curve T in the thickness direction was a graded-index type refractive index distribution.

Example 2

An optical waveguide was obtained in the same manner as the example 1, except that the radiation amount of the ultraviolet radiation was increased to 1500 mJ/cm$^2$.

Example 3

An optical waveguide was obtained in the same manner as the example 1, except that the radiation amount of the ultraviolet radiation was increased to 2000 mJ/cm$^2$ and the polymer in which the mole ratio of the repeating units constituting the above purified polymer #1 was changed to 40 mol % of the hexyl norbornene repeating unit and 60 mol % of the diphenyl methyl norbornene methoxy silane repeating unit was used instead of the polymer #1.

Example 4

An optical waveguide was obtained in the same manner as the example 1, except that the radiation amount of the ultraviolet radiation was decreased to 500 mJ/cm$^2$ and the polymer in which the mole ratio of the repeating units constituting the above purified polymer #1 was changed to 45 mol % of the hexyl norbornene repeating unit and 55 mol % of the diphenyl methyl norbornene methoxy silane repeating unit was used instead of the polymer #1.

Example 5

An optical waveguide was obtained in the same manner as the example 1, except that the polymer in which the mole ratio of the repeating units constituting the above purified polymer #1 was changed to 30 mol % of the hexyl norbornene repeating unit and 70 mol % of the diphenyl methyl norbornene methoxy silane repeating unit was used instead of the polymer #1.

Example 6

An optical waveguide was obtained in the same manner as the example 1, except that the radiation amount of the ultraviolet radiation was decreased to 300 mJ/cm$^2$ and the polymer in which the mole ratio of the repeating units constituting the above purified polymer #1 was changed to 40 mol % of the hexyl norbornene repeating unit and 60 mol % of the diphenyl methyl norbornene methoxy silane repeating unit was used instead of the polymer #1.

Example 7

An optical waveguide was obtained in the same manner as the example 1, except that the radiation amount of the ultraviolet radiation was decreased to 500 mJ/cm$^2$ and the polymer in which the mole ratio of the repeating units constituting the above purified polymer #1 was changed to 30 mol % of the hexyl norbornene repeating unit and 70 mol % of the diphenyl methyl norbornene methoxy silane repeating unit was used instead of the polymer #1.

Example 8

An optical waveguide was obtained in the same manner as the example 1, except that the radiation amount of the ultraviolet radiation was decreased to 100 mJ/cm$^2$ and the polymer in which the mole ratio of the repeating units constituting the above purified polymer #1 was changed to 60 mol % of the hexyl norbornene repeating unit and 40 mol % of the diphenyl methyl norbornene methoxy silane repeating unit was used instead of the polymer #1.

Example 9

An optical waveguide was obtained in the same manner as the example 1, except that the radiation amount of the ultraviolet radiation was increased to 1500 mJ/cm$^2$ and the polymer in which the mole ratio of the repeating units constituting the above purified polymer #1 was changed to 10 mol % of the hexyl norbornene repeating unit and 90 mol % of the diphenyl methyl norbornene methoxy silane repeating unit was used instead of the polymer #1.

Example 10

An optical waveguide was obtained in the same manner as the example 1, except that the radiation amount of the ultraviolet radiation was increased to 3000 mJ/cm$^2$ and the polymer in which the mole ratio of the repeating units constituting the above purified polymer #1 was changed to 5 mol % of the hexyl norbornene repeating unit and 95 mol % of the diphenyl methyl norbornene methoxy silane repeating unit was used instead of the polymer #1.

Example 11

An optical waveguide was obtained in the same manner as the example 1, except that a composition produced by the following way was used.

10 g of the above purified polymer #1 was measured into a 100 mL glass container, 40 g of mesitylene, 0.01 g of Irganox1076 (produced by Chiba-Geigy) as an antioxidant, 2 g of a bifunctional oxetane monomer (that is, a monomer represented by the formula (15)) having a molecular weight of 214 and a boiling point of 119° C./0.67 kPa ("DOX" produced by TOAGOSEI CO., LTD., CAS #18934-00-4), (2.5E-2 g in 0.1 mL of ethyl acetate) of RhodorsilPhotoinitiator (produced by Rhodia Inc. CAS #178233-72-2) as the polymerization initiator (photo acid generation agent) were added thereto and uniformly dissolved therein, and then filtered with a 0.2 µm PTFE filter. In this way, a pure optical guide formation composition was obtained.

Example 12

An optical waveguide was obtained in the same manner as the example 1, except that a composition produced by the following way was used as the optical waveguide forming composition (first composition).

10 g of the above purified polymer #1 was measured into a 100 mL glass container, 40 g of mesitylene, 0.01 g of Irganox1076 (produced by Chiba-Geigy) as an antioxidant, 2 g of a alicyclic epoxy monomer (that is, the monomer represented by the formula (37)) having a molecular weight of 252 and a boiling point of 188° C./4 hPa ("CELLOXIDE 2021P" produced by Daicel Corporation, CAS #2386-87-0), (2.5E-2 g in 0.1 mL of ethyl acetate) of RhodorsilPhotoinitiator (produced by Rhodia Inc. CAS #178233-72-2) as the polymerization initiator (photo acid generation agent) were added thereto and uniformly dissolved therein, and then filtered with a 0.2 µm PTFE filter. In this way, a pure optical guide formation composition was obtained.

Example 13

An optical waveguide was obtained in the same manner as the example 1, except that a composition produced by the following way was used as the optical waveguide forming composition (first composition).

10 g of the above purified polymer #1 was measured into a 100 mL glass container, 40 g of mesitylene, 0.01 g of Irganox1076 (produced by Chiba-Geigy) as an antioxidant, 1 g of the cyclohexyl oxetane monomer (that is, the monomer represented by the formula (20)) ("CHOX" produced by TOAGOSEI CO., LTD.), 1 g of the alicyclic epoxy monomer ("CELLOXIDE 2021P" produced by Daicel Corporation), (2.5E-2 g in 0.1 mL of ethyl acetate) of RhodorsilPhotoinitiator (produced by Rhodia Inc. CAS #178233-72-2) as the polymerization initiator (photo acid generation agent) were added thereto and uniformly dissolved therein, and then filtered with a 0.2 µm PTFE filter. In this way, a pure optical guide formation composition was obtained.

Example 14

An optical waveguide was obtained in the same manner as the example 1, except that a composition produced by the following way was used as the polymer.

First, a polymer was synthesized in the same manner as Example 1, except that 10.4 g (40.1 mmol) of phenyl dimethyl norbornene methoxy silane was used instead of 12.9 g (40.1 mmol) of the diphenyl methyl norbornene methoxy silane. A chemical structure unit of the obtained polymer is shown in the following formula (103). A molecular weight distribution of the polymer measured by a GPC had Mw of 110,000 and Mn of 50,000. Further, a mole ratio of repeating units constituting the polymer identified by NMR was 50 mol % of a hexyl norbornene repeating unit and 50 mol % of a phenyl dimethyl norbornene methoxy silane repeating unit.

[Formula 41]

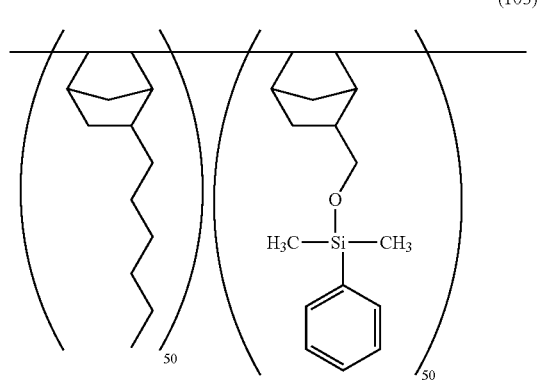

(103)

Example 15

An optical waveguide was obtained in the same manner as the example 1, except that an optical waveguide forming composition (third composition) produced by the following way was used as the optical waveguide forming composition (second composition).

(1) Synthesis of Oxetane-Based Resin 50 g of a cyclohexyl oxetane monomer (that is, the monomer represented by the formula (20)) having a molecular weight of 186 and a boiling point of 125° C./1.33 kPa ("CHOX" produced by TOAGOSEI CO., LTD., CAS #483303-25-9) was measured into a 300 ml separable flask, 50 g of mesitylene was added thereto and then the separable flask was sealed.

Next, 0.40 g (0.5 mmol) of catalyst represented by the following chemical formula (D) and 20 mL of ethyl acetate were measured and added to 100 mL of vial in a glove box in which moisture concentration and oxygen concentration were controlled to be equal to or lower than 1 ppm. After that, stirrer tips were added thereto, the vial was sealed and then the catalyst was completely dissolved by sufficiently stirring the vial.

12.5 mL of solution containing the catalyst represented by the following chemical formula (D) was correctly measured using a syringe, and then quantitatively injected into the vial storing the oxetane monomer and stirred for 1.5 hour at temperature of 60° C. At a point when remarkable viscosity rise of the solution was confirmed, the vial was unsealed and then 60 g of tetrahydrofuran (THF) was added thereto and stirred. As a result, remarkable viscosity rise of the solution was confirmed and a reaction solution was obtained.

[Formula 42]

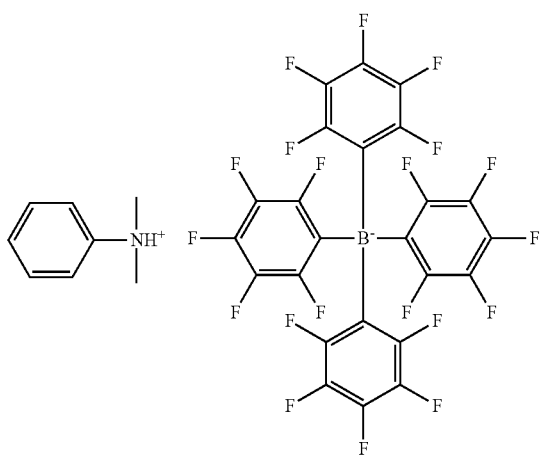

(D)

50 g of ion exchange resin ("EG-290-HG" produced by Organo CO., LTD) and the above reaction solution were stirred for thirty minutes and then filtered for removing the catalyst, As a result, a polymer solution was obtained.

(2) Producing Optical Waveguide Forming Composition (Third Composition)

Next, the optical waveguide forming composition (third composition) was obtained in the same manner as the first composition, except that 3 g of the obtained polymer solution was added.

Example 16

An optical waveguide was obtained in the same manner as the example 15, except that the radiation amount of the ultraviolet radiation was decreased to 500 mJ/cm$^2$.

Comparative Example 1

An optical waveguide was obtained in the same manner as the example 1, except that the optical waveguide forming composition (first composition) obtained by omitting the cyclohexyl oxetane monomer was used and a varnish ("Avatrel 2000P" produced by Promerus CO., LTD) was used instead of the optical waveguide forming composition (second composition).

In the obtained optical waveguide, the refractive index in each of the core portion and the side cladding portion was substantially constant. Namely, the horizontal refractive index distribution W of the obtained optical waveguide was a step-index (SI) type refractive index distribution.

Comparative Example 2

An optical waveguide was obtained in the same manner as the comparative example 1, except that a photo mask having a continuously varying transmittance was used so as to allow the exposure amount to continuously vary during the exposure.

In the obtained optical waveguide, the refractive index in each of the side cladding portions was substantially constant and the refractive index in the core portion continuously decreased from the center toward the periphery. Namely, the horizontal refractive index distribution curve W of the obtained optical waveguide was a graded-index type refractive index distribution.

Comparative Example 3

An optical waveguide was obtained in the same manner as the comparative example 1, except that a photo mask having a continuously varying transmittance was used so as to allow the exposure amount to continuously vary during the exposure.

In the obtained optical waveguide, the horizontal refractive index distribution curve W had a plurality of local minimum values and local maximum values. Further, the refractive index in the core portion continuously decreased from the center toward the periphery having the local minimum value and the refractive index in each of the side cladding portions continuously increased with distance from a point having the local minimum value. The horizontal refractive index distribution curve W had an approximately V-shaped portion at the point having the local minimum value and the refractive index discontinuously varied in the vicinity of the point.

Reference Example 1

After only the optical waveguide forming composition (the first composition) was uniformity coated on a polyethersulphone (PES) film with a doctor blade, the compact (the polyethersulphone film with the first composition) was left in the dry chamber at the temperature of 55° C. for ten minutes. After completely removing the solvent, the photo mask was pressure-bonded on the compact and the ultraviolet radiation was selectively irradiated to the compact through the photo mask with a radiation amount of the ultraviolet radiation of 1300 mJ/cm². After the irradiation, the photo mask was removed from the compact and then the compact was left in the heat chamber at the temperature of 150° C. for 1.5 hours. After that, it was confirmed that a clarity guide pattern, the core portion and the side cladding portions were formed. The photo mask used in the reference example 1 was the same photo mask used in the example 1 and the obtained optical waveguide had eight core portions arranged parallel to one another. A width of the core portion was set at 50 μm, a width of the side cladding portion was set at 80 μm, and a thickness of the optical waveguide was set at 100 μm. As a result, the optical waveguide having the core layer and no cladding layer was obtained.

The horizontal refractive index distribution curve W in the width direction was obtained by measuring the cross sectional plane of the core layer of the obtained optical waveguide along with the center line in the thickness direction with the dual-beam interference microscope. As a result, it was confirmed that the horizontal refractive index distribution curve W had a plurality of local minimum values and local maximum values, and a refractive index which continuously varied.

Reference Example 2

(Forming Lower Cladding Layer)

After the optical waveguide forming composition (the second composition) was uniformity coated on a silicon wafer with the doctor blade, the silicon wafer was left in the dry chamber at the temperature of 55° C. for ten minutes. After completely removing the solvent, the ultraviolet radiation was selectively irradiated to whole surface of the silicon wafer with a radiation amount of the ultraviolet radiation of 100 mJ. After the irradiation, the silicon wafer was left in the heat chamber at the temperature of 120° C. for 1 hour to cure the coating film (the second composition) and then the lower cladding layer was formed. The formed lower cladding layer has a thickness of 20 μm and was colorless and transparent.

(Forming Core Layer)

After the optical waveguide forming composition (first composition) was uniformity coated on the aforementioned lower cladding layer with the doctor blade, the silicon wafer was left in the dry chamber at the temperature of 55° C. for ten minutes. After completely removing the solvent, the photo mask was pressure-bonded on the first composition and the ultraviolet radiation was selectively irradiated to the first composition coated on the lower cladding layer through the photo mask with a radiation amount of the ultraviolet radiation of 1300 mJ/cm². After the irradiation, the photo mask was removed from the first composition and then the silicon wafer was left in the heat chamber at the temperature of 150° C. for 1.5 hours. After that, it was confirmed that a clarity guide pattern, the core portion and the side cladding portions were formed. The obtained optical waveguide had eight core portions arranged parallel to one another. A width of the core portion was set at 50 μm, a width of each of the side cladding portions was set at 80 μm, and a thickness of the optical waveguide was set at 50 μm.

(Forming Upper Cladding Layer)

A dry film preliminarily prepared by laminating the optical waveguide forming composition (the second composition) on a polyethersulphone (PES) film so that a dry film having a thickness of 20 μm was bonded on the aforementioned core layer and then the silicon wafer was left in a vacuum laminator at the temperature of 140° C. for thermal compression bonding. After that, the ultraviolet radiation was irradiated to whole surface of the second composition with a radiation amount of the ultraviolet radiation of 100 mJ and then the silicon wafer was left in the heat chamber at the temperature of 120° C. for one hour to cure the optical waveguide forming composition (the second composition). As a result, the upper cladding layer was formed and the optical waveguide was obtained. Further, an optical guide piece having a length of 10 cm was prepared by slicing the obtained optical waveguide.

(Evaluation for Refractive Index Distribution)

The horizontal refractive index distribution curve W in the width direction was obtained by measuring the cross-sectional plane of the core layer of the obtained optical waveguide along with the center line in the thickness direction with the dual-beam interference microscope. As a result, it was confirmed that the horizontal refractive index distribution curve W had a plurality of local minimum values and local maximum values, and a refractive index which continuously varied.

On the other hand, the vertical refractive index distribution curve T in the thickness direction was obtained by measuring the cross sectional plane of the optical waveguide along with the center line passing through the center of the core portion in the vertical direction with the dual-beam interference microscope. As a result, it was confirmed that the vertical refractive index distribution curve T had a first section corresponding to the core portion in which the refractive index was substantially constant and two second sections corresponding to the cladding layer in which the refractive index was constant and lower than the refractive index of the first region.

Namely, the obtained vertical refractive index distribution curve T in the thickness direction was a step-index type refractive index distribution.

Manufacturing conditions for producing the optical waveguides obtained in the above examples, comparative examples and reference example are shown in the following table 1.

TABLE 1

| | First composition | | | | | | Exposure | Refractive index distribution | |
|---|---|---|---|---|---|---|---|---|---|
| | Repeating units in polymer | | | | | | | | |
| | Hx (mol per) | diPh (mol per) | monoPh (mol per) | Monomer (phr) | Acid generator (phr) | Second and third compositions | amount (mJ/cm$^2$) | Width direction | Thickness direction |
| Example 1 | 50 | 50 | 0 | CHOX 20 | Rhodorsil 0.25 | Second composition | 1300 | W type | GI type |
| Example 2 | 50 | 50 | 0 | ↑ | ↑ | ↑ | 1500 | ↑ | ↑ |
| Example 3 | 40 | 60 | 0 | ↑ | ↑ | ↑ | 2000 | ↑ | ↑ |
| Example 4 | 45 | 55 | 0 | ↑ | ↑ | ↑ | 500 | ↑ | ↑ |
| Example 5 | 30 | 70 | 0 | ↑ | ↑ | ↑ | 1300 | ↑ | ↑ |
| Example 6 | 40 | 60 | 0 | ↑ | ↑ | ↑ | 300 | ↑ | ↑ |
| Example 7 | 30 | 70 | 0 | ↑ | ↑ | ↑ | 500 | ↑ | ↑ |
| Example 8 | 60 | 40 | 0 | ↑ | ↑ | ↑ | 100 | ↑ | ↑ |
| Example 9 | 10 | 90 | 0 | ↑ | ↑ | ↑ | 1500 | ↑ | ↑ |
| Example 10 | 5 | 95 | 0 | ↑ | ↑ | ↑ | 3000 | ↑ | ↑ |
| Example 11 | 50 | 50 | 0 | DOX 20 | ↑ | ↑ | 1300 | ↑ | ↑ |
| Example 12 | 50 | 50 | 0 | Celloxide 2021 20 | ↑ | ↑ | ↑ | ↑ | ↑ |
| Example 13 | 50 | 50 | 0 | CHOX 10 + 2021 10 | ↑ | ↑ | ↑ | ↑ | ↑ |
| Example 14 | 50 | 0 | 50 | CHOX 20 | ↑ | ↑ | ↑ | ↑ | ↑ |
| Example 15 | 50 | 50 | 0 | CHOX 20 | ↑ | Third composition | 1300 | ↑ | ↑ |
| Example 16 | 50 | 50 | 0 | ↑ | ↑ | ↑ | 500 | ↑ | ↑ |
| Comparative example 1 | 50 | 50 | 0 | None | Rhodorsil 0.25 | Avatrel | 1300 | SI type | GI type |
| Comparative example 2 | 50 | 50 | 0 | None | ↑ | ↑ | graded exposure | GI type | ↑ |
| Comparative example 3 | 50 | 50 | 0 | None | ↑ | ↑ | graded exposure | W type | ↑ |
| Reference example 1 | 50 | 50 | 0 | CHOX 20 | Rhodorsil 0.25 | None | 1300 | W type | — |
| Reference example 2 | 50 | 50 | 0 | ↑ | ↑ | Second composition | ↑ | ↑ | SI type |

Note:
"Hx" represents hexyl norbornene,
"DiPh" represents diphenylmethyl norbornene methoxysilane,
"monoPh" represents phenylmethyl norbornene methoxysilane.

Note:
"W type" in Refractive index distribution field represents refractive index distribution having a region in which second local maximum value, local minimum value, first local maximum value, local minimum value and second local maximum value are arranged in this order.

2. Evaluation 2.1 Refractive Index Distribution of Optical Waveguide

A horizontal refractive index distribution curve in the width direction was obtained by measuring the cross-sectional plane of the core layer of the obtained optical waveguide along with the center line in the thickness direction with the dual-beam interference microscope. Since the obtained horizontal refractive index distribution curve had repeating refractive index distribution pattern every core portions, a part of the horizontal refractive distribution curve was cut and defined as the horizontal refractive index distribution curve W. The horizontal refractive index distribution curve W had four local minimum values and five local maximum values which were alternatively arranged.

The local minimum values Ws1, Ws2, Ws3, Ws4, the local maximum values Wm1, Wm2, Wm3, Wm4, Wm5 and an average refractive index WA in the cladding layer were obtained from the obtained horizontal refractive index distribution curve W.

In the horizontal refractive index distribution curve W, a width "a" [μm] of a region in which a refractive index in the vicinities of points having the local maximum values Wm2, Wm4 formed in the core layer was equal to or higher than the average refractive index WA was measured. Further, a width "b" [μm] of a region in which a refractive index in the vicinities of points having the local minimum values Ws1, Ws2, Ws3, Ws4 formed in the core layer was equal to or lower than the average refractive index WA was measured. Parameters of the horizontal refractive index distribution curve W in the width direction of the optical waveguide are shown in the following table 2.

The vertical refractive index distribution curve T in the thickness direction was obtained by measuring the cross-sectional plane of the optical waveguide along with the center line passing through the center of the core portion in the vertical direction with the dual-beam interference microscope.

As a result, it was confirmed that the horizontal refractive index distributions curve W obtained in each of examples had the refractive index which continuously varied in all regions.

On the other hand, it was confirmed that the vertical refractive index distributions curve T obtained in each of examples was a graded-index type refractive index distribution.

As described above, the horizontal refractive index distribution curve W of the optical waveguide obtained in the comparative example 1 was a step-index type refractive index distribution and the vertical refractive index distributions curve T of the optical waveguide obtained in the comparative example 1 was a graded-index type refractive index distribution.

As described above, the horizontal refractive index distribution curve W of the optical waveguide obtained in the comparative example 2 was a step-index type refractive index distribution and the vertical refractive index distribution curve T of the optical waveguide obtained in the comparative example 2 was a graded-index type refractive index distribution.

As described above, the horizontal refractive index distribution curve W of the optical waveguide obtained in the comparative example 3 had the plurality of the local minimum values and the local maximum values, and the refractive index of the horizontal refractive index distribution W between the core potion and the cladding portion discontinuously varied. On the other hand, the vertical refractive index distributions curve T of the optical waveguide obtained in the comparative example 3 was the graded-index type refractive index distribution.

The horizontal refractive index distribution curve W of the optical waveguide obtained in the reference example 1 had the same shape as the horizontal refractive index distribution curve W of the optical waveguide obtained in each of examples. On the other hand, since the optical waveguide obtained in the reference example 1 had no cladding layer, the vertical refractive index distribution curve T was not measured.

TABLE 2

Parameters of horizontal refractive index distribution curve W in width direction

| | Wm1 | Ws1 | Wm2 | Ws2 | Wm3 | Ws3 | Wm4 | Ws4 | Wm5 | Average refractive index WA | (WA − Ws1)/ (Wm2 − Ws1) × 100 | (Wm1 − Ws1)/ (Wm2 − Ws1) × 100 | Wm2 − Ws1 | a [μm] | b |
|---|---|---|---|---|---|---|---|---|---|---|---|---|---|---|---|
| Example 1 | 1.551 | 1.549 | 1.557 | 1.549 | 1.551 | 1.549 | 1.557 | 1.549 | 1.551 | 1.5500 | 12.5 | 25.0 | 0.008 | 45 | 0.42a |
| Example 2 | 1.548 | 1.544 | 1.556 | 1.544 | 1.548 | 1.544 | 1.556 | 1.544 | 1.548 | 1.5460 | 16.7 | 33.3 | 0.012 | 43 | 0.31a |
| Example 3 | 1.548 | 1.545 | 1.561 | 1.545 | 1.548 | 1.545 | 1.561 | 1.545 | 1.548 | 1.5465 | 9.4 | 18.8 | 0.016 | 40 | 0.50a |
| Example 4 | 1.555 | 1.553 | 1.562 | 1.553 | 1.555 | 1.553 | 1.562 | 1.553 | 1.555 | 1.5540 | 11.1 | 22.2 | 0.009 | 40 | 0.64a |
| Example 5 | 1.564 | 1.560 | 1.578 | 1.560 | 1.564 | 1.560 | 1.578 | 1.560 | 1.564 | 1.5620 | 11.1 | 22.2 | 0.018 | 36 | 0.33a |
| Example 6 | 1.553 | 1.552 | 1.560 | 1.552 | 1.553 | 1.552 | 1.560 | 1.552 | 1.553 | 1.5525 | 6.2 | 12.5 | 0.008 | 44 | 0.32a |
| Example 7 | 1.568 | 1.565 | 1.575 | 1.565 | 1.568 | 1.565 | 1.575 | 1.565 | 1.568 | 1.5665 | 15.0 | 30.0 | 0.010 | 42 | 0.43a |
| Example 8 | 1.543 | 1.540 | 1.547 | 1.540 | 1.543 | 1.540 | 1.547 | 1.540 | 1.543 | 1.5415 | 21.4 | 42.9 | 0.007 | 50 | 0.20a |
| Example 9 | 1.580 | 1.577 | 1.601 | 1.577 | 1.580 | 1.577 | 1.601 | 1.577 | 1.580 | 1.5785 | 6.3 | 12.5 | 0.024 | 49 | 0.09a |
| Example 10 | 1.577 | 1.574 | 1.605 | 1.574 | 1.577 | 1.574 | 1.605 | 1.574 | 1.577 | 1.5755 | 4.8 | 9.7 | 0.031 | 51 | 0.05a |
| Example 11 | 1.547 | 1.546 | 1.555 | 1.546 | 1.547 | 1.546 | 1.555 | 1.546 | 1.547 | 1.5465 | 5.6 | 11.1 | 0.009 | 43 | 0.44a |
| Example 12 | 1.549 | 1.548 | 1.561 | 1.548 | 1.549 | 1.548 | 1.561 | 1.548 | 1.549 | 1.5485 | 3.8 | 7.7 | 0.013 | 41 | 0.34a |
| Example 13 | 1.549 | 1.547 | 1.562 | 1.547 | 1.549 | 1.547 | 1.562 | 1.547 | 1.549 | 1.5480 | 6.7 | 13.3 | 0.015 | 42 | 0.26a |
| Example 14 | 1.546 | 1.544 | 1.557 | 1.544 | 1.546 | 1.544 | 1.557 | 1.544 | 1.546 | 1.5450 | 7.7 | 15.4 | 0.013 | 44 | 0.25a |
| Example 15 | 1.543 | 1.540 | 1.554 | 1.540 | 1.543 | 1.540 | 1.554 | 1.540 | 1.543 | 1.5415 | 10.7 | 21.4 | 0.014 | 35 | 0.62a |
| Example 16 | 1.547 | 1.543 | 1.553 | 1.543 | 1.547 | 1.543 | 1.553 | 1.543 | 1.547 | 1.5450 | 20.0 | 40.0 | 0.010 | 40 | 0.55a |
| Comparative example 1 | Refractive index distribution curve W was step index type. | | | | | | | | | | | | | | |
| Comparative example 2 | Refractive index distribution curve W was graded index type. | | | | | | | | | | | | | | |
| Comparative example 3 | Refractive index distribution curve W was non-contiguous. | | | | | | | | | | | | | | |
| Reference example 1 | 1.550 | 1.546 | 1.554 | 1.546 | 1.550 | 1.546 | 1.554 | 1.546 | 1.550 | 1.5480 | 25.0 | 50.0 | 0.008 | 28 | 0.71a |
| Reference example 2 | 1.551 | 1.549 | 1.557 | 1.549 | 1.551 | 1.549 | 1.557 | 1.549 | 1.551 | 1.5500 | 12.5 | 25.0 | 0.008 | 28 | 0.71a |

The horizontal refractive index distribution curve W of the optical waveguide obtained in the reference example 2 had the same shape as the horizontal refractive index distribution curve W of the optical waveguide obtained in each of examples. On the other hand, the vertical refractive index distribution curve T of the optical waveguide obtained in the reference example 2 was the graded-index type refractive index distribution.

2.2 Transmission Loss of Optical Waveguide

Light emitted from 850 nm VCSEL (Vertical Cavity Surface Emitting Laser) was inputted to the obtained optical waveguide through an optical fiber having a diameter (p) of 50 μm and a light intensity of the light was measured by receiving the light with an optical fiber having a diameter (p) of 200 μm. A cutback method was used for this measurement. When measurement values were plotted in a graph where a longitudinal direction of the optical waveguide was defined as a vertical axis and an insertion loss was defined as a horizontal axis, the measurement values were linearly plotted. A transmission loss was obtained from a slope of this line.

2.3 Waveform Retention of Pulse Signal

Pulse signals having a pulse width of 1 ns emitted from a laser pulse light source were inputted to the obtained optical waveguides and then a pulse width of light output was measured.

Regarding the pulse width of the light output thus measured, relative values when the measurement value of the optical waveguide obtained in the comparative example 1 (the optical waveguide having the step-index type refractive index distribution) was defined as "1" were obtained. The waveform retentions of the pulse signals were evaluated based on the following evaluation criteria.

<Evaluation Criteria for Pulse Width>

A: In a case where refractive value of the pulse width is less than 0.5, the pulse width is evaluated as "A".

B: In a case where refractive value of the pulse width is equal to or more than 0.5 and less than 0.8, the pulse width is evaluated as "B".

C: In a case where refractive value of the pulse width is equal to or more than 0.8 and less than 1, the pulse width is evaluated as "C".

D: In a case where refractive value of the pulse width is equal to or more than 1, the pulse width is evaluated as "D".

Evaluation results of the above 2.2 section and 2.3 section, and the parameters of the vertical refractive index distribution curve T in the thickness direction are shown in the following table 3.

TABLE 3

| | Parameters of vertical refractive index distribution curve T in thickness direction | | | | Evaluation results | |
|---|---|---|---|---|---|---|
| | Average refractive index n2 in T2 | Maximum refractive index Tm in T1 | Shape of vertical refractive index distribution curve T | $\|Tm/n2 - 1\| \times 100$ | Transmission loss [dB/cm] | Pulse Width |
| Example 1 | 1.537 | 1.557 | GI Type | 1.3 | 0.06 | C |
| Example 2 | 1.537 | 1.556 | GI Type | 1.2 | 0.05 | B |
| Example 3 | 1.537 | 1.561 | GI Type | 1.6 | 0.03 | A |
| Example 4 | 1.537 | 1.562 | GI Type | 1.6 | 0.06 | C |
| Example 5 | 1.538 | 1.578 | GI Type | 2.6 | 0.02 | A |
| Example 6 | 1.537 | 1.560 | GI Type | 1.5 | 0.08 | C |
| Example 7 | 1.538 | 1.575 | GI Type | 2.4 | 0.05 | B |
| Example 8 | 1.536 | 1.547 | GI Type | 0.7 | 0.09 | C |
| Example 9 | 1.538 | 1.601 | GI Type | 4.1 | 0.06 | C |
| Example 10 | 1.538 | 1.605 | GI Type | 4.4 | 0.08 | C |
| Example 11 | 1.537 | 1.555 | GI Type | 1.2 | 0.04 | B |
| Example 12 | 1.537 | 1.561 | GI Type | 1.6 | 0.09 | C |
| Example 13 | 1.537 | 1.562 | GI Type | 1.6 | 0.08 | C |
| Example 14 | 1.537 | 1.557 | GI Type | 1.3 | 0.04 | B |
| Example 15 | 1.533 | 1.554 | GI Type | 1.3 | 0.03 | A |
| Example 16 | 1.533 | 1.553 | GI Type | 1.3 | 0.04 | B |
| Comparative example 1 | Vertical refractive index distribution curve T was the same as example 1. | | | | 0.20 | — |
| Comparative example 2 | Vertical refractive index distribution curve T was the same as example 1. | | | | 0.12 | C |
| Comparative example 3 | Vertical refractive index distribution curve T was the same as example 1. | | | | 0.10 | C |
| Reference example 1 | No cladding layer | | | | 0.13 | D |
| Reference example 2 | Vertical refractive index distribution curve T is step-index type. | | | | 0.08 | D |

As is clear from table 3, it is confirmed that the optical waveguide obtained in each of the examples can suppress the transmission loss and the rounding of the pulse signal as compared with the optical waveguide obtained in each of the comparative examples.

2.4 Light Intensity Distribution of Light Output of Optical Waveguide

Regarding an output side of the obtained optical waveguide, the light intensity distribution of the light output which was obtained by inputting light into one of the eight core portions was measured. The light intensity distribution was measured as following steps.

Figure 13:
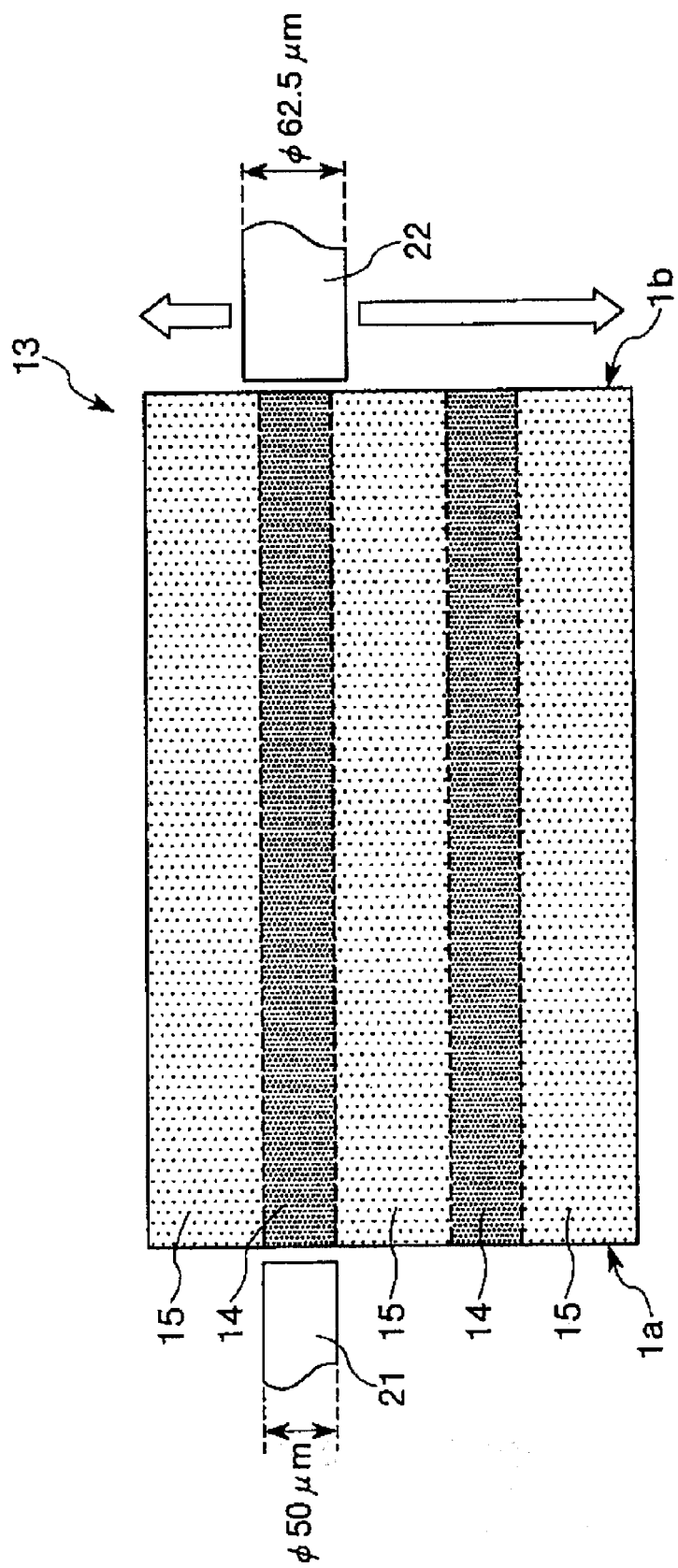
FIG. 13 is a graph showing a method for measuring the light intensity distribution of the light output which is received at an output side of the optical waveguide.

FIG. 13 is a graph showing a method for measuring the light intensity distribution of the light output which is received at the output side of the optical waveguide.

In the method shown in FIG. 13, an input side optical fiber 21 having a diameter of 50 μm was provided at an input side plane 1a of the optical waveguide 1 to be measured so as to be opposite to one of the core portions 14. The input side optical fiber 21 was connected with a light emitting element (not shown) for inputting light into the optical waveguide 1 and provided so that an optical axis of the light emitting element coincided with an optical axis of the core portion 14.

On the other hand, an output side optical fiber 22 having a diameter of 62.5 μm was provided at an output side plane 1b of the optical waveguide 1 so as to be opposite to the input side optical fiber 21. The output side optical fiber 22 was connected with a light receiving element (not shown) for receiving light output from the optical waveguide 1 and provided so that an optical axis of the light receiving element coincided with an center line in the thickness direction of the core layer of the optical waveguide 1. Further, the output side optical fiber 22 was configured to keep a constant distance from the output side plane 1b and scan the output side plane 1b including the center line of the core layer.

While the light input was inputted from the input side optical fiber 21 into one of the core portions 14, the output side optical fiber 22 scanned the output side plane 1b. And then, by measuring the light intensity of the light output associated with positions of the output side optical fiber 22, the light intensity distribution of the light output associated with the positions of the output side plane 1b was obtained.

Figure 14:
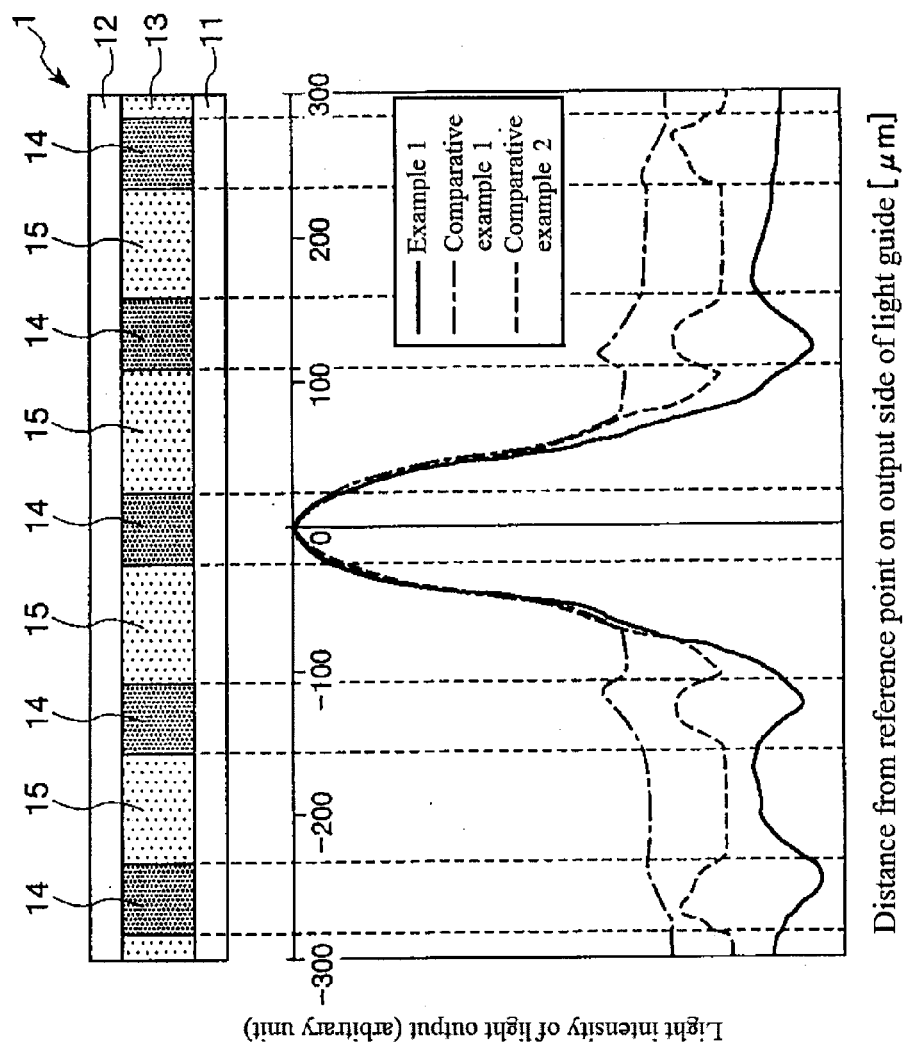
FIG. 14 is a graph showing the light intensities of the light outputs which are respectively obtained in example 1, comparative example 1 and comparative example 2.

The light intensity distributions measured by the above method are shown in FIG. 14. In FIG. 14, the light intensity distributions obtained in the example 1 and the comparative examples 1, 2 are shown.

As is clear from FIG. 14, it was confirmed that the optical waveguide obtained in the example 1 could sufficiently suppress the cross-talk. Further, in the optical waveguide obtained in the example 1, the light intensities of the light output obtained on the core potions 14 (second core potions 14), which is positioned at outer sides of the core potions 14 (first core portion 14 which is positioned at the center in FIG. 14) in which the light input was inputted, were lower than the light intensities respectively obtained on the side cladding portions 15 which did not adjoin the first core portion 14 but the second core portions 14. It would appear that leak light, which leaks from the side cladding portions 15 to the core portions 14 adjoining the side cladding portions 15 and became "the cross-talk" in the prior art, gathered in the side cladding portions 15 because the side cladding portions 15 respectively had local maximums value lower than the refractive index of the first core portion 14 and the refractive index distribution which continuously varied. This resulted in preventing the cross-talk from occurring. Therefore, it was possible to prevent the interference (the cross-talk) between the cannels by using the optical waveguide obtained in the Example 1.

In the optical waveguide obtained in the example 1, it was confirmed that a part of the light output gathered in the side cladding portions 15. However, the light receiving element connected with the optical waveguide was usually provided so as to be opposite to the output side of one of the core portions 14, and the light receiving element was not connected with the side cladding portions 15. Thus, even in a case where the light gathered in the side cladding portions 15, the light gathering in the side cladding portions 15 did not result in the cross-talk, and thereby the interference (the cross-talk) was suppressed.

Although it is not shown in FIGs, the optical waveguide obtained in the other examples could sufficiently suppress the cross-talk as well as the optical waveguide obtained in the example 1.

On the other hand, in the optical waveguides obtained in the comparative examples 1, 2, the local maximum values of the light output were positioned in the core portions 14 (the second core potions 14) positioned at outer sides of the core potion 14 (first core portion 14 which was positioned at the center in FIG. 14) in which the light input was inputted. Thus, the leak light was measured (the cross-talk was measured).

Although it is not shown in FIGs, the cross-talk was measured in the optical waveguide obtained in the comparative example 3.

The optical waveguide obtained by changing the conditions of the example 1 as follows cannot provide sufficient property.

The radiation amount of the ultraviolet radiation: 500 mJ/cm$^2$

The drying condition for the multi-layered compact prior to the irradiation of the ultraviolet radiation: 45° C.×15 minutes The amount of the polymerization initiator contained in the first composition: 1.36E-2 g 3. The Other Examples 3.1 Producing optical waveguide Example A (1) Producing Optical Waveguide Forming Composition (First Composition)

20 g of "SP-170" produced by Nippon Steel Chemical Co., Ltd., 5 g of "CELLOXIDE 2021P" produced by Daicel Corporation and 0.2 g of "ADEKA OPTOMER SP-170" produced by ADEKA CORPORATION were added to 80 g of methyl isobutyl ketone and dissolved therein by stirring them, and then filtered using a PTFE filter with 0.2 μm hole size. In this way, a pure, colorless and transparent optical waveguide formation composition (first composition) was obtained.

(2) Producing Optical Waveguide Formation Composition (Second Composition)

20 g of "CELLOXIDE 2081" produced by Daicel Corporation and 0.6 g of "ADEKA OPTOMER SP-170" produced by ADEKA CORPORATION and 80 g of methyl isobutyl ketone were stirred and mixed, and then filtered using a PTFE filter with 0.2 μm hole size. In this way, a pure, colorless and transparent optical waveguide formation composition (second composition) was obtained.

(3) Producing Optical Waveguide

By using the optical waveguide forming compositions, layers were formed on the polyethersulphone (PES) film having a thickness of 25 μm by the multi-layer molding method with the die coater shown in FIG. 6. As a result, a multi-layered compact having an upper layer constituted of the second composition, a lower layer constituted of the second composition and an intermediate layer constituted of the first composition was obtained. Next, the multi-layered was left in the dry chamber at the temperature of 55° C. for 10 minutes in order to completely remove the solvent. Then, a photo mask on which line patterns having lines of 50 μm and spaces of 50 μm were formed was pressure-bonded on the multi-layered compact and ultraviolet radiation ware selectively irradiated to the multi-layered compact through the photo mask with a radiation amount of the ultraviolet radiation of 500 mJ/cm² by using a parallel light stepper. After the irradiation, the photo mask was removed from the multi-layered compact and then the multi-layered compact was left in an oven at the temperature of 150° C. for thirty minutes. After that, it was confirmed that a clarity guide pattern was formed. A thickness of the obtained optical waveguide was 70 μm.

Example B (1) Synthesis of Polymer 20.0 g of methyl methacrylate, 30.0 g of benzyl methacrylate and 450 g of methyl isobutyl ketone were put into a separable flask. After stirring and mixing them, an inside of the separable flask was substituted with nitrogen gas to thereby obtain a monomer solution. 0.25 g of azobisisobutyronitrile as the polymerization initiator was dissolved into 10 g of methyl isobutyl ketone in a container. An inside of the container was substituted with nitrogen gas to thereby obtain an initiator solution. Thereafter, the monomer solution was heated up to 80° C. while being stirred and the initiator solution was added to the monomer solution using a syringe. The mixture was heated at 80° C. and stirred for 1 hour, and then cooled, to thereby obtain a polymer solution.

Next, 5 L of isopropanol was prepared in a beaker, and then the above mentioned polymer solution was dropped to the isopropanol while stirring it using a stirrer at normal temperature. Thereafter, a precipitated polymer was recovered, and then dried at 60° C. for 8 hours under reduced pressure. In this way, a polymer A1 was obtained.

(2) Producing Optical Waveguide Formation Composition (Second Composition)

20 g of an aqueous acrylate resin solution "RD-180" produced by D GOO CHEMICAL CO., LTD., 20 g of isopropanol and 0.4 g of "CARBODILITE V-02-L2" produced by Nisshinbo Chemical Inc. were stirred and mixed, and then filtered using a PTFE filter with 0.2 μm hole size. In this way, a pure, colorless and transparent optical waveguide formation composition (second composition) was obtained.

(3) Producing Optical Waveguide Formation Composition (First Composition)

20 g of the polymer A1 obtained by the above method (1), 5 g of cyclohexyl methacrylate and 0.2 g of IRGACURE 651 produced by BASF Japan Ltd. were added to 80 g of methyl isobutyl ketone and dissolved therein by stirring them, and then filtered using a PTFE filter with 0.2 μm hole size. In this way, a pure, colorless and transparent optical waveguide formation composition (first composition) was obtained.

(4) Producing Optical Waveguide

By using the optical waveguide forming compositions, layers were formed on the polyethersulphone (PES) film having a thickness of 25 μm by the multi-layer molding method with the die coater shown in FIG. 6. As a result, a multi-layered compact having an upper layer constituted of the second composition, a lower layer constituted of the second composition and an intermediate layer constituted of the first composition was obtained. Next, the multi-layered was left in the dry chamber at the temperature of 55° C. for 10 minutes in order to completely remove the solvent. Then, a photo mask on which line patterns having lines of 50 μm and spaces of 50 μm were formed was pressure-bonded on the multi-layered compact and ultraviolet radiation ware selectively irradiated to the multi-layered compact through the photo mask with a radiation amount of the ultraviolet radiation of 500 mJ/cm² by using a parallel light stepper. After the irradiation, the photo mask was removed from the multi-layered compact and then the multi-layered compact was left in the oven at the temperature of 150° C. for thirty minutes. After that, it was confirmed that a clarity guide pattern was formed. A thickness of the obtained optical waveguide was 70 μm.

Example C

First, a polymer A2 was synthesized in the same manner as the process (1) of Example B, except that 2-(perfluorohexyl)ethyl methacrylate was used instead of the benzyl methacrylate.

Hereafter, an optical guide was obtained in the same manner as Example B, except that the polymer A2 was used instead of the polymer A1.

3.2 Evaluation (Transmission Loss of Optical Waveguide)

Light emitted from the 850 nm VCSEL (Vertical Cavity Surface Emitting Laser) was inputted to the optical waveguide obtained in each of the example A to C through an optical fiber having a diameter ($\phi$) of 50 µm and a light intensity of the light was measured by receiving the light with an optical fiber having a diameter ($\phi$) of 200 µm. The cutback method was used for this measurement. When measurement values were plotted in a graph where a longitudinal direction of the optical waveguide was defined as a vertical axis and an insertion loss was defined as a horizontal axis, the measurement values were linearly plotted. A transmission loss was obtained from a slope of this line. The transmission losses of the optical waveguide obtained in each of the example A to C were 0.05 dB/cm. Further, in a case where the parameters of the refractive index distribution used in the examples A to C were changed in the same manner as the examples of the section "1.", evaluation results showing the same tendency as the cases of the section "2." were obtained.

(Waveform Retention of Pulse Signal)

The wave form retentions of the pulse signal of the optical waveguides obtained in the example A to C were evaluated in the same manner as the section 2.3. In all of the optical waveguides, the rounding of the pulse signal was small. Further, in a case where the parameters of the refractive index distribution curve used in the examples A to C were changed in the same manner as the examples of the section "1.", evaluation results showing the same tendency as the cases of the section "2." were obtained.

INDUSTRIAL APPLICABILITY

Since the present invention can suppress a transmission loss and a rounding of a pulse signal, it is possible to obtain an optical waveguide having high reliability, which can provide high quality communication. Further, it is possible to obtain an electronic device having high reliability. For the reasons stated above, the present invention is industrially applicable.

EXPLANATION OF REFERENCES

1$a$: input side
1$b$: output side
11, 12: cladding layer
13: core layer
14: core portion
141, 142: core portion
15: side cladding portion
151, 152, 153: side cladding portion
16: core portion defect area
17: mirror
170: concave portion
2: support film
3: cover film
800: die coater (multi-layer molding apparatus)
810: die head
811: upper lip
812: lower lip
820: manifold
821: slit
830: mixing unit
831: first feed pipe
832: second feed pipe
835: connecting portion
836: pin
840: conveying unit
841: roller
842: conveying film
901, 902: optical waveguide forming composition
910: layer
914: multi-layered compact
914$a$: first molding layer
914$b$: second molding layer
914$c$: third molding layer
914$d$: fourth molding layer
914$e$: fifth molding layer
915: polymer
920: additional agent
930: active radiation
935: mask (masking)
9351: aperture (window)
925: irradiated region
9251, 9252, 9253: irradiated region
940: non-irradiated region
9403: non-irradiated region
951: support substrate
21: input side optical fiber
22: output side optical fiber
C1, C2: center line
W: horizontal refractive index distribution curve
WA: average refractive index in cladding portion
T, T': vertical refractive index distribution curve
T1: first section
T2: second section
H: high refractive index portion
L: low refractive index portion

What is claimed is:

1. An optical waveguide, comprising:
a core layer comprising a resin material forming a core portion, a first side cladding portion and a second side cladding portion such that the first side cladding portion and the second side cladding portion are formed on lateral sides of the core portion and that the core portion and the first and second side cladding portions are aligned in a width direction of the core layer;
a first cladding layer provided over one vertical side of the core layer; and
a second cladding layer provided over the other vertical side of the core layer,
wherein the core layer has a cross-sectional plane having a horizontal refractive index distribution curve W in the width direction, the horizontal refractive index distribution curve W continuously changes and has a region such that first and second local minimum values, a local maximum value, and first and second local secondary maximum values smaller than the local maximum value, are aligned in an order of the first local secondary maximum value, the first local minimum value, the local maximum value, the second local minimum value, and the second local secondary maximum value in the region, the region has a section defined between the first and second local minimum values corresponding to the core portion, a section including the first local secondary maximum value and corresponding to the first side cladding portion, and a section including the second local secondary maximum value and corresponding to the second side cladding portion, the first and second local minimum values are smaller than an average refractive index of each of the first and second side cladding portions, the cross-sectional plane of the optical waveguide has a vertical refractive index distribution curve T in a thickness direction of the core portion, the vertical refractive index distribution curve T has a core section including a third local maximum value, a first outer section on one outer side of the core section, and a second outer section on the other outer side of the core section such that a refractive index in the core section continuously decreases from the third local maximum value toward each of the first and second outer sections and a refractive index in each of the first and second outer sections is substantially constant, the core section corresponds to the core portion, the first outer section corresponds to the first cladding layer, and the second outer section corresponds to the second cladding layer.

2. The optical waveguide of claim 1, wherein the first and second local secondary maximum values in the horizontal refractive index distribution curve W are located at areas other than vicinities of boundaries between the core portion and each of the first and the second side cladding portions.

3. The optical waveguide of claim 2, wherein each of the first and second local secondary maximum values in the horizontal refractive index distribution curve W is located at a central portion of each of the sections corresponding to the first and the second side cladding portions, a refractive index in the section corresponding to the first side cladding portion continuously decreases from the first local secondary maximum value toward the first local minimum value, and a refractive index in the section corresponding to the second side cladding portion continuously varies from the second local secondary maximum value toward the second local minimum value.

4. The optical waveguide of claim 1, wherein differences between each of the first and second local minimum values and the average refractive index of each of the first and second side cladding portions are in a range of 3 to 80% with respect to differences between each of the first and second local minimum values and the local maximum value.

5. The optical waveguide of claim 4, wherein the differences between each of the first and second local minimum values and the local maximum value are in a range of 0.005 to 0.07.

6. The optical waveguide of claim 1, wherein the horizontal refractive index distribution curve W has a convex portion in the vicinity of the local maximum value and concave portions in the vicinity of each of the first and second local minimum values.

7. The optical waveguide of claim 1, wherein the horizontal refractive index distribution curve W has a flat portion in the vicinity of the local maximum value, a refractive index in the flat portion is substantially constant, and a length of the flat portion is equal to or shorter than 100 μm.

8. The optical waveguide of claim 1, wherein, when a width of an area in the vicinity of the local maximum value having a refractive index of equal to or higher than the average refractive index of each of the first and second side cladding portions is defined as a in μm, and a width of an area in the vicinity of the first and second local minimum values having a refractive index of lower than the average refractive index of each of the first and second side cladding portions is defined as b in μm, a and b satisfy a relationship of $0.01a \leq b \leq 1.2a$.

9. The optical waveguide of claim 1, wherein the third local maximum value of the vertical refractive index distribution curve T is positioned at a central portion of the core section.

10. The optical waveguide of claim 1, wherein a difference between the third local maximum value and the refractive index of each of the first and second outer sections in the vertical refractive index distribution curve T is larger than a difference between the local maximum value and each of the local minimum values in the horizontal refractive index distribution curve W.

11. The optical waveguide of claim 1, wherein the core layer includes a plurality of the core portions and a plurality of the side cladding portions, and each of the core portions and each of the side cladding portions are alternately arranged.

12. An electronic device comprising the optical waveguide of claim 1.

13. The optical waveguide of claim 1, wherein the vertical refractive index distribution curve T consists of the first outer section, the core section, and the second outer section.

14. The optical waveguide of claim 1, wherein the cross-sectional plane of the core portion has a polygonal shape.

15. The optical waveguide of claim 1, wherein the core layer has a thickness of from 20 to 70 μm.

16. The optical waveguide of claim 1, wherein each of the core portions has a width of from 20 to 70 μm.

17. The optical waveguide of claim 15, wherein each of the core portions has a width of from 20 to 70 μm.

18. The optical waveguide of claim 1, wherein the resin material is at least one selected from the group consisting of an acryl-based resin, a methacryl-based resin, polycarbonate, polystyrene, a cyclic ether-based resin, polyamide, polyimide, polybenzoxazole, polysilane, polysilazane, a silicone-based resin, a fluoro-based resin, polysilane, polyurethane, and a cyclic olefin-based resin.

19. The optical waveguide of claim 1, wherein the resin material is a norbornene-based resin.

20. The optical waveguide of claim 19, wherein the first and second cladding layers comprise a norbornene-based resin.

\* \* \* \* \*